(12) United States Patent
Smith

(10) Patent No.: US 11,191,186 B2
(45) Date of Patent: Nov. 30, 2021

(54) SYSTEM AND METHOD FOR FLUID COOLING OF ELECTRONIC DEVICES INSTALLED IN AN ENCLOSURE

(71) Applicant: David Lane Smith, Bryan, TX (US)

(72) Inventor: David Lane Smith, Bryan, TX (US)

( * ) Notice: Subject to any disclaimer, the term of this patent is extended or adjusted under 35 U.S.C. 154(b) by 0 days.

(21) Appl. No.: 16/551,346

(22) Filed: Aug. 26, 2019

(65) Prior Publication Data

US 2020/0236808 A1  Jul. 23, 2020

Related U.S. Application Data

(63) Continuation-in-part of application No. 16/056,242, filed on Aug. 6, 2018, now Pat. No. 10,398,063, which is a continuation-in-part of application No. 15/640,520, filed on Jul. 1, 2017, now Pat. No. 10,045,467, which is a continuation-in-part of application No. 15/400,946, filed on Jan. 6, 2017, now Pat. No. 9,699,939, and a continuation-in-part of application No. 15/225,787, filed on Aug. 1, 2016, now Pat. No. 9,560,789, and a continuation-in-part of application No. 14/986,786, filed on Jan. 4, 2016, now Pat. No. 9,408,332, which is a continuation-in-part of application No. 14/749,615, filed on Jun. 24, 2015, now Pat. No. 9,258,926.

(60) Provisional application No. 62/272,751, filed on Dec. 30, 2015, provisional application No. 62/060,290, filed on Oct. 6, 2014, provisional application No. 62/016,638, filed on Jun. 24, 2014.

(51) Int. Cl.
H05K 7/20 (2006.01)

(52) U.S. Cl.
CPC ......... *H05K 7/203* (2013.01); *H05K 7/20327* (2013.01); *H05K 7/20818* (2013.01); *H05K 7/20309* (2013.01); *H05K 7/20318* (2013.01)

(58) Field of Classification Search
CPC .............. H05K 7/20236; H05K 7/203; H05K 7/20327; H05K 7/20818
See application file for complete search history.

(56) References Cited

U.S. PATENT DOCUMENTS

| | | |
|---|---|---|
| 1,960,415 A | 5/1934 | Miller |
| 2,214,865 A | 9/1940 | Troy |
| 2,654,583 A | 10/1953 | Treanor |
| 2,961,476 A | 11/1960 | Maslin et al. |
| 3,200,881 A | 8/1965 | Edwards et al. |
| 3,270,250 A | 8/1966 | Davis |
| 3,406,244 A | 10/1968 | Oktay |
| 3,443,157 A | 5/1969 | Uptegraff |
| 3,524,497 A | 8/1970 | Chu et al. |
| 3,566,958 A | 3/1971 | Zelina |
| 3,623,546 A | 11/1971 | Banthin et al. |
| 3,626,080 A | 12/1971 | Pierce |

(Continued)

FOREIGN PATENT DOCUMENTS

| | | |
|---|---|---|
| EP | 2782434 A1 | 9/2014 |
| EP | 2988311 A1 | 2/2016 |
| FR | 2413624 A1 | 7/1979 |

*Primary Examiner* — Robert J Hoffberg

(57) ABSTRACT

A system and method for cooling electronic devices disposed within the inner volume of an enclosure. The inner volume of the enclosure contains one or more single phase or multi-phase thermally conductive fluids and may contain solid or sealed hollow structures that displace and direct thermally conductive fluids.

24 Claims, 24 Drawing Sheets

(56) References Cited

U.S. PATENT DOCUMENTS

| | | |
|---|---|---|
| 3,648,113 A | 3/1972 | Rathjen et al. |
| 3,737,728 A | 6/1973 | Austin |
| 3,865,183 A | 2/1975 | Roush |
| 4,029,999 A | 6/1977 | Neumann et al. |
| 4,188,996 A | 2/1980 | Pellant et al. |
| 4,203,129 A | 5/1980 | Otkay et al. |
| 4,325,089 A | 4/1982 | Hsu |
| 4,590,538 A | 5/1986 | Cray |
| 4,768,286 A * | 9/1988 | Ketcham ............... H05K 3/284 29/841 |
| 4,847,731 A | 7/1989 | Smolley |
| 4,866,570 A | 9/1989 | Porter |
| 4,938,280 A | 7/1990 | Clark |
| 5,054,193 A * | 10/1991 | Ohms ................ H05K 3/3415 29/840 |
| 5,099,908 A | 3/1992 | Taraci et al. |
| 5,180,001 A | 1/1993 | Okada et al. |
| 5,208,733 A | 5/1993 | Besanger |
| 5,297,621 A | 3/1994 | Taraci et al. |
| 5,305,184 A | 4/1994 | Andresen et al. |
| 5,373,417 A | 12/1994 | Barrett |
| 5,373,418 A * | 12/1994 | Hayasi ............... H01L 23/3675 361/707 |
| 5,522,452 A | 6/1996 | Mizuno et al. |
| 5,773,755 A | 6/1998 | Iwatare |
| 5,812,372 A * | 9/1998 | Galyon ............... H01L 23/473 165/80.4 |
| 5,832,988 A | 11/1998 | Mistry et al. |
| 5,842,514 A | 12/1998 | Zapach et al. |
| 5,997,940 A | 12/1999 | Delvinquier et al. |
| 6,019,167 A | 2/2000 | Bishop et al. |
| 6,035,524 A * | 3/2000 | Suppa ................ G05B 19/4207 29/832 |
| 6,081,425 A | 6/2000 | Cheng |
| 6,119,768 A | 9/2000 | Dreier et al. |
| 6,125,036 A | 9/2000 | Kang et al. |
| 6,434,935 B1 | 8/2002 | Rammhofer et al. |
| 6,468,619 B1 | 10/2002 | Larroche |
| 6,679,315 B2 | 1/2004 | Cosley et al. |
| 6,687,126 B2 | 2/2004 | Patel et al. |
| 6,982,877 B2 | 1/2006 | Vinson et al. |
| 7,099,110 B2 | 8/2006 | Detzler |
| 7,258,161 B2 | 8/2007 | Cosley et al. |
| 7,365,044 B2 | 4/2008 | Farag |
| 7,403,392 B2 | 7/2008 | Attlesey et al. |
| 7,414,845 B2 | 8/2008 | Attlesey et al. |
| 7,494,076 B1 | 2/2009 | Larson et al. |
| 7,564,685 B2 | 7/2009 | Clidaras et al. |
| 7,606,027 B2 | 10/2009 | Takasou |
| 7,724,517 B2 | 5/2010 | Attlesey et al. |
| 7,724,524 B1 | 5/2010 | Campbell et al. |
| 7,852,590 B1 | 12/2010 | Olliges |
| 7,911,782 B2 | 3/2011 | Attlesey et al. |
| 7,911,793 B2 | 3/2011 | Attlesey |
| 7,961,475 B2 | 6/2011 | Campbell et al. |
| 8,009,419 B2 | 8/2011 | Attlesey et al. |
| 8,014,150 B2 | 9/2011 | Campbell et al. |
| 8,018,720 B2 | 9/2011 | Campbell et al. |
| 8,072,752 B2 | 12/2011 | Wantschik |
| 8,089,764 B2 | 1/2012 | Attlesey |
| 8,089,765 B2 | 1/2012 | Attlesey |
| 8,089,766 B2 | 1/2012 | Attlesey |
| 8,174,826 B2 | 5/2012 | El-Essawy et al. |
| 8,184,436 B2 | 5/2012 | Campbell et al. |
| 8,203,842 B2 | 6/2012 | Campbell et al. |
| 8,213,115 B1 | 7/2012 | Gershman et al. |
| 8,226,874 B2 | 7/2012 | Huffstutler |
| 8,305,759 B2 | 11/2012 | Attlesey |
| 8,351,206 B2 | 1/2013 | Campbell et al. |
| 8,369,090 B2 | 2/2013 | Chester et al. |
| 8,369,091 B2 | 2/2013 | Campbell et al. |
| 8,416,572 B2 | 4/2013 | Olsen et al. |
| 8,467,189 B2 | 6/2013 | Attlesey |
| 8,554,390 B2 | 10/2013 | Canney et al. |
| 8,654,529 B2 | 2/2014 | Attlesey |
| 9,049,800 B2 | 6/2015 | Shelnutt et al. |
| 9,144,179 B2 | 9/2015 | Shelnutt et al. |
| 9,195,282 B2 | 11/2015 | Shelnutt et al. |
| 9,258,926 B2 | 2/2016 | Smith |
| 9,317,079 B2 * | 4/2016 | Burton ................ H01L 23/367 |
| 9,408,332 B2 | 8/2016 | Smith |
| 9,440,313 B2 | 9/2016 | Clark |
| 9,560,789 B2 | 1/2017 | Smith |
| 9,593,876 B2 | 3/2017 | Smith |
| 9,699,939 B2 | 7/2017 | Smith |
| 9,725,172 B2 | 8/2017 | Warsop et al. |
| 9,781,862 B2 | 10/2017 | Kolstad et al. |
| 9,842,812 B2 | 12/2017 | Tin et al. |
| 10,020,242 B2 * | 7/2018 | Katsumata ......... H05K 7/20936 |
| 10,045,467 B2 | 8/2018 | Smith |
| 10,240,845 B2 | 3/2019 | Smith |
| 10,398,063 B2 | 8/2019 | Smith |
| 10,879,150 B2 * | 12/2020 | Lendenmann .......... H01L 21/54 |
| 2002/0002685 A1 | 1/2002 | Shim |
| 2003/0131255 A1 | 7/2003 | Shim |
| 2004/0103302 A1 | 5/2004 | Yoshimura et al. |
| 2007/0034360 A1 | 2/2007 | Hall |
| 2008/0219122 A1 | 9/2008 | Detzler et al. |
| 2008/0302115 A1 | 12/2008 | Eknes et al. |
| 2011/0132579 A1 | 6/2011 | Best et al. |
| 2013/0146273 A1 | 6/2013 | Chester et al. |
| 2014/0124174 A1 | 5/2014 | Campbell et al. |
| 2014/0216711 A1 | 8/2014 | Shelnutt et al. |
| 2014/0218859 A1 | 8/2014 | Shelnutt et al. |
| 2014/0321053 A1 | 10/2014 | Donnelly et al. |
| 2015/0000319 A1 | 1/2015 | Smith |
| 2015/0013940 A1 | 1/2015 | Best et al. |
| 2015/0022975 A1 | 1/2015 | Browne et al. |
| 2015/0043165 A1 | 2/2015 | Best et al. |
| 2015/0188297 A1 | 7/2015 | Boe et al. |
| 2016/0014932 A1 | 1/2016 | Best et al. |
| 2016/0110567 A1 | 4/2016 | Rooyakkers et al. |
| 2017/0243805 A1 | 8/2017 | Lendenmann et al. |
| 2017/0332514 A1 | 11/2017 | Saito |
| 2019/0219311 A1 | 7/2019 | Smith |

* cited by examiner

SYSTEM AND METHOD FOR FLUID COOLING OF ELECTRONIC DEVICES INSTALLED IN AN ENCLOSURE

RELATED APPLICATION

This application is a continuation-in-part of U.S. patent application Ser. No. 16/056,242, filed on Aug. 6, 2018 and entitled "SYSTEM AND METHOD FOR FLUID COOLING OF ELECTRONIC DEVICES INSTALLED INA SEALED ENCLOSURE", now issued as U.S. Pat. No. 10,398,063, issued on Aug. 27, 2019, which is a continuation-in-part of U.S. patent application Ser. No. 15/640,520, filed on Jul. 1, 2017 and entitled "SYSTEM AND METHOD FOR FLUID COOLING OF ELECTRONIC DEVICES INSTALLED IN A SEALED ENCLOSURE", now issued as U.S. Pat. No. 10,045,467, issued on Aug. 7, 2018, which is a continuation-in-part of U.S. patent application Ser. No. 15/400,946, filed on Jan. 6, 2017 and entitled "SYSTEM AND METHOD FOR FLUID COOLING OF ELECTRONIC DEVICES INSTALLED IN A SEALED ENCLOSURE", now issued as U.S. Pat. No. 9,699,939, issued on Jul. 4, 2017, which is a continuation-in-part of U.S. patent application Ser. No. 15/225,787, filed on Aug. 1, 2016 and entitled "SYSTEM AND METHOD FOR FLUID COOLING OF ELECTRONIC DEVICES INSTALLED IN A SEALED ENCLOSURE", now issued as U.S. Pat. No. 9,560,789, issued on Jan. 31, 2017, which is a continuation-in-part of U.S. patent application Ser. No. 14/986,786, filed on Jan. 4, 2016 and entitled "SYSTEM AND METHOD FOR FLUID COOLING OF ELECTRONIC DEVICES INSTALLED INA SEALED ENCLOSURE", now issued as U.S. Pat. No. 9,408,332, issued on Aug. 2, 2016, which claims priority of U.S. Provisional No. 62/272,751, filed on Dec. 30, 2015 and entitled "SYSTEM AND METHOD FOR FLUID COOLING OF ELECTRONIC DEVICES INSTALLED IN A SEALED ENCLOSURE", and is a continuation-in-part of U.S. patent application Ser. No. 14/749,615, filed on Jun. 24, 2015 and entitled "APPARATUS AND METHOD FOR FLUID COOLING OF ELECTRONIC DEVICES INSTALLED IN AN ENCLOSURE", now issued as U.S. Pat. No. 9,258,926, issued on Feb. 9, 2016, which claims priority of U.S. Provisional 62/016,638, filed on Jun. 24, 2014 and entitled "FLUID COOLING OF ELECTRONIC DEVICES INSTALLED INA SEALED ENCLOSURE", and U.S. Provisional 62/060,290, filed on Oct. 6, 2014 and entitled "SYSTEM AND METHOD FOR FLUID COOLING OF ELECTRONIC DEVICES INSTALLED IN A SEALED ENCLOSURE", all of which are hereby incorporated by reference in their entirety.

TECHNICAL FIELD

This disclosure relates to a system and method for cooling electronic devices, including but not limited to computer systems, by installing the electronic devices in a fluid-tight enclosure, said enclosure constructed with various configurations of heat exchange and pressure control mechanisms.

BACKGROUND

[03] Electronic devices generate significant amounts of thermal energy during operation. The functional lifetime of electronic devices is significantly diminished by excess heat buildup. Therefore, a number of methods have been presented to remove thermal energy from electronic devices and reject it into an external environment. Since the beginnings of electronic devices, air movement over these devices has been the primary means of heat removal. For example, in the early large-scale computing systems of the 1940s and 1950s, heat dissipation consisted primarily of ventilation apertures in housings, followed by ambient-air fans and blowers which cooled by forced air convection. Even today, refined versions of these early air-based heat dissipation systems are the most common means of electronic device and computer systems cooling. In air-based heat dissipation systems, air within a device enclosure is heated by the electronic device and internal fans expel heated air into the immediate environment around the device. The environment around the device is typically maintained with regards to temperature, humidity, and particulate matter, by using compression-based heat exchange with the outside environment. This process is effective and in common use for non-stop electronic devices such as computer servers. Although this process is effective, it is complex process with a number of systems that must be constantly maintained to produce the desired environment thus having high construction and operational costs. For example, air-based cooling relies on a) the proper operation of fans to circulate air inside the device enclosure, in the server room, and in outside condensers, b) a very clean environment free of most dust and particulates, c) proper humidity control, and d) costly "white space" in the server room to allow human access to electronic devices for repair and maintenance. Air based cooling faces significant risks from a) internal fan and cooling failures, b) server room cooling failures and inconsistencies, c) fire control systems, d) unauthorized human access, e) maintenance failures and mistakes, and f) natural disasters. Taken together, these factors typically require specialized and costly installation space for electronic devices such as computer servers. Further, air-based cooling of electronic systems can double the total amount of electrical energy required to operate these systems, resulting in a costly and wasteful means of operating such systems.

Noting the inefficiencies and problems with air-based heat dissipation, designs begin to arise in the 1960s and 1970s that took advantage of the much higher thermal conductivity of liquids, which typically conduct heat ten to one hundred times more rapidly than gases. Liquid vapor cooling of individual semiconductors and other solid state components was disclosed by Davis in U.S. Pat. No. 3,270,250, and in U.S. Pat. No. 3,524,497, Chu et. al. disclose a double-walled container for component-level electronics, with liquid flow in the space between the walls. The predominance of such designs focused on component level cooling of larger systems.

As individual CPU processing speed and power increased during the 1980s, inventors continued to disclose methods for additional cooling capability in electronic assemblies. Many of these disclosures related to component level cooling, but a few began to focus on system level liquid cooling. Cray, in U.S. Pat. No. 4,590,538 (1986), discloses a means of immersing an entire electronic assembly in coolant liquid, and circulating the liquid out of the assembly container for the purpose of thermal energy removal. Numerous other methods of liquid cooling of components and component assemblies continued to be disclosed throughout the 1990s. In the late 2000s, the liquid cooling designs from the 1980s and 1990s were applied to individual servers and computing systems. These innovations were followed by modifications and improvements which incorporated liquid cooling elements into the structural design of computing systems rather than individual modules or computing units. For example, in U.S. Pat. No. 8,351,206, Campbell et. al. disclose a liquid-cooled electronics rack with immersion-cooled electronics and a vertically mounted vapor condensation unit attached to or adjacent to the electronics rack.

Olsen, et. al. describe in U.S. Pat. No. 8,416,572 a design for multiple electronic devices connected in an array, thermally coupled to a flowing liquid. In U.S. Pat. No. 8,467,189 and related following patents Attlesey discloses designs for an array of rack-mounted plurality of cases for electronics systems; each case contains a dielectric fluid for heat conduction, and the rack system incorporates a manifold for liquid circulation through the plurality of cases, with a pump and heat exchanger incorporated into the fluid circulation loop. Best et. al. disclose, in U. S. Patent Application 2011/0132579 a design in which a series of horizontally oriented computer server racks are submerged in a liquid tank containing a dielectric cooling fluid that is circulated from the tank to a remote heat exchanger and back into the tank.

One of the significant improvements of liquid cooling over air cooling is the ability to transport heat from the electronic device or system directly to the heat rejection environment without significantly affecting the human inhabited space in the server room thus dramatically increasing the heat transport efficiency while reducing the number of cooling processes and preventing excess heat diffusion. However, these processes have not seen widespread adoption for one or more possible reasons. Component level liquid cooling designs tend to introduce significant complexity to operations and maintenance while increasing server room risks to coolant leaks and failures. System level liquid cooling designs reduce the overall number of cooling interconnects, but have similar problems. To further complicate the liquid cooling server room installations, liquid cooled systems require new server room procedures, operations, and training and expose owner and operators to additional liabilities from liquid damage. And notably, production electronic devices and servers are rarely available in liquid cooling configurations. Succinctly, the cost savings associated with current liquid cooling designs are overshadowed by the increased costs of purchasing, constructing, and operating liquid cooled servers and solutions.

Significantly, it is the widespread usage of virtualized computing resources that is allowing greater innovation and deployment of fluid cooled electronic devices and servers. Virtualization of data resources allows data to be stored on many redundant devices. Virtualization of compute resources allows the functional compute unit of a "server" to become a software unit that can be moved from one physical computer to another. Individual electronic devices and servers may fail over time, but the virtualized nature of software based compute and storage units mean that an individual failures only slightly decreases the overall capability of a collection of servers but in no way compromises the data processing, storage, and communication functions as a whole. Therefore, since it is no longer necessary to maintain or repair a specific physical server in order to maintain a given operation, fluid cooling of electronic devices in a sealed enclosure is enabling cost reductions, operational efficiencies, increased security, and extended longevity of electronic devices and servers.

The innovations as disclosed herein overcome problems inherent to both traditional air-cooled and liquid-cooled electronic devices and systems. Significant benefits comprise a) high efficiency cooling and heat exchange reducing overall energy usage by up to 50%, b) no maintenance required, c) devices and systems can be installed in almost any environment such as a traditional data center, high rise office, industrial building, offshore installation, underground installation, and ambient air data center, d) increasing server density up to 3× the current high-density server deployments thus reducing the amount of server room space required, e) improved physical security, f) improved EMI/RFI security, g) decreased labor costs, h) more protection against disasters such as fire, hurricane, and earthquake, i) fewer maintenance failures and mistakes, j) tamper-resistant to unauthorized human access, k) reduced or eliminated damage due to fire control systems, l) nearly silent in operation, m) internal components have cooler average temperature that will increase the life of the system, and n) impervious to environmental factors such as dust and humidity.

These and other benefits disclosed herein combine together to create entirely new classes of solutions. For example, innovation in the fluid cooling of electronic devices as disclosed herein, and innovations that allow for a broader range of installation environments are disclosed by Smith in U. S. Patent Appl. No. 2015/0000319 (January 2015) are challenging the assumptions and designs of data centers and server rooms.

Unless specifically stated as such, the preceding is not admitted to be prior art and no statement appearing in this section should be interpreted as a disclaimer of any features or improvements listed.

BRIEF DESCRIPTION OF THE INVENTION

Various embodiments of a system and method for fluid cooling of electronic devices installed in sealed enclosures are disclosed herein.

At least one embodiment described herein provides a cooling system for electronic devices installed in a sealed enclosure. Such embodiments are optimized for effective and efficient direct and indirect transfer of thermal energy away from heat-generating electronics into the surrounding environment. Designs embody enclosing structures comprised of walls that enclose an interior sealed space containing heat generating components and a dielectric thermally conductive fluid ("primary dielectric thermally conductive fluid"). The enclosure may be comprised of single wall construction that enclose an inner volume or may be comprised of inner, outer, and optional intermediate walls. Secondary thermally conductive fluids may be circulated within the enclosure walls and/or through an inner heat exchange mechanism to an external local or remote heat exchange loop. The inner volume of the enclosure may optionally contain a heat exchange mechanism though which a secondary thermally conductive fluid is circulated to an external local or remote heat exchange loop. The sealed enclosure may be located in a variety of environments comprising raised or slab floor datacenters, commercial buildings, residential buildings, outdoor locations, subsurface structures, and direct subsurface installation. The design leads to significant reductions in capital, infrastructure, power, cooling, maintenance, and operational costs associated with deploying computing hardware. In addition, the design provides for a high degree of physical, electrical, and magnetic security for the enclosed electronics.

Electronic devices may be disposed within the interior of the sealed enclosure in a variety of configurations to facilitate thermal transfer and best practice process efficiency. The enclosed electronic devices dissipate internally generated heat into the inner volume, the primary dielectric thermally conductive fluid, optional inner heat exchanger, and the inner thermally conductive walls of the sealed enclosure. The walls of the enclosure may be thermally connected by mechanical connection or other means. Cooling fins may be affixed to any wall surfaces to aid in heat transport and dissipation. Any wall surfaces may have surface features of various dimensionality to aid in heat transport and dissipation.

In embodiments with a plurality of enclosing walls, the sealed enclosure comprises a unit with an inner volume formed by a plurality of walls which form one or more enclosing volumes within said walls. The inner volume contains a single phase or multi-phase primary dielectric thermally conductive fluid in which electronic devices to be cooled are immersed and/or surrounded as well as an optional heat exchange mechanism through which is circulated a single phase or multi-phase secondary thermally conductive fluid ("secondary thermally conductive fluid"). Optionally, located between any two surfaces of the enclosure walls are structures that comprise one or more channels that contain a single phase or multi-phase secondary thermally conductive fluid. Inner and intermediate walls are thermally conductive and are optimized by composition and construction to provide for optimal heat transfer away from the inner volume. In embodiments in which the enclosure is comprised of single wall construction that enclose an inner volume, the inner volume contains a single phase or multi-phase primary dielectric thermally conductive fluid in which electronic devices to be cooled are immersed and/or surrounded as well as an optional heat exchange mechanism through which is circulated a single phase or multi-phase secondary thermally conductive fluid.

Some embodiments may use multiple enclosed and segregated secondary thermally conductive fluids by using intermediate walls or heat exchangers in the inner volume for the purpose of optimizing the thermal requirements. Secondary thermally conductive fluid(s) may be presented to one or more heat exchange mechanisms for the purpose of removing heat from the fluid(s). Heat exchange may be accomplished by a variety of means to one or more external heat sink systems that may be of various types including ventilation, compression, evaporation, absorption, or geothermal systems. The heat exchange system may reject heat directly into the immediate environment of the sealed enclosure via passive or forced circulation, or fluid may be circulated away from the sealed enclosure, cooled in a remote location, and then re-circulated back to the sealed enclosure at a lower temperature. The outer exterior walls may be thermally conductive or thermally insulating. Various and diverse thermally conductive fluids may be used to support the cooling of electronic devices within a sealed enclosure at a particular thermodynamic rate. For example, an embodiment could use a multi-phase thermally conductive fluid that allows rapid dissipation of the heat from high temperature electronic devices such as a computer with CPUs while other embodiments could use a single phase thermally conductive fluid for general heat transfer of lower powered electronic devices.

The sealed enclosure has fluid-tight entrances from the outer surface to the inner volume for power, networking, and other control and monitoring signals and functions. In addition, the sealed enclosure may optionally comprise fluid-tight entrances from the outer surface to the inner volume for gaseous fluid exchange with the inner volume for the purpose of pressure equalization, fluid maintenance, and/or supplying motive force to kinetic process components located in said inner volume.

The sealed enclosure may contain pressure balancing mechanisms for the purpose of maintaining suitable pressures of gaseous fluids in a volume of the sealed container.

To enhance the security of the electronic devices in the sealed enclosure, a functional "poison pill" system may be implemented to provide an electrical, magnetic, chemical, and/or mechanical means of rendering the electronic devices and any content stored on those devices to be inoperable, unusable, or unreadable.

Multiple configuration options are described to optimize installation of sealed enclosures into a variety of environments, such as homes, offices, businesses, datacenters, and specialty computing installations. The installation can be in any orientation and can be located in surface or sub-surface environments. Sealed enclosures be installed as standalone units or may be stacked or grouped together to form a structural unit of any dimensionality in a high-density configuration.

In general, the sealed enclosure described contains no user serviceable electronic devices. The devices are typically used until they are no longer useful at which point they are completely replaced. Typically these units are deployed in multiples and utilize system designs that allow for redundant failover of non-functioning devices.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGS and detailed description. It is intended that all such additional systems, methods, features and advantages that are included within this description, be within the scope of the claims.

BRIEF DESCRIPTION OF FIGURES

The features characteristic of the invention are set forth in the claims. However, the invention itself and further objectives and advantages thereof, will best be understood by reference to the following detailed description when read in conjunction with the accompanying drawings in which the left-most significant digit(s) in the reference numerals denote(s) the first figure in which the respective reference numerals appear, wherein:

DETAILED DESCRIPTION

Although described with reference to certain embodiments, those with skill in the art will recognize that the disclosed embodiments have relevance to a wide variety of areas in addition to those specific examples described below. Further, elements from one or more embodiments may be used in other embodiments and elements may be removed from an embodiment and remain within the scope of this disclosure.

All references, including publications, patent applications, and patents, cited herein are hereby incorporated by reference to the same extent as if each reference were individually and specifically indicated to be incorporated by reference and were set forth in its entirety herein; provided, however, to the extent there exists a conflict between this disclosure and a document incorporated by reference, this disclosure shall control.

As referenced herein, the term "sealed" is the past tense of "seal" which means to close as to make predominately secure against ingress or egress.

As referenced herein, the terms "sealed enclosure" and "containment vessel" are used interchangeably.

As referenced herein, an "enclosure group" is comprised of sealed enclosures that are grouped together to form a structural unit of any dimensionality.

As referenced herein, the terms "electronic device", "electronic devices", "computer", "computer systems", "computer cluster", "physical computer", "computer server", and "server" are used interchangeably, and unless otherwise specified comprise any electronic components that are configured to function as one or more independent electronic systems.

As referenced herein, a single phase thermally conductive fluid is defined as a liquid or a gas that remains in a single phase, either liquid or gas, across the entire range of operational temperatures and pressures of the electronic devices and/or systems disposed within the sealed enclosure.

As referenced herein, a multi-phase thermally conductive fluid is defined as a fluid that changes phase from a liquid to a gas at a temperature and pressure within the range of operational temperatures and pressures of the electronic devices and/or systems disposed within the sealed enclosure.

Figure 1:
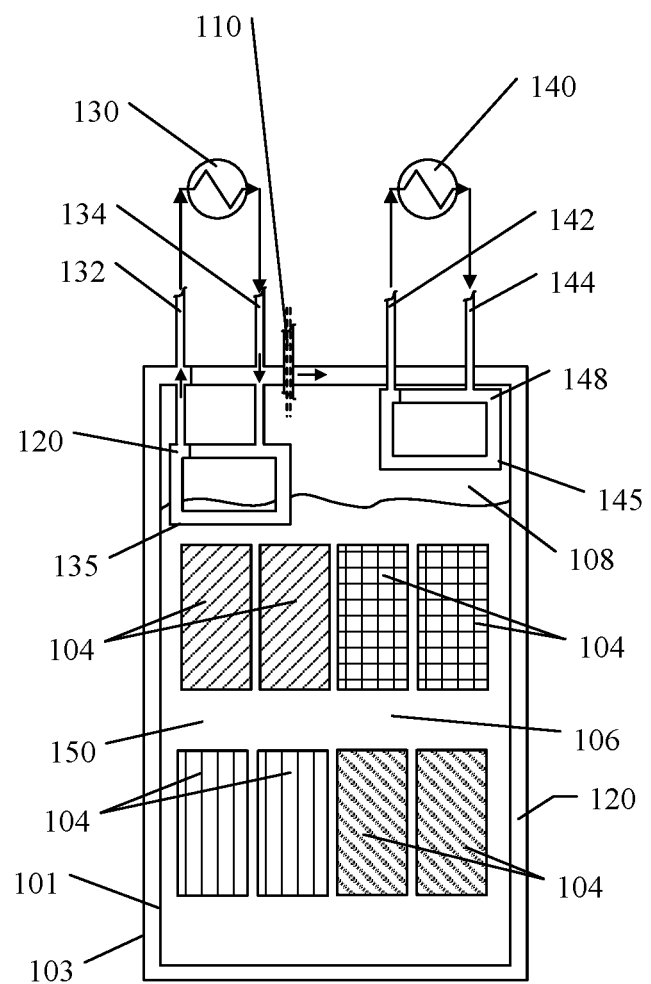
FIG. 1 shows a conceptual view of a sealed enclosure design comprising outer and inner enclosure walls that enclose electronic devices, a primary dielectric thermally conductive fluid, and optional heat exchange mechanism in the inner volume and a secondary thermally conductive fluid within the walls according to an embodiment of the disclosed subject matter.

FIG. 1 shows a conceptual view of a sealed enclosure design comprising inner enclosure wall 101 and outer enclosure wall 103 that enclose electronic devices 104 and a primary dielectric thermally conductive fluid 106, 108 in the inner volume 150, a secondary thermally conductive fluid 120 within the volume between the inner enclosure wall 101 and outer enclosure wall 103, and optional heat exchange mechanisms 135, 145 in the inner volume 150 that contain a secondary thermally conductive fluid 120, 148. The inner volume 150 contains a single phase or multi-phase primary dielectric thermally conductive fluid 106, 108 in which electronic devices 104 to be cooled are immersed or surrounded. The single phase or multi-phase primary dielectric thermally conductive fluid 106, 108 may be in a predominately liquid phase, gaseous phase, or in a combination liquid phase and gaseous phase. In an embodiment that comprises a single phase primary dielectric thermally conductive fluid 106 in the gaseous phase, said fluid will fill the entirety of inner volume 150. In an embodiment that comprises a single phase primary dielectric thermally conductive fluid 106 in the liquid phase, said fluid may fill the entirety of inner volume 150 or may fill less than the entirety of inner volume 150 with the remaining volume filled by at least one separate and distinct fluid in the gaseous phase 108. In an embodiment that comprises a multi-phase primary dielectric thermally conductive fluid 106, said fluid may fill the entirety of inner volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106 and if said multi-phase primary dielectric thermally conductive fluid 106, 108 fills less than the entirety of inner volume 150, the remaining volume may be filled by at least one separate and distinct fluid in the gaseous phase 108.

Embodiments of the disclosed sealed enclosure may be configured with single phase or multi-phase thermally conductive fluids. A single phase thermally conductive fluid will transfer heat using the principles of convection and conduction. A multi-phase thermally conductive fluid will transfer heat using the principles of convection, conduction, and phase change. As the multi-phase thermally conductive fluid in the liquid phase absorbs heat, a portion of said fluid is converted to the gaseous phase. Conversely, as the multi-phase thermally conductive fluid in the gaseous phase gives up heat by various heat exchange processes, a portion of said multi-phase thermally conductive fluid in the gaseous phase condenses back into multi-phase thermally conductive fluid in the liquid phase. If the amount of fluid in the gaseous phase 108 exceeds the volume of space internal to the sealed enclosure that is unoccupied by the multi-phase thermally conductive fluid in the liquid phase 106, said fluid in the gaseous phase 108 will exert a positive pressure inside the inner volume 150 of the sealed enclosure. Conversely, if the amount of fluid in the gaseous phase 108 is less than the volume of space internal to the sealed enclosure that is unoccupied by the multi-phase thermally conductive fluid in the liquid phase 106, said fluid in the gaseous phase 108 will exert a negative pressure inside the inner volume 150 of the sealed enclosure. In addition, some amount of multi-phase thermally conductive fluid in the gaseous phase 108 and optional other distinct and suitable compressible gaseous fluid may exist in a space of the sealed enclosure for various purposes comprising cushioning positive and negative pressures in the sealed enclosure, maintaining a headspace in a specified range of pressure as temperature varies, displacing thermally conductive fluid to allow weight adjustments to the overall sealed enclosure, and/or allowing accumulation of gaseous fluid used to drive internal kinetic processes or gaseous based mixing functionality. A single phase thermally conductive fluid may either completely or partially fill a space of the sealed enclosure and any space in the sealed enclosure that is not filled by said single phase thermally conductive fluid may be filled with a distinct and suitable compressible gaseous fluid for various purposes comprising cushioning positive and negative pressures in the sealed enclosure, maintaining a headspace in a specified range of pressure as temperature varies, displacing thermally conductive fluid to allow weight adjustments to the overall sealed enclosure, and/or allowing accumulation of gaseous fluid used to drive internal kinetic processes or gaseous based mixing functionality.

The walls of the sealed enclosure are constructed with inner enclosure wall 101 and outer enclosure wall 103 and connected to form channels around the inner enclosure walls 101 such that a secondary single phase or multi-phase thermally conductive fluid 120 may be circulated within the volume contained between said enclosure walls to an external local or remote heat exchanger assembly 130 via connecting lines 132, 134. In an another embodiment, the channels that are formed around the inner enclosure walls 101 may be constructed of conduit or piping that is thermally connected to the inner wall 101 in a path of optimal geometry such that a) a secondary single phase or multi-phase thermally conductive fluid 120 may be circulated within the conduit to an external local or remote heat exchanger assembly 130 via connecting lines 132, 134, and b) said conduit may be disposed between the inner enclosure wall 101 and outer enclosure wall 103 or said conduit is considered to be the outer enclosure wall 103.

Secondary single phase or multi-phase thermally conductive fluids 120, 148 may be in a predominately liquid phase, gaseous phase, or in a combination liquid phase and gaseous phase. In an embodiment that comprises a secondary single phase thermally conductive fluid 120 in the gaseous phase or the liquid phase, said fluid may fill the entirety of the space between the inner enclosure wall 101 and outer enclosure wall 103. In an embodiment that comprises a secondary multi-phase thermally conductive fluid 120, said fluid may partially or completely fill the entirety of the space between the inner enclosure wall 101 and outer enclosure wall 103 with portions of said fluid existing in the liquid phase and portions of said fluid existing in the gaseous phase in varying proportions relative to the temperature, pressure, and composition of said secondary multi-phase thermally conductive fluid 120.

One or more optional heat exchange mechanisms 135 may be disposed within the inner volume 150 such that a secondary single phase or multi-phase thermally conductive fluid 120 is segregated from the primary dielectric thermally conductive fluid 106, 108 and may be circulated through heat exchange mechanism 135 to an external local or remote heat exchanger assembly 130 via connecting lines 132, 134. One or more optional heat exchange mechanisms 145 may be disposed within the inner volume 150 such that a secondary single phase or multi-phase thermally conductive fluid 148 is segregated from the primary dielectric thermally conductive fluid 106, 108 and may be circulated through heat exchange mechanism 145 to an external local or remote heat exchanger assembly 140 via connecting lines 142, 144.

Heat exchange mechanisms 135, 145 may be disposed within the primary dielectric thermally conductive fluid liquid phase 106 and/or the gaseous phase 108 as heat exchange mechanisms comprising concentric tube, shell and tube, plate, fin, plate-fin, tube-fin, condenser tubing, loops, and split-flow loops. Heat exchange mechanisms 135, 145 may be thermally and/or mechanically attached or isolated from enclosure walls 101. Heat exchange mechanisms 135, 145 may be thermally and/or mechanically connected to portions of the enclosed electronic devices 104.

Electronic devices 104 may be disposed within the inner volume 150 of the sealed enclosure in a variety of configurations to facilitate thermal transfer and best practice process efficiency. The enclosed electronic devices 104 dissipate internally generated heat into the inner volume 150, the primary dielectric thermally conductive fluid 106, and the inner thermally conductive walls 101 of the sealed enclosure. A portion of the heat is transported from the inner enclosure wall 101 of the sealed enclosure to one or more secondary thermally conductive fluids 120 within the walls 101, 103 of the enclosure. The secondary thermally conductive fluid 120 is circulated between the walls 101, 103 where heat is transferred to the secondary thermally conductive fluid 120 and the outer enclosure wall 103. The secondary thermally conductive fluid 120 may also be circulated through the optional heat exchange mechanism 135. The secondary thermally conductive fluid 120 is circulated away from the sealed enclosure via a fluid-tight piping connection 132, is presented to one or more heat exchanger assemblies 130 for the purpose of removing heat from the fluid, and returned to the sealed enclosure via a fluid-tight piping connection 134. The secondary thermally conductive fluid 120: a) is circulated within the walls 101, 103 of the sealed enclosure where internal heat is absorbed; b) is removed from within the walls 101, 103 of the sealed enclosure and circulated through a heat exchange assembly 130 where a portion of the heat is removed from the thermally conductive fluid 120; and c) is returned to within the walls 101, 103 of the sealed enclosure. The secondary thermally conductive fluid 120 is circulated in such a fashion as to provide appropriate heat removal from the sealed enclosure and heat exchange may be accomplished by a variety of means to one or more external heat sink systems 130 that may be of various types including ventilation, compression, evaporation, and geothermal systems. The heat exchange system 130 may reject heat directly into the immediate environment via passive or forced circulation, or the fluid may be circulated away from the sealed enclosure, cooled in a remote location, and then re-circulated back to the sealed enclosure at a lower temperature.

The optional secondary thermally conductive fluid 148: a) is circulated within a heat exchanger mechanism 145 disposed in inner volume 150 where internal heat is absorbed from within inner volume 150; b) is removed from a heat exchange mechanism 145 and circulated through a heat exchange assembly 140 where a portion of the heat is removed from the thermally conductive fluid 148; and c) is returned to a heat exchange mechanism 145. The secondary thermally conductive fluid 148 is circulated in such a fashion as to provide appropriate heat removal from the sealed enclosure and heat exchange may be accomplished by a variety of means to one or more external heat sink systems 140 that may be of various types including ventilation, compression, evaporation, and geothermal systems. The heat exchange system 140 may reject heat directly into the immediate environment via passive or forced circulation, or the fluid may be circulated away from the sealed enclosure, cooled in a remote location, and then re-circulated back to the sealed enclosure at a lower temperature.

The inner enclosure wall 101 is thermally conductive and is optimized by composition and construction to provide for optimal heat transfer away from the inner volume 150. The outer enclosure wall 103 may thermally conductive or thermally insulating. Portions of the enclosure walls 103 may be optionally bonded to additional materials that facilitate enhanced thermal conduction or thermal insulation of the enclosure walls 103. The walls 101, 103 of the enclosure may be thermally connected by mechanical connection or other means. Cooling fins may be affixed to the wall surfaces 101, 103 to aid in heat transport and dissipation. Wall surfaces 101, 103 may have surface features of various dimensionality to aid in heat transport and dissipation. The sealed enclosure has fluid-tight entrances 110 from the outer surface to the inner volume 150 for power, networking, and other control and monitoring signals and functions which are appropriately connected to one or more electronic or other functional devices disposed in the inner volume 150 of the sealed enclosure.

The optional heat exchange circuit comprised of heat exchange assembly 130, fluid-tight piping connection 132, 134, heat exchange mechanism 135, and secondary thermally conductive fluid 120 is separate and distinct from the optional heat exchange circuit comprised of heat exchange assembly 140, fluid-tight piping connection 142, 144, heat exchange mechanism 145, and secondary thermally conductive fluid 148. Each heat exchange circuit is configured to effect heat removal from the inner volume 150 by using predetermined optimal loop operating temperatures and conditions. Each heat exchange circuit is configured with a heat exchange mechanism 135, 145 that is configured to provide redundant, tiered, primary, and/or secondary heat removal from the inner volume 150.

The sealed enclosure may optionally comprise heat exchange, control, pressure balancing, fluid maintenance, and/or fluid circulation functionality as described in FIGS. 3, 4, 5, 6, 7. Embodiment variations and details described herein apply equally to sealed enclosures with or without an interior 108 fluid head space. The sealed enclosure may optionally comprise one or more channels disposed in the inner volume 150 as described in FIGS. 15, 16. The sealed enclosure may optionally comprise one or more spacers disposed in the inner volume 150 of the sealed enclosure as described in FIG. 17A, 17B. The sealed enclosure may optionally comprise one or more mechanisms in the inner volume 150 to render the electronic devices and any content stored on those devices to be inoperable, unusable, or unreadable as described in FIG. 18.

The sealed enclosure may be located either adjacent to or remote from any heat exchange assemblies 130, 140 and/or pressure balancing systems and appropriate fluid transport channels between said locations are configured based optimal fluid flow and thermodynamic designs for the selected fluids. Further, any heat exchange assemblies 130, 140 and/or pressure balancing systems may perform their indicated functions for one or more sealed enclosures.

Sealed enclosures can be installed in any orientation, placed as standalone units or stacked or grouped together to form a structural unit of any dimensionality in a high-density configuration. An enclosure group may be disposed within a sealed or unsealed enclosure and may contain pressure balancing systems that are interior to such enclosure and exterior to sealed enclosures such that said pressure balancing systems perform their indicated functions for one or more sealed enclosures. Sealed enclosures within an enclosure group may be configured such that any secondary thermally conductive fluid 120, 148 is conducted through more than one sealed enclosure before the secondary thermally conductive fluid 120, 148 is circulated through a heat exchanger assembly 130, 140 where a portion of the heat is removed from the thermally conductive fluid 120, 148. Sealed enclosures within an enclosure group may be configured such that a pressure balancing system for a sealed enclosure within the enclosure group may be disposed interior to another sealed enclosure within the enclosure group.

Figure 2:
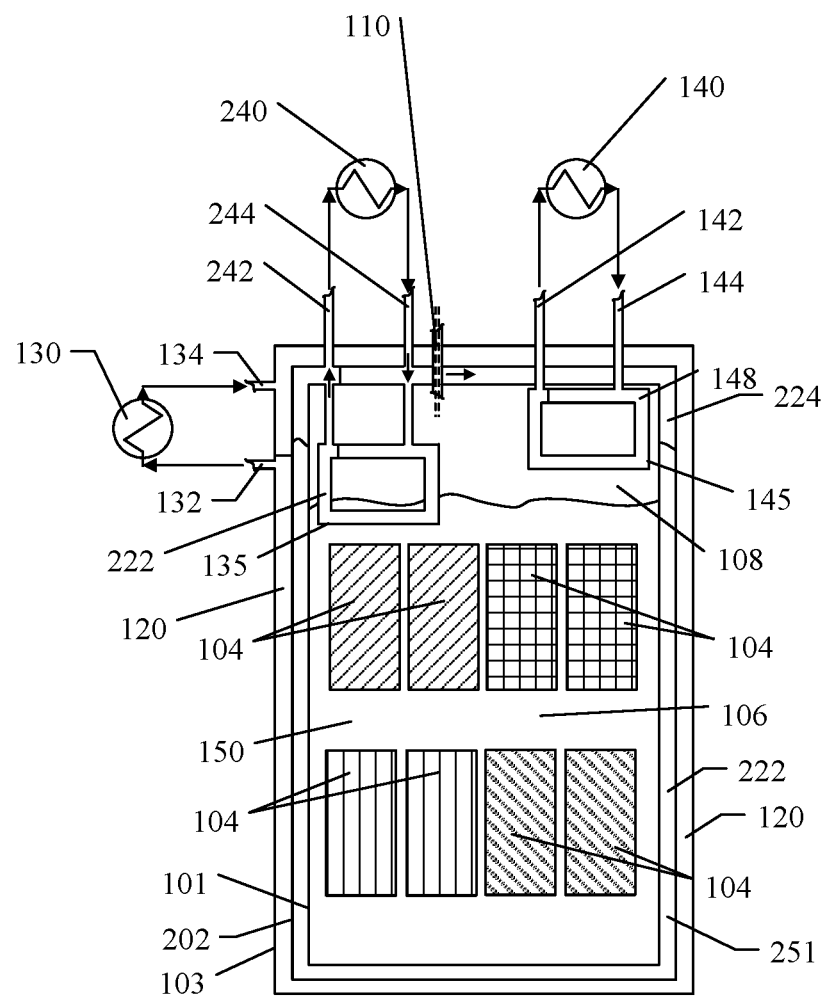
FIG. 2 shows a conceptual view of a sealed enclosure design comprising outer, intermediate, and inner enclosure walls that enclose electronic devices, a primary dielectric thermally conductive fluid, and optional heat exchange mechanism in the inner volume and one or more secondary thermally conductive fluids and optional heat exchange mechanism within the walls according to an embodiment of the disclosed subject matter.

FIG. 2 shows a conceptual view of a sealed enclosure design comprising inner enclosure wall 101, intermediate enclosure wall 202, and outer enclosure wall 103 that enclose electronic devices 104 and a primary dielectric thermally conductive fluid 106 in the inner volume 150, a secondary thermally conductive fluid 120 within the volume between the intermediate enclosure wall 202 and outer enclosure wall 103, one or more secondary intermediate thermally conductive fluids 222 within the volume between the inner enclosure wall 101 and intermediate enclosure wall 202, and optional heat exchange mechanisms 135, 145 in the inner volume 150 that contain a secondary thermally conductive fluid 222, 148. This embodiment is illustrated with a single intermediate enclosure wall 202 and secondary intermediate thermally conductive fluid 222, but other embodiments can contain multiple intermediate walls and fluids. The inner volume 150 contains a single phase or multi-phase dielectric thermally conductive fluid 106, 108 in which electronic devices 104 to be cooled are immersed or surrounded. The single phase or multi-phase primary dielectric thermally conductive fluid 106, 108 may be in a predominately liquid phase, gaseous phase, or in a combination liquid phase and gaseous phase. In an embodiment that comprises a single phase primary dielectric thermally conductive fluid 106 in the gaseous phase, said fluid will fill the entirety of inner volume 150. In an embodiment that comprises a single phase primary dielectric thermally conductive fluid 106 in the liquid phase, said fluid may fill the entirety of inner volume 150 or may fill less than the entirety of inner volume 150 with the remaining volume filled by at least one separate and distinct fluid in the gaseous phase 108. In an embodiment that comprises a multi-phase primary dielectric thermally conductive fluid 106, said fluid may fill the entirety of inner volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106 and if said multi-phase primary dielectric thermally conductive fluid 106, 108 fills less than the entirety of inner volume 150, the remaining volume may be filled by at least one separate and distinct fluid in the gaseous phase 108.

Embodiments of the disclosed sealed enclosure may be configured with single phase or multi-phase thermally conductive fluids. A single phase thermally conductive fluid will transfer heat using the principles of convection and conduction. A multi-phase thermally conductive fluid will transfer heat using the principles of convection, conduction, and phase change. As the multi-phase thermally conductive fluid in the liquid phase absorbs heat, a portion of said fluid is converted to the gaseous phase. Conversely, as the multi-phase thermally conductive fluid in the gaseous phase gives up heat by various heat exchange processes, a portion of said multi-phase thermally conductive fluid in the gaseous phase condenses back into multi-phase thermally conductive fluid in the liquid phase. If the amount of fluid in the gaseous phase 108 exceeds the volume of space internal to the sealed enclosure that is unoccupied by the multi-phase thermally conductive fluid in the liquid phase 106, said fluid in the gaseous phase 108 will exert a positive pressure inside the inner volume 150 of the sealed enclosure. Conversely, if the amount of fluid in the gaseous phase 108 is less than the volume of space internal to the sealed enclosure that is unoccupied by the multi-phase thermally conductive fluid in the liquid phase 106, said fluid in the gaseous phase 108 will exert a negative pressure inside the inner volume 150 of the sealed enclosure. In addition, some amount of multi-phase thermally conductive fluid in the gaseous phase 108 and optional other distinct and suitable compressible gaseous fluid may exist in a space of the sealed enclosure for various purposes comprising cushioning positive and negative pressures in the sealed enclosure, maintaining a headspace in a specified range of pressure as temperature varies, displacing thermally conductive fluid to allow weight adjustments to the overall sealed enclosure, and/or allowing accumulation of gaseous fluid used to drive internal kinetic processes or gaseous based mixing functionality. A single phase thermally conductive fluid may either completely or partially fill a space of the sealed enclosure and any space in the sealed enclosure that is not filled by said single phase thermally conductive fluid may be filled with a distinct and suitable compressible gaseous fluid for various purposes comprising cushioning positive and negative pressures in the sealed enclosure, maintaining a headspace in a specified range of pressure as temperature varies, displacing thermally conductive fluid to allow weight adjustments to the overall sealed enclosure, and/or allowing accumulation of gaseous fluid used to drive internal kinetic processes or gaseous based mixing functionality.

In one embodiment, the walls of the sealed enclosure are constructed with inner enclosure wall 101, intermediate enclosure wall 202, and outer enclosure wall 103 and connected to form channels around the inner enclosure walls 101 such that additional and distinct thermally conductive fluids 222, 120 may be circulated within the volume contained between said enclosure walls to an external local or remote heat exchanger assembly 130, 240 via connecting lines 132, 134, 242, 244. In another embodiment, remote heat exchanger assembly 240 is optionally replaced by an embodiment that is comprised of pressure balancing, fluid maintenance, and/or fluid circulation functionality as described in FIG. 8. In an another embodiment, the channels that are formed around the inner enclosure walls 101 may be constructed of conduit or piping that is thermally connected to the inner wall 101 in a path of optimal geometry such that a) a secondary single phase or multi-phase thermally conductive fluid 222 may be circulated within the conduit to an external local or remote heat exchanger assembly 240 via connecting lines 242, 244, and b) said conduit may be disposed between the inner enclosure wall 101 and intermediate enclosure wall 202 or said conduit is considered to be the intermediate enclosure wall 202. In an another embodiment, the channels that are formed around the intermediate enclosure wall 202 may be constructed of conduit or piping that is thermally connected to the intermediate enclosure wall 202 in a path of optimal geometry such that a) a secondary single phase or multi-phase thermally conductive fluid 120 may be circulated within the conduit to an external local or remote heat exchanger assembly 130 via connecting lines 132, 134, and b) said conduit may be disposed between the intermediate enclosure wall 202 and outer enclosure wall 103 or said conduit is considered to be the outer enclosure wall 103.

The secondary intermediate single phase or multi-phase thermally conductive fluid 222 may be in a predominately liquid phase, gaseous phase, or in a combination liquid phase and gaseous phase. In an embodiment that comprises a secondary intermediate single phase thermally conductive fluid 222 in the gaseous phase, said fluid will fill the entirety of the space between the inner enclosure wall 101 and intermediate enclosure wall 202. In an embodiment that comprises a secondary intermediate single phase thermally conductive fluid 222 in the liquid phase, said fluid may fill the entirety of the space between the inner enclosure wall 101 and the intermediate enclosure wall 202 or may fill less than the entirety of the space between the inner enclosure wall 101 and intermediate enclosure wall 202 with the remaining volume filled by at least one separate and distinct fluid in the gaseous phase 224. In an embodiment that comprises a secondary intermediate multi-phase thermally conductive fluid 222, said fluid may fill the entirety of the space between the inner enclosure wall 101 and intermediate enclosure wall 202 with portions of said fluid existing in the liquid phase 222 and portions of said fluid existing in the gaseous phase 224 in varying proportions relative to the temperature, pressure, and composition of said secondary intermediate multi-phase thermally conductive fluid 222. The secondary single phase or multi-phase thermally conductive fluid 120, 148 may be in a predominately liquid phase, gaseous phase, or in a combination liquid phase and gaseous phase. In an embodiment that comprises a secondary single phase thermally conductive fluid 120 in the gaseous phase or the liquid phase, said fluid may fill the entirety of the space between the intermediate enclosure wall 202 and outer enclosure wall 103. In an embodiment that comprises a secondary multi-phase thermally conductive fluid 120, said fluid may fill the entirety of the space between the intermediate enclosure wall 202 and outer enclosure wall 103 with portions of said fluid existing in the liquid phase and portions of said fluid existing in the gaseous phase in varying proportions relative to the temperature, pressure, and composition of said secondary multi-phase thermally conductive fluid 120.

One or more optional heat exchange mechanisms 135 may be disposed within the inner volume 150 such that a secondary intermediate single phase or multi-phase thermally conductive fluid 222 is segregated from the primary dielectric thermally conductive fluid 106, 108 and may be circulated through heat exchange mechanism 135 to an external local or remote heat exchanger assembly 240 via connecting lines 242, 244. One or more optional heat exchange mechanisms 145 may be disposed within the inner volume 150 such that a secondary single phase or multi-phase thermally conductive fluid 148 is segregated from the primary dielectric thermally conductive fluid 106, 108 and may be circulated through heat exchange mechanism 145 to an external local or remote heat exchanger assembly 140 via connecting lines 142, 144.

Heat exchange mechanisms 135, 145 may be disposed within the primary dielectric thermally conductive fluid liquid phase 106 and/or the gaseous phase 108 as heat exchange mechanisms comprising concentric tube, shell and tube, plate, fin, plate-fin, tube-fin, condenser tubing, loops, and split-flow loops. Heat exchange mechanisms 135, 145 may be thermally and/or mechanically attached or isolated from enclosure walls 101. Heat exchange mechanisms 135, 145 may be thermally and/or mechanically connected to portions of the enclosed electronic devices 104.

Electronic devices 104 may be disposed within the inner volume 150 of the sealed enclosure in a variety of configurations to facilitate thermal transfer and best practice process efficiency. The enclosed electronic devices 104 dissipate internally generated heat into the inner volume 150, the primary dielectric thermally conductive fluid 106, and the inner thermally conductive walls 101 of the sealed enclosure. A portion of the heat is transported from the inner enclosure wall 101 of the sealed enclosure to a secondary intermediate thermally conductive fluid 222 within the walls 101, 202 of the enclosure. The secondary intermediate thermally conductive fluid 222 may optionally be circulated between the walls 101, 202 where heat is transferred to secondary intermediate thermally conductive fluids 222 and the intermediate enclosure wall 202. The secondary intermediate thermally conductive fluid 222 may also be circulated through the optional heat exchange mechanism 135. The secondary intermediate thermally conductive fluid 222 may optionally be circulated away from the sealed enclosure via a fluid-tight piping connection 242, is presented to one or more heat exchange assemblies 240 for the purpose of removing heat from the fluid, and returned to the sealed enclosure via a fluid-tight piping connection 244. A portion of the heat is transported from the intermediate enclosure wall 202 of the sealed enclosure to the secondary thermally conductive fluid 120 within the walls 202, 103 of the enclosure. The secondary thermally conductive fluid 120 is circulated between the walls 202, 103 where heat is transferred to the secondary thermally conductive fluid 120 and the outer enclosure wall 103. The secondary thermally conductive fluid 120 is circulated away from the sealed enclosure via a fluid-tight piping connection 132, is presented to one or more heat exchange assemblies 130 for the purpose of removing heat from the fluid, and returned to the sealed enclosure via a fluid-tight piping connection 134. The secondary thermally conductive fluid 120: a) is circulated within the walls 103, 202 of the sealed enclosure where internal heat is absorbed; b) is removed from within the walls 103, 202 of the sealed enclosure and circulated through a heat exchange assembly 130 where a portion of the heat is removed from the thermally conductive fluid 120; and c) is returned to within the walls 103, 202 of the sealed enclosure. The secondary thermally conductive fluid 120 is circulated in such a fashion as to provide appropriate heat removal from the sealed enclosure. In the case of a sealed enclosure with one or more intermediate enclosure walls 202, each secondary intermediate thermally conductive fluid 222 may optionally be circulated from the sealed enclosure to an associated intermediate heat exchanger assembly 240. Further, if a sealed enclosure embodiment comprises both a secondary thermally conductive fluid 120 and one or more secondary intermediate thermally conductive fluids 222, then at least one of the said thermally conductive fluids is removed from the sealed enclosure, circulated through a heat exchanger assembly, and returned to the sealed enclosure. Heat exchange may be accomplished by a variety of means to one or more external heat sink systems 130, 240 that may be of various types including ventilation, compression, evaporation, absorption, and geothermal systems. The heat exchange system 130, 240 may reject heat directly into the immediate environment of the sealed enclosure via passive or forced circulation, or the fluid may be circulated away from the sealed enclosure, cooled in a remote location, and then re-circulated back to the sealed enclosure at a lower temperature.

The optional secondary thermally conductive fluid 148: a) is circulated within a heat exchanger mechanism 145 disposed in inner volume 150 where internal heat is absorbed from within inner volume 150; b) is removed from a heat exchange mechanism 145 and circulated through a heat exchange assembly 140 where a portion of the heat is removed from the thermally conductive fluid 148; and c) is returned to a heat exchange mechanism 145. The secondary thermally conductive fluid 148 is circulated in such a fashion as to provide appropriate heat removal from the sealed enclosure and heat exchange may be accomplished by a variety of means to one or more external heat sink systems 140 that may be of various types including ventilation, compression, evaporation, and geothermal systems. The heat exchange system 140 may reject heat directly into the immediate environment via passive or forced circulation, or the fluid may be circulated away from the sealed enclosure, cooled in a remote location, and then re-circulated back to the sealed enclosure at a lower temperature.

The inner enclosure wall 101 and intermediate enclosure wall 202 are thermally conductive and are optimized by composition and construction to provide for optimal heat transfer away from the inner volume 150. The outer enclosure wall 103 may thermally conductive or thermally insulating. Portions of the enclosure walls 103 may be optionally bonded to additional materials that facilitate enhanced thermal conduction or thermal insulation of the enclosure walls 103. The walls 101, 202, 103 of the enclosure may be thermally connected by mechanical connection or other means. Cooling fins may be affixed to the wall surfaces 101, 202, 103 to aid in heat transport and dissipation. Wall surfaces 101, 102, 103 may have surface features of various dimensionality to aid in heat transport and dissipation. The sealed enclosure has fluid-tight entrances 110 from the outer surface to the inner volume 150 for power, networking, and other control and monitoring signals and functions which are appropriately connected to one or more electronic or other functional devices disposed in the inner volume 150 of the sealed enclosure.

The optional heat exchange circuit comprised of heat exchange assembly 240, fluid-tight piping connection 242, 244, heat exchange mechanism 135, and secondary thermally conductive fluid 222 is separate and distinct from the optional heat exchange circuit comprised of heat exchange assembly 140, fluid-tight piping connection 142, 144, heat exchange mechanism 145, and secondary thermally conductive fluid 148. Each heat exchange circuit is configured to effect heat removal from the inner volume 150 by using predetermined optimal loop operating temperatures and conditions. Each heat exchange circuit is configured with a heat exchange mechanism 135, 145 that is configured to provide redundant, tiered, primary, and/or secondary heat removal from the inner volume 150.

The multi-wall sealed enclosure described herein may optionally comprise heat exchange, control, pressure balancing, fluid maintenance, and/or fluid circulation functionality as described in FIGS. 3, 4, 5, 6, 7 in which the inner enclosure wall 101 and outer enclosure wall 103 describe optional functionality without reference to the intermediate enclosure wall 202. Further, the multi-wall sealed enclosure described herein may optionally comprise heat exchange, control, pressure balancing, fluid maintenance, and/or fluid circulation functionality as described in FIG. 8. Embodiment variations and details described herein apply equally to sealed enclosures with or without intermediate enclosure walls 202 and secondary intermediate thermally conductive fluids 222, and with or without an interior 108, 224 fluid head space. The sealed enclosure may optionally comprise one or more channels disposed in the inner volume 150 as described in FIGS. 15, 16. The sealed enclosure may optionally comprise one or more spacers disposed in the inner volume 150 of the sealed enclosure as described in FIG. 17A, 17B. The sealed enclosure may optionally comprise one or more mechanisms in the inner volume 150 to render the electronic devices and any content stored on those devices to be inoperable, unusable, or unreadable as described in FIG. 18.

The sealed enclosure may be located either adjacent to or remote from any heat exchange assemblies 130, 140, 240 and/or pressure balancing systems and appropriate fluid transport channels between said locations are configured based optimal fluid flow and thermodynamic designs for the selected fluids. Further, any heat exchange assemblies 130, 140, 240 and/or pressure balancing systems may perform their indicated functions for one or more sealed enclosures.

Sealed enclosures can be installed in any orientation, placed as standalone units or stacked or grouped together to form a structural unit of any dimensionality in a high-density configuration. An enclosure group may be disposed within a sealed or unsealed enclosure and may contain pressure balancing systems that are interior to such enclosure and exterior to sealed enclosures such that said pressure balancing systems perform their indicated functions for one or more sealed enclosures. Sealed enclosures within an enclosure group may be configured such that any secondary thermally conductive fluid 120, 148, 222 is conducted through more than one sealed enclosure before the secondary thermally conductive fluid 120, 148, 222 is circulated through a heat exchanger assembly 130, 140, 240 where a portion of the heat is removed from the thermally conductive fluid 120, 148, 222. Sealed enclosures within an enclosure group may be configured such that a pressure balancing system for a sealed enclosure within the enclosure group may be disposed interior to another sealed enclosure within the enclosure group.

Figure 3:
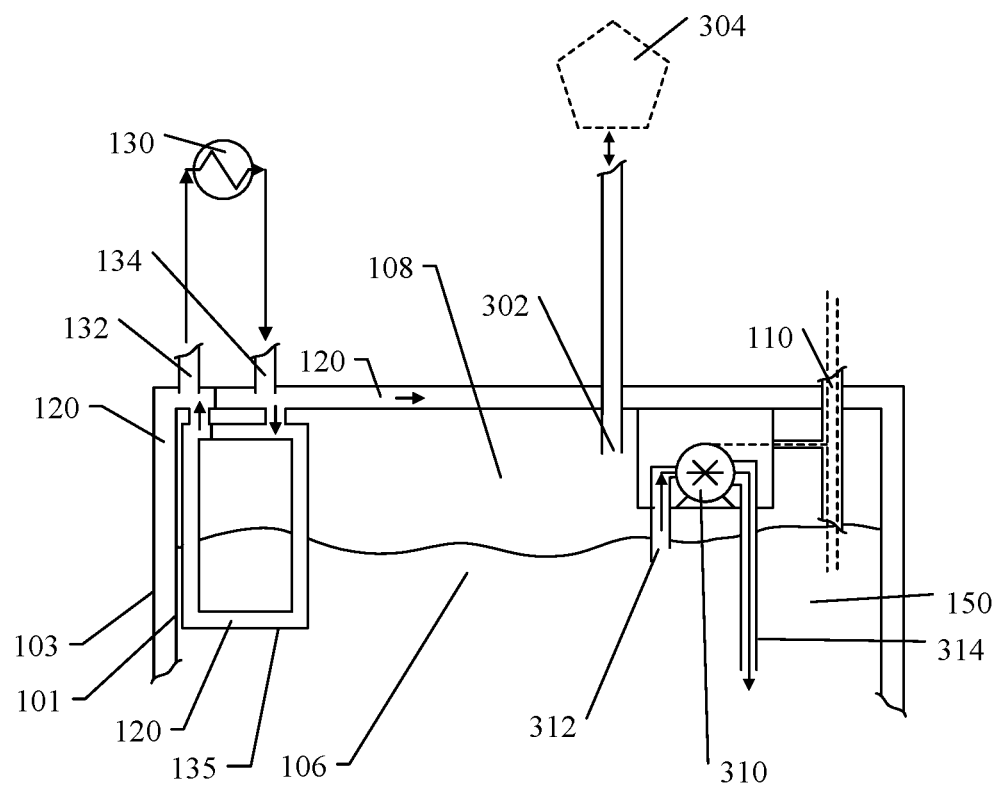
FIG. 3 shows a conceptual view of a single port pressure balancing mechanism used to relieve positive and negative pressures in a sealed enclosure, optional heat exchange mechanisms, and optional primary dielectric thermally conductive fluid pump circulation mechanisms according to an embodiment of the disclosed subject matter.

FIG. 3 shows a conceptual view of a single port pressure balancing mechanism used to relieve positive and negative pressures in a sealed enclosure, optional heat exchange mechanisms, and optional primary dielectric thermally conductive fluid pump circulation mechanisms. The sealed enclosure shown in the figure is typical of the disclosures described in FIGS. 1, 2 and is illustrated by showing only a portion of such sealed enclosure as a figure with an inner enclosure wall 101 and an outer enclosure wall 103, wherein the inner volume contains the primary dielectric thermally conductive fluid 106, 108 that either completely or partially fills the interior of the sealed enclosure as shown. The optional heat exchange circuit comprised of heat exchange assembly 140, fluid-tight piping connection 142, 144, heat exchange mechanism 145, and secondary thermally conductive fluid 148 as disclosed in FIGS. 1, 2 are not shown in this conceptual view but may be included herein as an additional and/or alternative means of heat removal.

The fluid exchange sealed entrance assembly 302 allows primary dielectric thermally conductive fluid 106, 108 fluid to be exchanged between the sealed enclosure and a pressure balancing system 304, maintaining a sealed enclosure environment and functioning for the purpose of pressure equalization of the inner volume 150 of the sealed enclosure and providing optional fluid management. The fluid exchange sealed entrance assembly 302 and pressure balancing system 304 may be configured to function with any primary dielectric thermally conductive fluid, but is used advantageously in embodiments that contain a) a single phase primary dielectric thermally conductive fluid 106 in the liquid phase, said fluid filling less than the entirety of inner volume 150 with the remaining volume filled by at least one separate and distinct fluid in the gaseous phase 108, b) a single phase thermally conductive fluid 106 in the gaseous phase, said fluid filling the entirety of inner volume 150, or c) a multi-phase primary dielectric thermally conductive fluid 106, said fluid at least partially filling the inner volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106 and if said multi-phase primary dielectric thermally conductive fluid 106, 108 fills less than the entirety of inner volume 150, the remaining volume may be filled by at least one separate and distinct fluid in the gaseous phase 108.

The pressure balancing system 304 is a system that functions to maintain a suitably constant fluid presence and pressure to the fluid exchange sealed entrance assembly 302 for one or more sealed enclosures. The pressure balancing system 304 may be located either adjacent to or remote from sealed enclosures. The pressure balancing system 304 is capable of supplying pressure to or removing pressure from the sealed enclosure using a single fluid exchange sealed entrance assembly 302 via connecting lines.

An extended surface configuration of the fluid exchange sealed entrance assembly 302 may be positioned either inside or outside of the sealed enclosure and is comprised of thermally conductive materials configured an extended surface area to effect supplement heat removal from the primary dielectric thermally conductive fluid 106, 108 that is transported through the fluid exchange sealed entrance assembly 302. Such extended surface configuration of the fluid exchange sealed entrance assembly 302 is cooled by the secondary thermally conductive fluid 120 that is returned from the secondary fluid heat exchanger 130 via connecting line 134 and flows over the extended surface configuration of the fluid exchange sealed entrance assembly 302. The flow of cooled secondary thermally conductive fluid 120 over the extended surface configuration of the fluid exchange sealed entrance assembly 302 serves to remove heat from the primary dielectric thermally conductive fluid 106, 108 that is transported through the fluid exchange sealed entrance assembly 302. This extended surface configuration of the fluid exchange sealed entrance assembly 302 may be utilized to condense the multi-phase primary dielectric thermally conductive fluid from the gaseous phase 108 back into the liquid phase 106, with the result of returning the multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure.

One or more optional heat exchange mechanisms 135 may be disposed within the inner volume 150 such that a secondary single phase or multi-phase thermally conductive fluid 120 is segregated from the primary dielectric thermally conductive fluid 106, 108 and may be circulated through heat exchange mechanism 135 to an external local or remote heat exchanger assembly 130 via connecting lines 132, 134. One or more optional heat exchange mechanisms 145 may be disposed within the inner volume 150 such that a secondary single phase or multi-phase thermally conductive fluid 148 is segregated from the primary dielectric thermally conductive fluid 106, 108 and may be circulated through heat exchange mechanism 145 to an external local or remote heat exchanger assembly 140 via connecting lines 142, 144. Heat exchange mechanisms 135, 145 are disposed within the primary dielectric thermally conductive fluid liquid phase 106 and/or the gaseous phase 108 as heat exchange mechanisms comprising concentric tube, shell and tube, plate, fin, plate-fin, tube-fin, condenser tubing, loops, and split-flow loops. Heat exchange mechanisms 135, 145 may be thermally and/or mechanically attached or isolated from the inner enclosure wall 101. Heat exchange mechanisms 135, 145 may be thermally and/or mechanically connected to portions of the enclosed electronic devices 104.

Optional mechanisms may be additionally configured in the inner volume 150 of the sealed enclosure in order to effect the circulation of the primary dielectric thermally conductive fluid 106 for the purpose of a) circulating the primary dielectric thermally conductive fluid 106 in order to more effectively transfer thermal energy from the enclosed electronic devices 104 to the primary dielectric thermally conductive fluid 106 and the inner enclosure wall 101, and b) to circulate the primary dielectric thermally conductive fluid 106 through at least one filter to trap impurities and particulates, embodiments of such mechanisms comprise a) a mechanism comprised of a fluid pump 310, a pump intake 312, and a pump discharge 314, or b) a mechanism comprised of an impeller, fan, turbine, or propeller that rotates under motive force.

Figure 4:
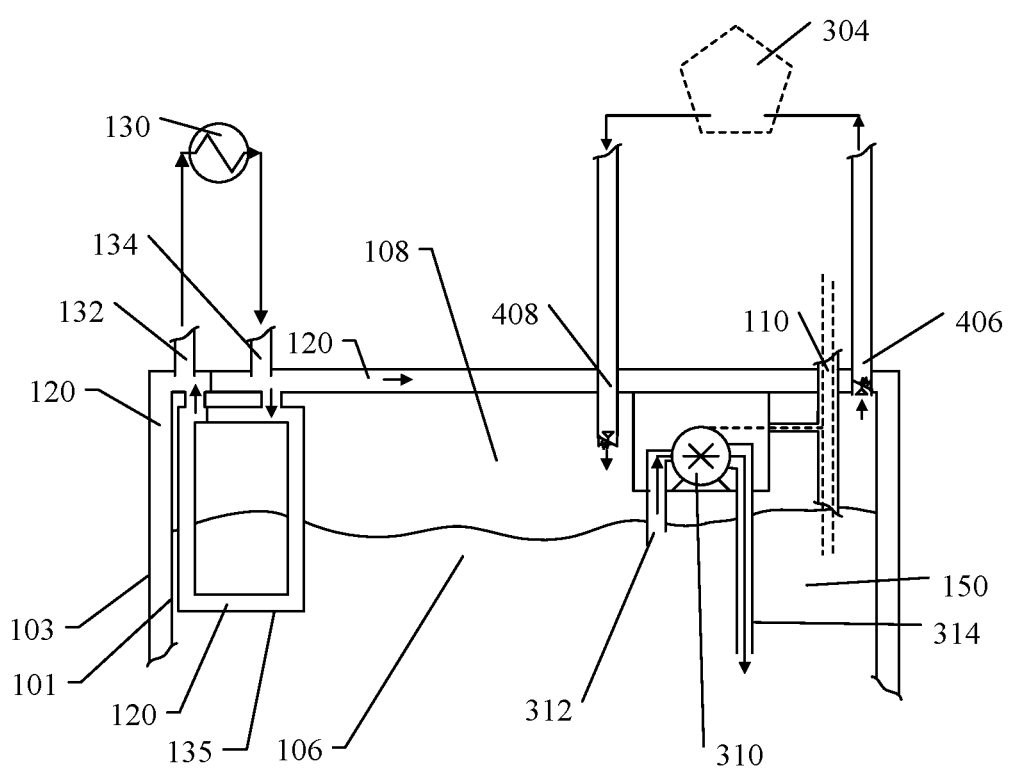
FIG. 4 shows a conceptual view of a dual port pressure balancing mechanism used to relieve positive and negative pressures in a sealed enclosure, optional heat exchange mechanisms, and optional primary dielectric thermally conductive fluid pump circulation mechanisms according to an embodiment of the disclosed subject matter.

FIG. 4 shows a conceptual view of a dual port pressure balancing mechanism used to relieve positive and negative pressures in a sealed enclosure, optional heat exchange mechanisms, and optional primary dielectric thermally conductive fluid pump circulation mechanisms. The sealed enclosure shown in the figure is typical of the disclosures described in FIGS. 1, 2 and is illustrated by showing only a portion of such sealed enclosure as a figure with an inner enclosure wall 101 and an outer enclosure wall 103, wherein the inner volume contains the primary dielectric thermally conductive fluid 106, 108 that either completely or partially fills the interior of the sealed enclosure as shown. The optional heat exchange circuit comprised of heat exchange assembly 140, fluid-tight piping connection 142, 144, heat exchange mechanism 145, and secondary thermally conductive fluid 148 as disclosed in FIGS. 1, 2 are not shown in this conceptual view but may be included herein as an additional and/or alternative means of heat removal.

The fluid exchange sealed entrance assembly 408 and fluid exchange sealed exhaust assembly 406 work in concert to allow primary dielectric thermally conductive fluid 106, 108 fluid to be exchanged between the sealed enclosure and a pressure balancing system 304, maintaining a sealed enclosure environment and functioning for the purpose of pressure equalization of the inner volume 150 of the sealed enclosure and providing optional fluid management. The fluid exchange sealed entrance assembly 408, fluid exchange sealed exhaust assembly 406, and pressure balancing system 304 may be configured to function with any primary dielectric thermally conductive fluid, but is used advantageously in the embodiments that contain a) a single phase primary dielectric thermally conductive fluid 106 in the liquid phase, said fluid filling less than the entirety of inner volume 150 with the remaining volume filled by at least one separate and distinct fluid in the gaseous phase 108, b) a single phase thermally conductive fluid 106 in the gaseous phase, said fluid filling the entirety of inner volume 150, or c) a multi-phase primary dielectric thermally conductive fluid 106, said fluid at least partially filling the inner volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106 and if said multi-phase primary dielectric thermally conductive fluid 106, 108 fills less than the entirety of inner volume 150, the remaining volume may be filled by at least one separate and distinct fluid in the gaseous phase 108.

The pressure balancing system 304 is closed loop system that functions to maintain an appropriate fluid presence and pressure at the fluid exchange sealed entrance assembly 408 and the fluid exchange sealed exhaust assembly 406 for one or more sealed enclosures via connecting lines. The pressure balancing system 304 may be located either adjacent to or remote from sealed enclosures. The pressure balancing system 304 is capable of supplying fluid pressure to the inner volume 150 of the sealed enclosure using the fluid exchange sealed entrance assembly 408 via connecting lines. The fluid exchange sealed entrance assembly 408 may be configured with a pressure relief valve assembly that allows fluid pressure to be released from the pressure balancing system 304 into the inner volume 150 of the sealed enclosure when the fluid pressure in the inner volume 150 of the sealed enclosure falls below a specified value thereby raising the fluid pressure in the inner volume 150 of the sealed enclosure. The fluid exchange sealed entrance assembly 408 may be optionally configured with a pressure regulator allowing the pressure balancing system 304 to distribute a high fluid pressure to said pressure regulator which reduces the fluid pressure to appropriate fluid pressure level for proper pressure relief valve operation. The fluid exchange sealed entrance assembly 408 may be located either inside or outside the sealed enclosure.

The pressure balancing system 304 is capable of removing fluid pressure from the inner volume 150 of the sealed enclosure using the fluid exchange sealed exhaust assembly 406 via connecting lines. The fluid exchange sealed exhaust assembly 406 may be configured with a pressure relief valve assembly that allows fluid pressure to be released from inner volume 150 of the sealed enclosure into the fluid pressure collection functionality of the pressure balancing system 304 when the fluid pressure in the inner volume 150 of the sealed enclosure rises above a specified value thereby lowering the fluid pressure in the inner volume 150 of the sealed enclosure. The fluid exchange sealed exhaust assembly 406 may be located either inside or outside the sealed enclosure.

An extended surface configuration of the fluid exchange sealed exhaust assembly 406 may be positioned either inside or outside of the sealed enclosure and is comprised of thermally conductive materials configured an extended surface area to effect supplement heat removal from the primary dielectric thermally conductive fluid 106, 108 that is transported through the fluid exchange sealed exhaust assembly 406. Such extended surface configuration of the fluid exchange sealed exhaust assembly 406 is cooled by the secondary thermally conductive fluid 120 that is returned from the secondary fluid heat exchanger 130 via connecting line 134 and flows over the extended surface configuration of the fluid exchange sealed exhaust assembly 406. The flow of cooled secondary thermally conductive fluid 120 over the extended surface configuration of the fluid exchange sealed exhaust assembly 406 serves to remove heat from the primary dielectric thermally conductive fluid 106, 108 that is transported through the fluid exchange sealed exhaust assembly 406. This extended surface configuration of the fluid exchange sealed exhaust assembly 406 may be utilized to condense multi-phase primary dielectric thermally conductive fluid from the gaseous phase 108 back into the liquid phase 106, with the result of returning such multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure.

One or more optional heat exchange mechanisms 135 may be disposed within the inner volume 150 such that a secondary single phase or multi-phase thermally conductive fluid 120 is segregated from the primary dielectric thermally conductive fluid 106, 108 and may be circulated through heat exchange mechanism 135 to an external local or remote heat exchanger assembly 130 via connecting lines 132, 134. One or more optional heat exchange mechanisms 145 may be disposed within the inner volume 150 such that a secondary single phase or multi-phase thermally conductive fluid 148 is segregated from the primary dielectric thermally conductive fluid 106, 108 and may be circulated through heat exchange mechanism 145 to an external local or remote heat exchanger assembly 140 via connecting lines 142, 144. Heat exchange mechanisms 135, 145 are disposed within the primary dielectric thermally conductive fluid liquid phase 106 and/or the gaseous phase 108 as heat exchange mechanisms comprising concentric tube, shell and tube, plate, fin, plate-fin, tube-fin, condenser tubing, loops, and split-flow loops. Heat exchange mechanisms 135, 145 may be thermally and/or mechanically attached or isolated from the inner enclosure wall 101. Heat exchange mechanisms 135, 145 may be thermally and/or mechanically connected to portions of the enclosed electronic devices 104.

Optional mechanisms may be additionally configured in the inner volume 150 of the sealed enclosure in order to effect the circulation of the primary dielectric thermally conductive fluid 106 for the purpose of a) circulating the primary dielectric thermally conductive fluid 106 in order to more effectively transfer thermal energy from the enclosed electronic devices 104 to the primary dielectric thermally conductive fluid 106 and the inner enclosure wall 101, and b) to circulate the primary dielectric thermally conductive fluid 106 through at least one filter to trap impurities and particulates, embodiments of such mechanisms comprise a) a mechanism comprised of a fluid pump 310, a pump intake 312, and a pump discharge 314, or b) a mechanism comprised of an impeller, fan, turbine, or propeller that rotates under motive force.

Figure 5:
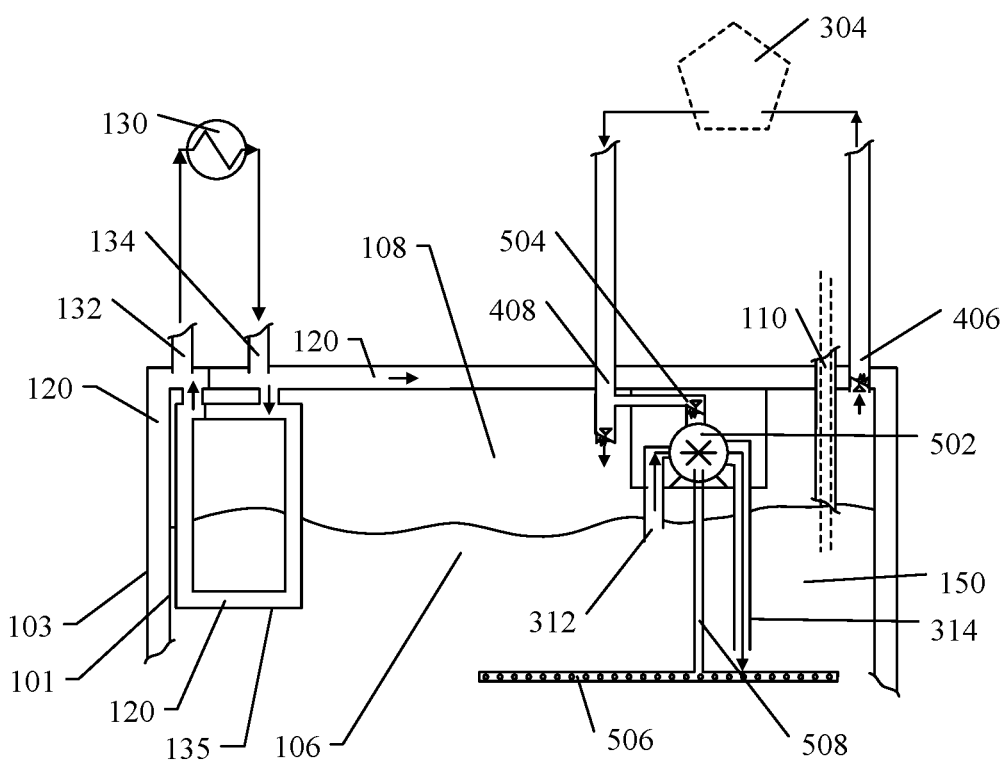
FIG. 5 shows a conceptual view of a dual port pressure balancing mechanism used to relieve positive and negative pressures in a sealed enclosure, optional heat exchange mechanisms, and optional pressurized gaseous fluid driven primary dielectric thermally conductive fluid pump and bubbler circulation mechanisms according to an embodiment of the disclosed subject matter.

FIG. 5 shows a conceptual view of a dual port pressure balancing mechanism used to relieve positive and negative pressures in a sealed enclosure, optional heat exchange mechanisms, and optional pressurized gaseous fluid driven primary dielectric thermally conductive fluid pump and bubbler circulation mechanisms. The sealed enclosure shown in the figure is typical of the disclosures described in FIGS. 1, 2 and is illustrated by showing only a portion of such sealed enclosure as a figure with an inner enclosure wall 101 and an outer enclosure wall 103, wherein the inner volume contains the primary dielectric thermally conductive fluid 106, 108 that either completely or partially fills the interior of the sealed enclosure as shown. The optional heat exchange circuit comprised of heat exchange assembly 140, fluid-tight piping connection 142, 144, heat exchange mechanism 145, and secondary thermally conductive fluid 148 as disclosed in FIGS. 1, 2 are not shown in this conceptual view but may be included herein as an additional and/or alternative means of heat removal.

The fluid exchange sealed entrance assembly 408 and the fluid exchange sealed exhaust assembly 406 work in concert to allow primary dielectric thermally conductive fluid 106, 108 fluid to be exchanged between the sealed enclosure and a pressure balancing system 304, maintaining a sealed enclosure environment and functioning for the purpose of pressure equalization of the inner volume 150 of the sealed enclosure, providing optional fluid management, and providing optional motive force to kinetic processes located in the inner volume 150 of the sealed enclosure. The fluid exchange sealed entrance assembly 408, fluid exchange sealed exhaust assembly 406, and pressure balancing system 304 may be configured to function with any primary dielectric thermally conductive fluid, but is used advantageously in the embodiments that contain a) a single phase primary dielectric thermally conductive fluid 106 in the liquid phase, said fluid filling less than the entirety of inner volume 150 with the remaining volume filled by at least one separate and distinct fluid in the gaseous phase 108, b) a single phase thermally conductive fluid 106 in the gaseous phase, said fluid filling the entirety of inner volume 150, or c) a multi-phase primary dielectric thermally conductive fluid 106, said fluid at least partially filling the inner volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106 and if said multi-phase primary dielectric thermally conductive fluid 106, 108 fills less than the entirety of inner volume 150, the remaining volume may be filled by at least one separate and distinct fluid in the gaseous phase 108.

The pressure balancing system 304 is closed loop system that functions to maintain an appropriate fluid presence and pressure at the fluid exchange sealed entrance assembly 408 and the fluid exchange sealed exhaust assembly 406 for one or more sealed enclosures via connecting lines. The pressure balancing system 304 may be located either adjacent to or remote from sealed enclosures. The pressure balancing system 304 is capable of supplying fluid pressure to the inner volume 150 of the sealed enclosure using the fluid exchange sealed entrance assembly 408 via connecting lines. The fluid exchange sealed entrance assembly 408 may be configured with a pressure relief valve assembly that allows fluid pressure to be released from the pressure balancing system 304 into the inner volume 150 of the sealed enclosure when the fluid pressure in the inner volume 150 of the sealed enclosure falls below a specified value thereby raising the fluid pressure in the inner volume 150 of the sealed enclosure. The fluid exchange sealed entrance assembly 408 may be optionally configured with a pressure regulator allowing the pressure balancing system 304 to distribute a high fluid pressure to said pressure regulator which reduces the fluid pressure to appropriate fluid pressure level for proper pressure relief valve operation. The fluid exchange sealed entrance assembly 408 may be located either inside or outside the sealed enclosure.

The pressure balancing system 304 is capable of removing fluid pressure from the inner volume 150 of the sealed enclosure using the fluid exchange sealed exhaust assembly 406 via connecting lines. The fluid exchange sealed exhaust assembly 406 may be configured with a pressure relief valve assembly that allows fluid pressure to be released from inner volume 150 of the sealed enclosure into the fluid pressure collection functionality of the pressure balancing system 304 when the fluid pressure in the inner volume 150 of the sealed enclosure rises above a specified value thereby lowering the fluid pressure in the inner volume 150 of the sealed enclosure. The fluid exchange sealed exhaust assembly 406 may be located either inside or outside the sealed enclosure.

An extended surface configuration of the fluid exchange sealed exhaust assembly 406 may be positioned either inside or outside of the sealed enclosure and is comprised of thermally conductive materials configured an extended surface area to effect supplement heat removal from the primary dielectric thermally conductive fluid 106, 108 that is transported through the fluid exchange sealed exhaust assembly 406. Such extended surface configuration of the fluid exchange sealed exhaust assembly 406 is cooled by the secondary thermally conductive fluid 120 that is returned from the secondary fluid heat exchanger 130 via connecting line 134 and flows over the extended surface configuration of the fluid exchange sealed exhaust assembly 406. The flow of cooled secondary thermally conductive fluid 120 over the extended surface configuration of the fluid exchange sealed exhaust assembly 406 serves to remove heat from the primary dielectric thermally conductive fluid 106, 108 that is transported through the fluid exchange sealed exhaust assembly 406. This extended surface configuration of the fluid exchange sealed exhaust assembly 406 may be utilized to condense multi-phase primary dielectric thermally conductive fluid from the gaseous phase 108 back into the liquid phase 106, with the result of returning such multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure.

One or more optional heat exchange mechanisms 135 may be disposed within the inner volume 150 such that a secondary single phase or multi-phase thermally conductive fluid 120 is segregated from the primary dielectric thermally conductive fluid 106, 108 and may be circulated through heat exchange mechanism 135 to an external local or remote heat exchanger assembly 130 via connecting lines 132, 134. One or more optional heat exchange mechanisms 145 may be disposed within the inner volume 150 such that a secondary single phase or multi-phase thermally conductive fluid 148 is segregated from the primary dielectric thermally conductive fluid 106, 108 and may be circulated through heat exchange mechanism 145 to an external local or remote heat exchanger assembly 140 via connecting lines 142, 144. Heat exchange mechanisms 135, 145 are disposed within the primary dielectric thermally conductive fluid liquid phase 106 and/or the gaseous phase 108 as heat exchange mechanisms comprising concentric tube, shell and tube, plate, fin, plate-fin, tube-fin, condenser tubing, loops, and split-flow loops. Heat exchange mechanisms 135, 145 may be thermally and/or mechanically attached or isolated from the inner enclosure wall 101. Heat exchange mechanisms 135, 145 may be thermally and/or mechanically connected to portions of the enclosed electronic devices 104.

An optional mechanism may be additionally configured in the inner volume 150 of the sealed enclosure in order to effect the circulation of the primary dielectric thermally conductive fluid 106 by using fluid pressure to supply the motive force for optional kinetic processes that include a) fluid circulation by means of a fluid pressure driven pump 502, b) fluid circulation by means of a bubbler 506, c) fluid circulation by means of both a fluid pressure driven pump 502 and a bubbler 506, or d) other fluid circulation mechanisms. These optional motive force mechanisms are driven by pressured fluid supplied by the pressure balancing system 304 to the motive force sealed entrance assembly 504 via connecting lines. The motive force sealed entrance assembly 504 may be optionally configured with a pressure regulator allowing the motive force fluid pressure source to supply a high pressure fluid to said pressure regulator which reduces the fluid pressure to appropriate fluid pressure level for the proper operation of the fluid pressure driven kinetic processes. The motive force sealed entrance assembly 504 may be configured with a pressure control valve assembly that allows fluid pressure from the pressure balancing system 304 to be turned on or off, thereby supplying fluid pressure from the pressure balancing system 304 to kinetic processes such as the fluid pressure driven pump 502 and/or the bubbler 506 for the purpose of a) circulating the primary dielectric thermally conductive fluid 106 in order to more effectively transfer thermal energy from the enclosed electronic devices 104 to the primary dielectric thermally conductive fluid 106 and the inner enclosure wall 101, and b) to circulate the primary dielectric thermally conductive fluid 106 through at least one filter to trap impurities and particulates. Fluid pressure supplied by the pressure balancing system 304 into the inner volume 150 of the sealed enclosure via the exhaust of the fluid pressure driven pump 502 and/or the bubbler 506 is returned to the pressure balancing system 304 through the fluid exchange sealed exhaust assembly 406. Embodiments that circulate the primary dielectric thermally conductive fluid 106 via a pumping action are comprised of a fluid pressure driven pump 502 connected to the motive force sealed entrance assembly 504, a pump intake 312, and a pump discharge 314. Embodiments that circulate the primary dielectric thermally conductive fluid 106 via a bubbling action are comprised of a bubbler 506 connected to the motive force sealed entrance assembly 504, and a bubbler connecting line 508, said bubbler 506 located in the lower part of the inner volume 150 of the sealed enclosure and comprising a mechanical means of releasing a pressured fluid in a predominately gaseous phase via a number of bubbler pores of various sizes. If the bubbler 506 and the fluid pressure driven pump 502 are both configured in an embodiment, the fluid pressure utilized to drive the bubbler 506 is supplied by the discharge fluid pressure of the fluid pressure driven pump 502 via connection lines 508. The motive force sealed entrance assembly 504 may be located either inside or outside the sealed enclosure.

Figure 6:
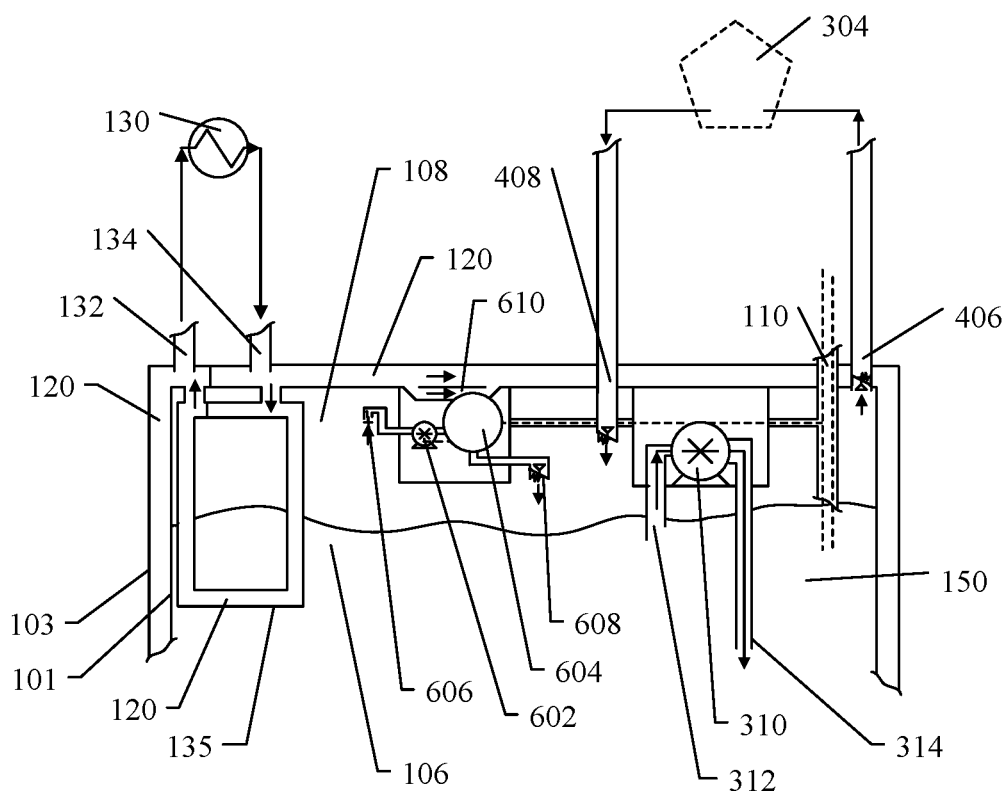
FIG. 6 shows a conceptual view of a pressure balancing mechanism with optional dual port pressure balancing mechanism used to relieve positive and negative pressures in a sealed enclosure, optional heat exchange mechanisms, and optional primary dielectric thermally conductive fluid pump circulation mechanisms according to an embodiment of the disclosed subject matter.

FIG. 6 shows a conceptual view of a pressure balancing mechanism with optional dual port pressure balancing mechanism used to relieve positive and negative pressures in a sealed enclosure, optional heat exchange mechanisms, and optional primary dielectric thermally conductive fluid pump circulation mechanisms. The sealed enclosure shown in the figure is typical of the disclosures described herein FIGS. 1, 2 and is illustrated by showing only a portion of such sealed enclosure as a figure with an inner enclosure wall 101 and an outer enclosure wall 103, wherein the inner volume contains the primary dielectric thermally conductive fluid 106, 108 that either completely or partially fills the interior of the sealed enclosure as shown. The optional heat exchange circuit comprised of heat exchange assembly 140, fluid-tight piping connection 142, 144, heat exchange mechanism 145, and secondary thermally conductive fluid 148 as disclosed in FIGS. 1, 2 are not shown in this conceptual view but may be included herein as an additional and/or alternative means of heat removal.

Pressure equalization of the inner volume 150 of the sealed enclosure as well as optional fluid management is provided by a) one or more first mechanisms disclosed as a pressure balancing mechanism that may include, but are not limited to a gaseous fluid compressor 602, pressurized gaseous fluid storage 604, gaseous fluid entrance assembly 606, gaseous and condensed fluid exhaust assembly 608, and associated connecting lines, valves, sensors, controls, wiring, power, enclosures, and regulators, and b) an optional second mechanism comprised of fluid exchange sealed entrance assembly 408, fluid exchange sealed exhaust assembly 406, pressure balancing system 304, and associated connecting lines, valves, sensors, controls, wiring, power, enclosures, and regulators such that if said first mechanisms and said second mechanism are present in an embodiment, one of the said mechanisms may be designated as the primary functional mechanism while the remaining said mechanisms are designated as secondary functional mechanisms, or all of the said mechanisms may be designated as the primary functional mechanisms. The gaseous fluid compressor 602, pressurized gaseous fluid storage 604, gaseous fluid entrance assembly 606, gaseous and condensed fluid exhaust assembly 608, and/or fluid exchange sealed entrance assembly 408, fluid exchange sealed exhaust assembly 406, and pressure balancing system 304 may be configured to function with any primary dielectric thermally conductive fluid, but is used advantageously in the embodiments that contain a) single phase primary dielectric thermally conductive fluid 106 in the liquid phase, said fluid filling less than the entirety of inner volume 150 with the remaining volume filled by at least one separate and distinct fluid in the gaseous phase 108, b) single phase thermally conductive fluid 106 in the gaseous phase, said fluid filling the entirety of inner volume 150, or c) multi-phase primary dielectric thermally conductive fluid 106, said fluid at least partially filling the inner volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106 and if said multi-phase primary dielectric thermally conductive fluid 106, 108 fills less than the entirety of inner volume 150, the remaining volume may be filled by at least one separate and distinct fluid in the gaseous phase 108.

The gaseous fluid compressor 602, pressurized gaseous fluid storage 604, gaseous fluid entrance assembly 606, and/or gaseous and condensed fluid exhaust assembly 608 work in concert to allow gaseous fluid that is present in the inner volume 150 of the sealed enclosure to be compressed and stored for release back into the inner volume 150 of the sealed enclosure as necessary to maintain a specified range of fluid pressure within the inner volume 150 of the sealed enclosure. The gaseous fluid entrance assembly 606 may comprise a a) check valve that allows only fluid in the gaseous phase to flow into the intake of the gaseous fluid compressor 602, orb) pressure relief valve that allows pressure to be a specified amount greater in inner volume 150 than the pressure in the intake of the gaseous fluid compressor 602. When the fluid pressure in the inner volume 150 of the sealed enclosure rises above a specified value, the gaseous fluid compressor 602 is activated and gaseous fluid 108 flows through the gaseous fluid entrance assembly 606 into the intake of the gaseous fluid compressor 602 where such gaseous fluid is compressed by the gaseous fluid compressor 602 and stored in pressurized gaseous fluid storage 604 thereby lowering the fluid pressure in the inner volume 150 of the sealed enclosure.

The pressurized gaseous fluid storage 604 may be comprised of thermally conductive materials configured to effect supplemental heat removal from the compressed gaseous fluid 108 by configurations comprising construction methodology or optional heat exchanger 610. In embodiments with multi-phase thermally conductive fluid, as heat is removed from the multi-phase thermally conductive fluid 108 disposed inside the pressurized gaseous fluid storage 604, at least a portion of the multi-phase thermally conductive fluid 108 in the gaseous phase condenses to liquid phase 106 and flows as a liquid to the lower part of pressurized gaseous fluid storage 604 thereby functioning as a compressor by reducing the pressure inside the pressurized gaseous fluid storage 604 as an effect of said phase change of the multi-phase thermally conductive fluid from the gaseous phase 108 to the liquid phase 106.

The gaseous and condensed fluid exhaust assembly 608 is comprised of at least one of a pressure regulator or a pressure relief valve as to allow fluid 106, 108 in gaseous and/or liquid phase that is disposed in the pressurized gaseous fluid storage 604 to be discharged into the inner volume 150 when conditions exist such as a) a specific command to act is issued by control systems, b) pressure in inner volume 150 falls below a specified value, c) a sensor internal to the pressurized gaseous fluid storage 604 detects a liquid condensation level above specified value, d) a required operation prior to the operation of the gaseous fluid compressor 602, e) after powering up or before powering down the system of electronic devices 104, or f) other conditions as required by safety or operational status with said discharge action continuing until such time as a) a sensor internal to the pressurized gaseous fluid storage 604 detects a liquid condensation level below specified value, b) pressure in the inner volume 150 rise above a specified value, or c) other conditions as required by safety or operational status.

An optional heat exchanger 610 comprising a concentric tube, shell and tube, plate, fin, plate-fin, or tube-fin heat exchanger removes heat from pressurized gaseous fluid storage 604. The pressurized gaseous fluid storage 604 may be comprised of thermally conductive materials configured to effect supplemental heat removal from the fluid 108, 106 that is disposed internally to the pressurized gaseous fluid storage 604. The heat exchanger 610 may be positioned partially or completely inside or outside of the sealed enclosure. The pressurized gaseous fluid storage 604 is cooled by the secondary thermally conductive fluid 120 that is returned from the secondary fluid heat exchanger 130 via connecting line 134 and flows through the heat exchanger 610. In another embodiment the pressurized gaseous fluid storage 604 is cooled by the secondary thermally conductive fluid 148 that is returned from the secondary fluid heat exchanger 140 via connecting line 144 and flows through the heat exchanger 610. In embodiments with multi-phase thermally conductive fluid, the cooled pressurized gaseous fluid storage 604 serves to remove heat from the multi-phase thermally conductive fluid 108 that is confined in the pressurized gaseous fluid storage 604 which may further serve to condense multi-phase thermally conductive fluid from the gaseous phase 108 into the liquid phase 106 of said fluid, thereby functioning as a compressor by reducing the pressure inside the pressurized gaseous fluid storage 604 as an effect of said phase change of the multi-phase thermally conductive fluid from the gaseous phase 108 to the liquid phase 106. The optional heat exchanger 610 or other heat exchanger comprising a concentric tube, shell and tube, plate, fin, plate-fin, or tube-fin heat exchanger may be extended and further configured to directly or indirectly remove heat from sources such as electronic devices, batteries, motors, valves, fluid lines, or pumps.

The fluid exchange sealed entrance assembly 408 and the fluid exchange sealed exhaust assembly 406 work in concert to allow primary dielectric thermally conductive fluid 106, 108 fluid to be exchanged between the sealed enclosure and a pressure balancing system 304, maintaining a sealed enclosure environment. The pressure balancing system 304 is closed loop system that functions to maintain an appropriate fluid presence and pressure at the fluid exchange sealed entrance assembly 408 and the fluid exchange sealed exhaust assembly 406 for one or more sealed enclosures via connecting lines. The pressure balancing system 304 may be located either adjacent to or remote from sealed enclosures. The pressure balancing system 304 is capable of supplying fluid pressure to the inner volume 150 of the sealed enclosure using the fluid exchange sealed entrance assembly 408 via connecting lines. The fluid exchange sealed entrance assembly 408 may be configured with a pressure relief valve assembly that allows fluid pressure to be released from the pressure balancing system 304 into the inner volume 150 of the sealed enclosure when the fluid pressure in the inner volume 150 of the sealed enclosure falls below a specified value thereby raising the fluid pressure in the inner volume 150 of the sealed enclosure. The fluid exchange sealed entrance assembly 408 may be optionally configured with a pressure regulator allowing the pressure balancing system 304 to distribute a high fluid pressure to said pressure regulator which reduces the fluid pressure to appropriate fluid pressure level for proper pressure relief valve operation. The fluid exchange sealed entrance assembly 408 may be located either inside or outside the sealed enclosure.

The pressure balancing system 304 is capable of removing fluid pressure from the inner volume 150 of the sealed enclosure using the fluid exchange sealed exhaust assembly 406 via connecting lines. The fluid exchange sealed exhaust assembly 406 may be configured with a pressure relief valve assembly that allows fluid pressure to be released from inner volume 150 of the sealed enclosure into the fluid pressure collection functionality of the pressure balancing system 304 when the fluid pressure in the inner volume 150 of the sealed enclosure rises above a specified value thereby lowering the fluid pressure in the inner volume 150 of the sealed enclosure. The fluid exchange sealed exhaust assembly 406 may be located either inside or outside the sealed enclosure.

An extended surface configuration of the fluid exchange sealed exhaust assembly 406 may be positioned either inside or outside of the sealed enclosure and is comprised of thermally conductive materials configured an extended surface area to effect supplement heat removal from the primary dielectric thermally conductive fluid 106, 108 that is transported through the fluid exchange sealed exhaust assembly 406. Such extended surface configuration of the fluid exchange sealed exhaust assembly 406 is cooled by the secondary thermally conductive fluid 120 that is returned from the secondary fluid heat exchanger 130 via connecting line 134 and flows over the extended surface configuration of the fluid exchange sealed exhaust assembly 406. The flow of cooled secondary thermally conductive fluid 120 over the extended surface configuration of the fluid exchange sealed exhaust assembly 406 serves to remove heat from the primary dielectric thermally conductive fluid 106, 108 that is transported through the fluid exchange sealed exhaust assembly 406. This extended surface configuration of the fluid exchange sealed exhaust assembly 406 may be utilized to condense multi-phase primary dielectric thermally conductive fluid from the gaseous phase 108 back into the liquid phase 106, with the result of returning such multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure.

One or more optional heat exchange mechanisms 135 may be disposed within the inner volume 150 such that a secondary single phase or multi-phase thermally conductive fluid 120 is segregated from the primary dielectric thermally conductive fluid 106, 108 and may be circulated through heat exchange mechanism 135 to an external local or remote heat exchanger assembly 130 via connecting lines 132, 134. One or more optional heat exchange mechanisms 145 may be disposed within the inner volume 150 such that a secondary single phase or multi-phase thermally conductive fluid 148 is segregated from the primary dielectric thermally conductive fluid 106, 108 and may be circulated through heat exchange mechanism 145 to an external local or remote heat exchanger assembly 140 via connecting lines 142, 144. Heat exchange mechanisms 135, 145 are disposed within the primary dielectric thermally conductive fluid liquid phase 106 and/or the gaseous phase 108 as heat exchange mechanisms comprising concentric tube, shell and tube, plate, fin, plate-fin, tube-fin, condenser tubing, loops, and split-flow loops. Heat exchange mechanisms 135, 145 may be thermally and/or mechanically attached or isolated from the inner enclosure wall 101. Heat exchange mechanisms 135, 145 may be thermally and/or mechanically connected to portions of the enclosed electronic devices 104.

Optional mechanisms may be additionally configured in the inner volume 150 of the sealed enclosure in order to effect the circulation of the primary dielectric thermally conductive fluid 106 for the purpose of a) circulating the primary dielectric thermally conductive fluid 106 in order to more effectively transfer thermal energy from the enclosed electronic devices 104 to the primary dielectric thermally conductive fluid 106 and the inner enclosure wall 101, and b) to circulate the primary dielectric thermally conductive fluid 106 through at least one filter to trap impurities and particulates, embodiments of such mechanisms comprise a) a mechanism comprised of a fluid pump 310, a pump intake 312, and a pump discharge 314, or b) a mechanism comprised of an impeller, fan, turbine, or propeller that rotates under motive force.

Figure 7:
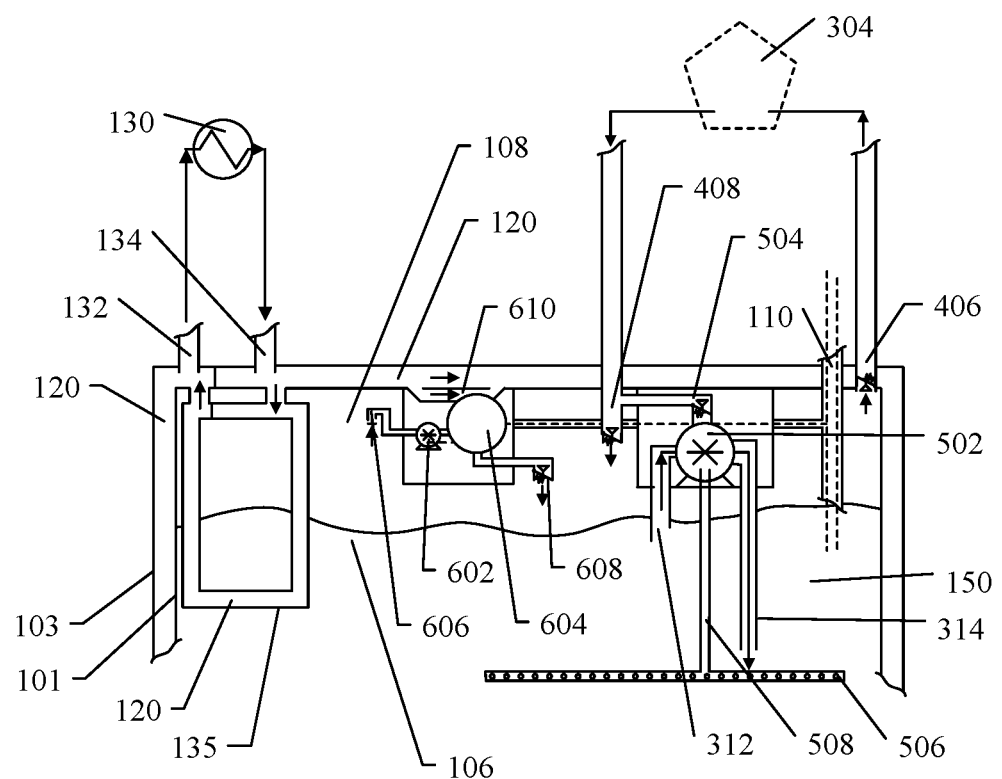
FIG. 7 shows a conceptual view of a pressure balancing mechanism with dual port pressure balancing mechanism used to relieve positive and negative pressures in a sealed enclosure, optional heat exchange mechanisms, and optional pressurized gaseous fluid driven primary dielectric thermally conductive fluid pump and bubbler circulation mechanisms according to an embodiment of the disclosed subject matter.

FIG. 7 shows a conceptual view of a pressure balancing mechanism with dual port pressure balancing mechanism used to relieve positive and negative pressures in a sealed enclosure, optional heat exchange mechanisms, and optional pressurized gaseous fluid driven primary dielectric thermally conductive fluid pump and bubbler circulation mechanisms. The sealed enclosure shown in the figure is typical of the disclosures described herein FIGS. 1, 2 and is illustrated by showing only a portion of such sealed enclosure as a figure with an inner enclosure wall 101 and an outer enclosure wall 103, wherein the inner volume contains the primary dielectric thermally conductive fluid 106, 108 that either completely or partially fills the interior of the sealed enclosure as shown. The optional heat exchange circuit comprised of heat exchange assembly 140, fluid-tight piping connection 142, 144, heat exchange mechanism 145, and secondary thermally conductive fluid 148 as disclosed in FIGS. 1, 2 are not shown in this conceptual view but may be included herein as an additional and/or alternative means of heat removal.

Pressure equalization of the inner volume 150 of the sealed enclosure as well as optional fluid management is provided by a) one or more first mechanisms disclosed as a pressure balancing mechanism that may include, but are not limited to a gaseous fluid compressor 602, pressurized gaseous fluid storage 604, gaseous fluid entrance assembly 606, gaseous and condensed fluid exhaust assembly 608, and associated connecting lines, valves, sensors, controls, wiring, power, enclosures, and regulators, and b) an optional second mechanism comprised of fluid exchange sealed entrance assembly 408, fluid exchange sealed exhaust assembly 406, pressure balancing system 304, and associated connecting lines, valves, sensors, controls, wiring, power, enclosures, and regulators such that if said first mechanisms and said second mechanism are present in an embodiment, one of the said mechanisms may be designated as the primary functional mechanism while the remaining said mechanisms are designated as secondary functional mechanisms, or all of the said mechanisms may be designated as the primary functional mechanisms. The gaseous fluid compressor 602, pressurized gaseous fluid storage 604, gaseous fluid entrance assembly 606, gaseous and condensed fluid exhaust assembly 608, and/or fluid exchange sealed entrance assembly 408, fluid exchange sealed exhaust assembly 406, and pressure balancing system 304 may be configured to function with any primary dielectric thermally conductive fluid, but is used advantageously in the embodiments that contain a) single phase primary dielectric thermally conductive fluid 106 in the liquid phase, said fluid filling less than the entirety of inner volume 150 with the remaining volume filled by at least one separate and distinct fluid in the gaseous phase 108, b) single phase thermally conductive fluid 106 in the gaseous phase, said fluid filling the entirety of inner volume 150, or c) multi-phase primary dielectric thermally conductive fluid 106, said fluid at least partially filling the inner volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106 and if said multi-phase primary dielectric thermally conductive fluid 106, 108 fills less than the entirety of inner volume 150, the remaining volume may be filled by at least one separate and distinct fluid in the gaseous phase 108.

The gaseous fluid compressor 602, pressurized gaseous fluid storage 604, gaseous fluid entrance assembly 606, and/or gaseous and condensed fluid exhaust assembly 608 work in concert to allow gaseous fluid that is present in the inner volume 150 of the sealed enclosure to be compressed and stored for release back into the inner volume 150 of the sealed enclosure as necessary to maintain a specified range of fluid pressure within the inner volume 150 of the sealed enclosure. The gaseous fluid entrance assembly 606 may comprise a a) check valve that allows only fluid in the gaseous phase to flow into the intake of the gaseous fluid compressor 602, orb) a pressure relief valve that allows pressure to be a specified amount greater in inner volume 150 than the pressure in the intake of the gaseous fluid compressor 602. When the fluid pressure in the inner volume 150 of the sealed enclosure rises above a specified value, the gaseous fluid compressor 602 is activated and gaseous fluid 108 flows through the gaseous fluid entrance assembly 606 into the intake of the gaseous fluid compressor 602 where such gaseous fluid is compressed by the gaseous fluid compressor 602 and stored in pressurized gaseous fluid storage 604 thereby lowering the fluid pressure in the inner volume 150 of the sealed enclosure.

The pressurized gaseous fluid storage 604 may be comprised of thermally conductive materials configured to effect supplemental heat removal from the compressed gaseous fluid 108 by configurations comprising construction methodology or optional heat exchanger 610. In embodiments with multi-phase thermally conductive fluid, as heat is removed from the multi-phase thermally conductive fluid 108 disposed inside the pressurized gaseous fluid storage 604, at least a portion of the multi-phase thermally conductive fluid 108 in the gaseous phase condenses to liquid phase 106 and flows as a liquid to the lower part of pressurized gaseous fluid storage 604 thereby functioning as a compressor by reducing the pressure inside the pressurized gaseous fluid storage 604 as an effect of said phase change of the multi-phase thermally conductive fluid from the gaseous phase 108 to the liquid phase 106.

The gaseous and condensed fluid exhaust assembly 608 is comprised of at least one of a pressure regulator or a pressure relief valve as to allow fluid 106, 108 in gaseous and/or liquid phase that is disposed in the pressurized gaseous fluid storage 604 to be discharged into the inner volume 150 when conditions exist such as a) a specific command to act is issued by control systems, b) pressure in inner volume 150 falls below a specified value, c) a sensor internal to the pressurized gaseous fluid storage 604 detects a liquid condensation level above specified value, d) a required operation prior to the operation of the gaseous fluid compressor 602, e) after powering up or before powering down the system of electronic devices 104, or f) other conditions as required by safety or operational status with said discharge action continuing until such time as a) a sensor internal to the pressurized gaseous fluid storage 604 detects a liquid condensation level below specified value, b) pressure in the inner volume 150 rise above a specified value, or c) other conditions as required by safety or operational status.

An optional heat exchanger 610 comprising a concentric tube, shell and tube, plate, fin, plate-fin, or tube-fin heat exchanger removes heat from pressurized gaseous fluid storage 604. The pressurized gaseous fluid storage 604 may be comprised of thermally conductive materials configured to effect supplemental heat removal from the fluid 108, 106 that is disposed internally to the pressurized gaseous fluid storage 604. The heat exchanger 610 may be positioned partially or completely inside or outside of the sealed enclosure. The pressurized gaseous fluid storage 604 is cooled by the secondary thermally conductive fluid 120 that is returned from the secondary fluid heat exchanger 130 via connecting line 134 and flows through the heat exchanger 610. In another embodiment the pressurized gaseous fluid storage 604 is cooled by the secondary thermally conductive fluid 148 that is returned from the secondary fluid heat exchanger 140 via connecting line 144 and flows through the heat exchanger 610. In embodiments with multi-phase thermally conductive fluid, the cooled pressurized gaseous fluid storage 604 serves to remove heat from the multi-phase thermally conductive fluid 108 that is confined in the pressurized gaseous fluid storage 604 which may further serve to condense multi-phase thermally conductive fluid from the gaseous phase 108 into the liquid phase 106 of said fluid, thereby functioning as a compressor by reducing the pressure inside the pressurized gaseous fluid storage 604 as an effect of said phase change of the multi-phase thermally conductive fluid from the gaseous phase 108 to the liquid phase 106. The optional heat exchanger 610 or other heat exchanger comprising a concentric tube, shell and tube, plate, fin, plate-fin, or tube-fin heat exchanger may be extended and further configured to directly or indirectly remove heat from sources such as electronic devices, batteries, motors, valves, fluid lines, or pumps.

The fluid exchange sealed entrance assembly 408 and the fluid exchange sealed exhaust assembly 406 work in concert to allow primary dielectric thermally conductive fluid 106, 108 fluid to be exchanged between the sealed enclosure and a pressure balancing system 304, maintaining a sealed enclosure environment. The pressure balancing system 304 is closed loop system that functions to maintain an appropriate fluid presence and pressure at the fluid exchange sealed entrance assembly 408 and the fluid exchange sealed exhaust assembly 406 for one or more sealed enclosures via connecting lines. The pressure balancing system 304 may be located either adjacent to or remote from sealed enclosures. The pressure balancing system 304 is capable of supplying fluid pressure to the inner volume 150 of the sealed enclosure using the fluid exchange sealed entrance assembly 408 via connecting lines. The fluid exchange sealed entrance assembly 408 may be configured with a pressure relief valve assembly that allows fluid pressure to be released from the pressure balancing system 304 into the inner volume 150 of the sealed enclosure when the fluid pressure in the inner volume 150 of the sealed enclosure falls below a specified value thereby raising the fluid pressure in the inner volume 150 of the sealed enclosure. The fluid exchange sealed entrance assembly 408 may be optionally configured with a pressure regulator allowing the pressure balancing system 304 to distribute a high fluid pressure to said pressure regulator which reduces the fluid pressure to appropriate fluid pressure level for proper pressure relief valve operation. The fluid exchange sealed entrance assembly 408 may be located either inside or outside the sealed enclosure. The pressure balancing system 304 is capable of removing fluid pressure from the inner volume 150 of the sealed enclosure using the fluid exchange sealed exhaust assembly 406 via connecting lines. The fluid exchange sealed exhaust assembly 406 may be configured with a pressure relief valve assembly that allows fluid pressure to be released from inner volume 150 of the sealed enclosure into the fluid pressure collection functionality of the pressure balancing system 304 when the fluid pressure in the inner volume 150 of the sealed enclosure rises above a specified value thereby lowering the fluid pressure in the inner volume 150 of the sealed enclosure. The fluid exchange sealed exhaust assembly 406 may be located either inside or outside the sealed enclosure.

An extended surface configuration of the fluid exchange sealed exhaust assembly 406 may be positioned either inside or outside of the sealed enclosure and is comprised of thermally conductive materials configured an extended surface area to effect supplement heat removal from the primary dielectric thermally conductive fluid 106, 108 that is transported through the fluid exchange sealed exhaust assembly 406. Such extended surface configuration of the fluid exchange sealed exhaust assembly 406 is cooled by the secondary thermally conductive fluid 120 that is returned from the secondary fluid heat exchanger 130 via connecting line 134 and flows over the extended surface configuration of the fluid exchange sealed exhaust assembly 406. The flow of cooled secondary thermally conductive fluid 120 over the extended surface configuration of the fluid exchange sealed exhaust assembly 406 serves to remove heat from the primary dielectric thermally conductive fluid 106, 108 that is transported through the fluid exchange sealed exhaust assembly 406. This extended surface configuration of the fluid exchange sealed exhaust assembly 406 may be utilized to condense multi-phase primary dielectric thermally conductive fluid from the gaseous phase 108 back into the liquid phase 106, with the result of returning such multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure.

One or more optional heat exchange mechanisms 135 may be disposed within the inner volume 150 such that a secondary single phase or multi-phase thermally conductive fluid 120 is segregated from the primary dielectric thermally conductive fluid 106, 108 and may be circulated through heat exchange mechanism 135 to an external local or remote heat exchanger assembly 130 via connecting lines 132, 134. One or more optional heat exchange mechanisms 145 may be disposed within the inner volume 150 such that a secondary single phase or multi-phase thermally conductive fluid 148 is segregated from the primary dielectric thermally conductive fluid 106, 108 and may be circulated through heat exchange mechanism 145 to an external local or remote heat exchanger assembly 140 via connecting lines 142, 144. Heat exchange mechanisms 135, 145 are disposed within the primary dielectric thermally conductive fluid liquid phase 106 and/or the gaseous phase 108 as heat exchange mechanisms comprising concentric tube, shell and tube, plate, fin, plate-fin, tube-fin, condenser tubing, loops, and split-flow loops. Heat exchange mechanisms 135, 145 may be thermally and/or mechanically attached or isolated from the inner enclosure wall 101. Heat exchange mechanisms 135, 145 may be thermally and/or mechanically connected to portions of the enclosed electronic devices 104.

An optional mechanism may be additionally configured in the inner volume 150 of the sealed enclosure in order to effect the circulation of the primary dielectric thermally conductive fluid 106 by using fluid pressure to supply the motive force for optional kinetic processes that comprise a) fluid circulation by means of a fluid pressure driven pump 502, b) fluid circulation by means of a bubbler 506, c) fluid circulation by means of both a fluid pressure driven pump 502 and a bubbler 506, or d) other fluid circulation mechanisms. These optional motive force mechanisms are driven by pressured fluid supplied by a) pressurized gaseous fluid storage 604, and/or b) the pressure balancing system 304 to the motive force sealed entrance assembly 504 via connecting lines. The motive force sealed entrance assembly 504 may be optionally configured with a pressure regulator allowing the motive force fluid pressure source to supply a high pressure fluid to said pressure regulator which reduces the fluid pressure to appropriate fluid pressure level for the proper operation of the fluid pressure driven kinetic processes. The motive force sealed entrance assembly 504 may be configured with a pressure control valve assembly that allows fluid pressure from the motive force fluid pressure source to be turned on or off, thereby supplying fluid pressure from the motive force fluid pressure source to kinetic processes such as the fluid pressure driven pump 502 and/or the bubbler 506 for the purpose of a) circulating the primary dielectric thermally conductive fluid 106 in order to more effectively transfer thermal energy from the enclosed electronic devices 104 to the primary dielectric thermally conductive fluid 106 and the inner enclosure wall 101, and b) to circulate the primary dielectric thermally conductive fluid 106 through at least one filter to trap impurities and particulates. Fluid pressure supplied by the motive force fluid pressure source into the inner volume 150 of the sealed enclosure via the exhaust of the fluid pressure driven pump 502 and/or the bubbler 506 is managed by the designated pressure balancing system. Embodiments that circulate the primary dielectric thermally conductive fluid 106 via a pumping action are comprised of a fluid pressure driven pump 502 connected to the motive force sealed entrance assembly 504, a pump intake 312, and a pump discharge 314. Embodiments that circulate the primary dielectric thermally conductive fluid 106 via a bubbling action are comprised of a bubbler 506 connected to the motive force sealed entrance assembly 504, and a bubbler connecting line 508, said bubbler 506 located in the lower part of the inner volume 150 of the sealed enclosure and comprising a mechanical means of releasing a pressured fluid in a predominately gaseous phase via a number of bubbler pores of various sizes. If the bubbler 506 and the fluid pressure driven pump 502 are both configured in an embodiment, the fluid pressure utilized to drive the bubbler 506 is supplied by the discharge fluid pressure of the fluid pressure driven pump 502 via connection lines 508. The motive force sealed entrance assembly 504 may be located either inside or outside the sealed enclosure.

Figure 8:
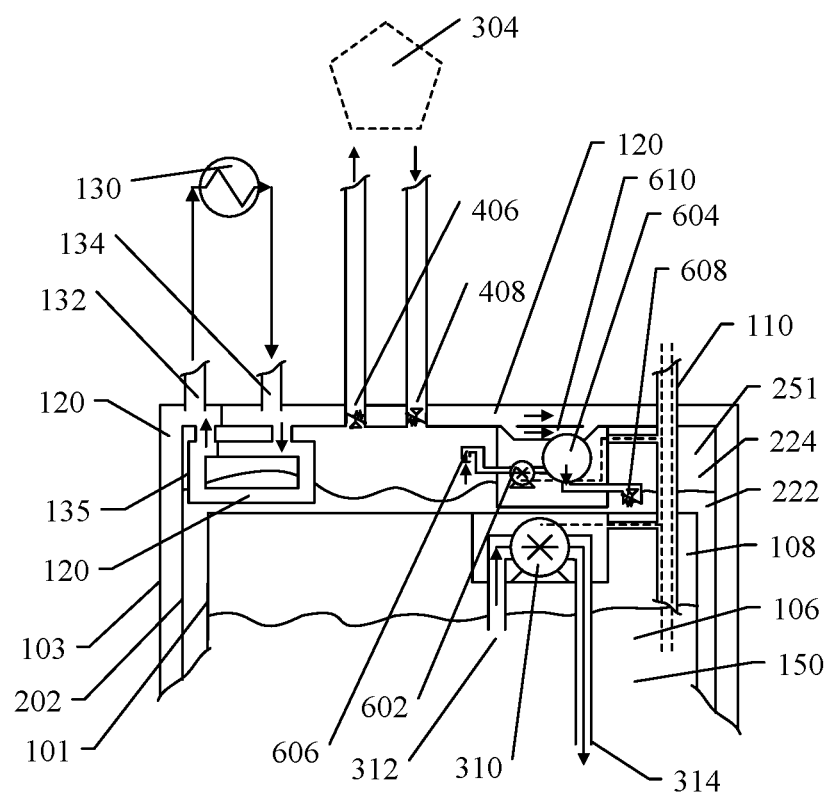
FIG. 8 shows a conceptual view of a dual port pressure balancing mechanism and/or a pressure balancing mechanism used to relieve positive and negative pressures in the intermediate wall of a sealed enclosure and optional primary dielectric thermally conductive fluid pump circulation mechanisms according to an embodiment of the disclosed subject matter.

FIG. 8 shows a conceptual view of a dual port pressure balancing mechanism and/or a pressure balancing mechanism used to relieve positive and negative pressures in the intermediate wall of a sealed enclosure, optional heat exchange mechanisms, and optional primary dielectric thermally conductive fluid pump circulation mechanisms. The sealed enclosure shown in the figure is typical of the disclosure described in FIG. 2 and is illustrated by showing only a portion of such sealed enclosure as a figure with an inner enclosure wall 101, intermediate enclosure wall 202, and an outer enclosure wall 103, wherein the inner volume 150 contains the primary dielectric thermally conductive fluid 106, 108 that either completely or partially fills the inner volume 150 of the sealed enclosure and wherein the intermediate volume 251 contains the secondary intermediate thermally conductive fluid 222, 224 that either completely or partially fills the intermediate volume 251 of the sealed enclosure. The optional heat exchange circuit comprised of heat exchange assembly 140, fluid-tight piping connection 142, 144, heat exchange mechanism 145, and secondary thermally conductive fluid 148 as disclosed in FIG. 2 are not shown in this conceptual view but may be included herein as an additional and/or alternative means of heat removal. This embodiment is illustrated to disclosure various aspects of embodiments of pressure balancing, fluid management, and fluid circulation mechanisms configured for multiple wall sealed enclosures as shown in FIG. 2. One skilled in the art, using this disclosure, could develop additional embodiments applying the disclosures in FIGS. 3, 4, 5, 6, 7 to sealed enclosures as described in FIG. 2.

Pressure equalization of the intermediate volume 251 of the sealed enclosure as well as optional fluid management is provided by a) an optional one or more first mechanisms disclosed as a pressure balancing mechanism that may include, but are not limited to a gaseous fluid compressor 602, pressurized gaseous fluid storage 604, gaseous fluid entrance assembly 606, gaseous and condensed fluid exhaust assembly 608, and associated connecting lines, valves, sensors, controls, wiring, power, enclosures, and regulators, or b) an optional second mechanism comprised of fluid exchange sealed entrance assembly 408, fluid exchange sealed exhaust assembly 406, a pressure balancing system 304, and associated connecting lines, valves, sensors, controls, wiring, power, enclosures, and regulators such that if said first mechanisms and said second mechanism are present in an embodiment, one of the said mechanisms may be designated as the primary functional mechanism while the remaining said mechanisms are designated as secondary functional mechanisms, or all of the said mechanisms may be designated as the primary functional mechanisms. The gaseous fluid compressor 602, pressurized gaseous fluid storage 604, gaseous fluid entrance assembly 606, gaseous and condensed fluid exhaust assembly 608, and/or fluid exchange sealed entrance assembly 408, fluid exchange sealed exhaust assembly 406, and pressure balancing system 304 may be configured to function with any secondary thermally conductive fluid, but is used advantageously in the embodiments that contain a) secondary intermediate single phase thermally conductive fluid 222 in the liquid phase, said fluid filling less than the entirety of intermediate volume 251 with the remaining volume filled by at least one separate and distinct fluid in the gaseous phase 224, b) secondary intermediate single phase thermally conductive fluid 222 in the gaseous phase, said fluid filling the entirety of intermediate volume 251, or c) secondary intermediate multi-phase phase thermally conductive fluid 222, said fluid at least partially filling the entirety of intermediate volume 251 with portions of said fluid existing in the liquid phase 222 and portions of said fluid existing in the gaseous phase 224 in varying proportions relative to the temperature, pressure, and composition of said secondary intermediate multi-phase phase thermally conductive fluid 222 and if said secondary intermediate multi-phase phase thermally conductive fluid 222 fills less than the entirety of intermediate volume 251, the remaining volume may be filled by at least one separate and distinct fluid in the gaseous phase 224.

The gaseous fluid compressor 602, pressurized gaseous fluid storage 604, gaseous fluid entrance assembly 606, and/or gaseous and condensed fluid exhaust assembly 608 work in concert to allow gaseous fluid that is present in the intermediate volume 251 of the sealed enclosure to be compressed and stored for release back into the intermediate volume 251 of the sealed enclosure as necessary to maintain a specified range of fluid pressure within the intermediate volume 251 of the sealed enclosure. The gaseous fluid entrance assembly 606 may comprise a a) check valve that allows only fluid in the gaseous phase to flow into the intake of the gaseous fluid compressor 602, or b) a pressure relief valve that allows pressure to be a specified amount greater in intermediate volume 251 than the pressure in the intake of the gaseous fluid compressor 602. When the fluid pressure in the intermediate volume 251 of the sealed enclosure rises above a specified value, the gaseous fluid compressor 602 is activated and gaseous fluid 224 flows through the gaseous fluid entrance assembly 606 into the intake of the gaseous fluid compressor 602 where such gaseous fluid is compressed by the gaseous fluid compressor 602 and stored in pressurized gaseous fluid storage 604 thereby lowering the fluid pressure in the intermediate volume 251 of the sealed enclosure.

The pressurized gaseous fluid storage 604 may be comprised of thermally conductive materials configured to effect supplemental heat removal from the compressed gaseous fluid 108 by configurations comprising construction methodology or optional heat exchanger 610. In embodiments with multi-phase thermally conductive fluid, as heat is removed from the multi-phase thermally conductive fluid 224 disposed inside the pressurized gaseous fluid storage 604, at least a portion of the multi-phase thermally conductive fluid 224 in the gaseous phase condenses to liquid phase 222 and flows as a liquid to the lower part of pressurized gaseous fluid storage 604 thereby functioning as a compressor by reducing the pressure inside the pressurized gaseous fluid storage 604 as an effect of said phase change of the multi-phase thermally conductive fluid from the gaseous phase 224 to the liquid phase 222.

The gaseous and condensed fluid exhaust assembly 608 is comprised of at least one of a pressure regulator or a pressure relief valve as to allow fluid 222, 224 in gaseous and/or liquid phase that is disposed in the pressurized gaseous fluid storage 604 to be discharged into the intermediate volume 251 when conditions exist such as a) a specific command to act is issued by control systems, b) pressure in intermediate volume 251 falls below a specified value, c) a sensor internal to the pressurized gaseous fluid storage 604 detects a liquid condensation level above specified value, d) a required operation prior to the operation of the gaseous fluid compressor 602, e) after powering up or before powering down the system of electronic devices 104, or f) other conditions as required by safety or operational status with said discharge action continuing until such time as a) a sensor internal to the pressurized gaseous fluid storage 604 detects a liquid condensation level below specified value, b) pressure in the intermediate volume 251 rise above a specified value, or c) other conditions as required by safety or operational status.

An optional heat exchanger 610 comprising a concentric tube, shell and tube, plate, fin, plate-fin, or tube-fin heat exchanger removes heat from pressurized gaseous fluid storage 604. The pressurized gaseous fluid storage 604 may be comprised of thermally conductive materials configured to effect supplemental heat removal from the fluid 108 that is disposed internally to the pressurized gaseous fluid storage 604. The heat exchanger 610 may be positioned partially or completely inside or outside of the sealed enclosure. The pressurized gaseous fluid storage 604 is cooled by the secondary thermally conductive fluid 120 that is returned from the secondary fluid heat exchanger 130 via connecting line 134 and flows through the heat exchanger 610. In another embodiment the pressurized gaseous fluid storage 604 is cooled by the secondary thermally conductive fluid 148 that is returned from the secondary fluid heat exchanger 140 via connecting line 144 and flows through the heat exchanger 610. In embodiments with multi-phase thermally conductive fluid, the cooled pressurized gaseous fluid storage 604 serves to remove heat from the multi-phase thermally conductive fluid 224 that is confined in the pressurized gaseous fluid storage 604 which may further serve to condense multi-phase thermally conductive fluid from the gaseous phase 224 into the liquid phase 222 of said fluid, thereby functioning as a compressor by reducing the pressure inside the pressurized gaseous fluid storage 604 as an effect of said phase change of the multi-phase thermally conductive fluid from the gaseous phase 224 to the liquid phase 222. The optional heat exchanger 610 or other heat exchanger comprising a concentric tube, shell and tube, plate, fin, plate-fin, or tube-fin heat exchanger may be extended and further configured to directly or indirectly remove heat from sources such as electronic devices, batteries, motors, valves, fluid lines, or pumps.

The fluid exchange sealed entrance assembly 408 and the fluid exchange sealed exhaust assembly 406 work in concert to allow secondary intermediate thermally conductive fluid 222, 224 fluid to be exchanged between the sealed enclosure and a pressure balancing system 304, maintaining a sealed enclosure environment. The pressure balancing system 304 is closed loop system that functions to maintain an appropriate fluid presence and pressure at the fluid exchange sealed entrance assembly 408 and the fluid exchange sealed exhaust assembly 406 for one or more sealed enclosures via connecting lines. The pressure balancing system 304 may be located either adjacent to or remote from sealed enclosures. The pressure balancing system 304 is capable of supplying fluid pressure to the intermediate volume 251 of the sealed enclosure using the fluid exchange sealed entrance assembly 408 via connecting lines. The fluid exchange sealed entrance assembly 408 may be configured with a pressure relief valve assembly that allows fluid pressure to be released from the pressure balancing system 304 into the intermediate volume 251 of the sealed enclosure when the fluid pressure in the intermediate volume 251 of the sealed enclosure falls below a specified value thereby raising the fluid pressure in the intermediate volume 251 of the sealed enclosure. The fluid exchange sealed entrance assembly 408 may be optionally configured with a pressure regulator allowing the pressure balancing system 304 to distribute a high fluid pressure to said pressure regulator which reduces the fluid pressure to appropriate fluid pressure level for proper pressure relief valve operation. The fluid exchange sealed entrance assembly 408 may be located either inside or outside the sealed enclosure.

The pressure balancing system 304 is capable of removing fluid pressure from the intermediate volume 251 of the sealed enclosure using the fluid exchange sealed exhaust assembly 406 via connecting lines. The fluid exchange sealed exhaust assembly 406 may be configured with a pressure relief valve assembly that allows fluid pressure to be released from intermediate volume 251 of the sealed enclosure into the fluid pressure collection functionality of the pressure balancing system 304 when the fluid pressure in the intermediate volume 251 of the sealed enclosure rises above a specified value thereby lowering the fluid pressure in the intermediate volume 251 of the sealed enclosure. The fluid exchange sealed exhaust assembly 406 may be located either inside or outside the sealed enclosure.

An extended surface configuration of the fluid exchange sealed exhaust assembly 406 may be positioned either inside or outside of the sealed enclosure and is comprised of thermally conductive materials configured an extended surface area to effect supplement heat removal from the secondary intermediate thermally conductive fluid 222, 224 that is transported through the fluid exchange sealed exhaust assembly 406. Such extended surface configuration of the fluid exchange sealed exhaust assembly 406 is cooled by the secondary thermally conductive fluid 120 that is returned from the secondary fluid heat exchanger 130 via connecting line 134 and flows over the extended surface configuration of the fluid exchange sealed exhaust assembly 406. The flow of cooled secondary thermally conductive fluid 120 over the extended surface configuration of the fluid exchange sealed exhaust assembly 406 serves to remove heat from the secondary thermally conductive fluid 222, 224 that is transported through the fluid exchange sealed exhaust assembly 406. This extended surface configuration of the fluid exchange sealed exhaust assembly 406 may be utilized to condense multi-phase primary dielectric thermally conductive fluid from the gaseous phase 224 back into the liquid phase 222, with the result of returning such secondary intermediate thermally conductive fluid 222 in the liquid phase back into the sealed enclosure by gravity flow or other mechanical means in order to maintain a proper amount of secondary intermediate thermally conductive fluid 222 within the sealed enclosure.

One or more optional heat exchange mechanisms 135 may be disposed within the intermediate volume 251 such that a secondary single phase or multi-phase thermally conductive fluid 120 is segregated from the secondary thermally conductive fluid 222, 224 and may be circulated through heat exchange mechanism 135 to an external local or remote heat exchanger assembly 130 via connecting lines 132, 134. Heat exchange mechanisms 135 are disposed within the secondary thermally conductive fluid liquid phase 222 and/or the gaseous phase 224 as heat exchange mechanisms comprising concentric tube, shell and tube, plate, fin, plate-fin, tube-fin, condenser tubing, loops, and split-flow loops. Heat exchange mechanisms 135 may be thermally and/or mechanically attached or isolated from the enclosure wall 101, 202.

One or more optional heat exchange mechanisms 145 may be disposed within the inner volume 150 such that a secondary single phase or multi-phase thermally conductive fluid 148 is segregated from the primary dielectric thermally conductive fluid 106, 108 and may be circulated through heat exchange mechanism 145 to an external local or remote heat exchanger assembly 140 via connecting lines 142, 144. Heat exchange mechanism 145 is disposed within the primary dielectric thermally conductive fluid liquid phase 106 and/or the gaseous phase 108 as heat exchange mechanisms comprising concentric tube, shell and tube, plate, fin, plate-fin, tube-fin, condenser tubing, loops, and split-flow loops. Heat exchange mechanism 145 may be thermally and/or mechanically attached or isolated from the inner enclosure wall 101. Heat exchange mechanism 145 may be thermally and/or mechanically connected to portions of the enclosed electronic devices 104.

Heat exchange, control, pressure balancing, fluid maintenance, and/or fluid circulation functionality of the inner volume 150 of the sealed enclosure may be provided for by applying any of the disclosures in FIGS. 3, 4, 5, 6, 7 to inner volume 150 of the sealed enclosure.

Optional mechanisms may be additionally configured in the inner volume 150 of the sealed enclosure in order to effect the circulation of the primary dielectric thermally conductive fluid 106 for the purpose of a) circulating the primary dielectric thermally conductive fluid 106 in order to more effectively transfer thermal energy from the enclosed electronic devices 104 to the primary dielectric thermally conductive fluid 106 and the inner enclosure wall 101, and b) to circulate the primary dielectric thermally conductive fluid 106 through at least one filter to trap impurities and particulates, embodiments of such mechanisms comprise a) a mechanism comprised of a fluid pump 310, a pump intake 312, and a pump discharge 314, or b) a mechanism comprised of an impeller, fan, turbine, or propeller that rotates under motive force.

Figure 9:
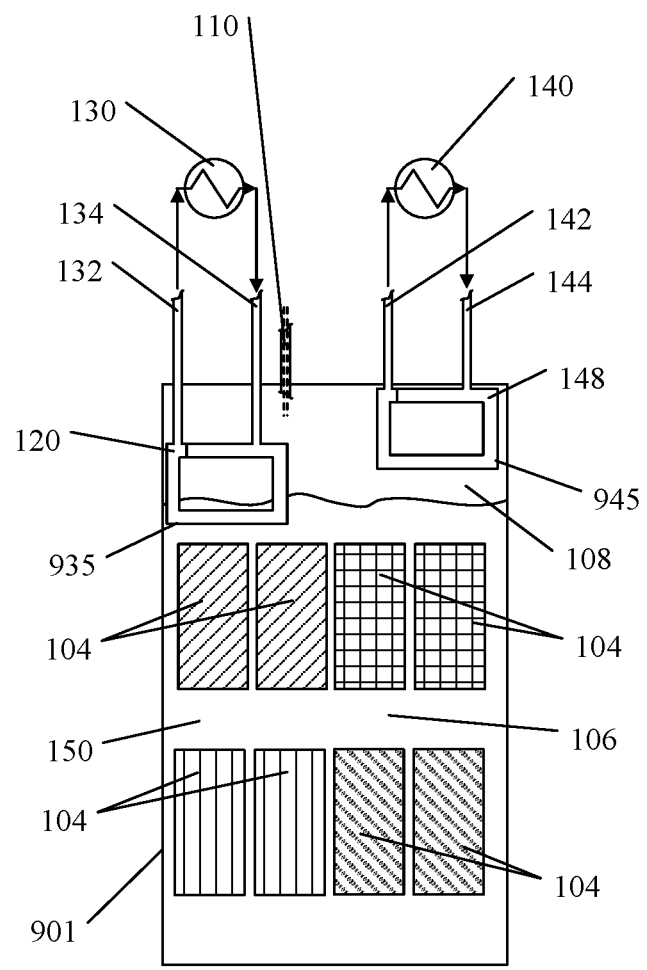
FIG. 9 shows a conceptual view of a sealed enclosure design comprising enclosure walls that enclose electronic devices, a primary dielectric thermally conductive fluid, and an optional heat exchange mechanism in the inner volume that contains a secondary thermally conductive fluid according to an embodiment of the disclosed subject matter.

FIG. 9 shows a conceptual view of a sealed enclosure design comprising an enclosure wall 901 that enclose electronic devices 104 and a primary dielectric thermally conductive fluid 106, 108 in the inner volume 150 and optional heat exchange mechanisms 935, 945 in the inner volume 150 that contain a secondary thermally conductive fluid 120, 148. The inner volume 150 contains a single phase or multi-phase primary dielectric thermally conductive fluid 106, 108 in which electronic devices 104 to be cooled are immersed or surrounded. The single phase or multi-phase primary dielectric thermally conductive fluid 106, 108 may be in a predominately liquid phase, gaseous phase, or in a combination liquid phase and gaseous phase. In an embodiment that comprises a single phase primary dielectric thermally conductive fluid 106 in the gaseous phase, said fluid will fill the entirety of inner volume 150. In an embodiment that comprises a single phase primary dielectric thermally conductive fluid 106 in the liquid phase, said fluid may fill the entirety of inner volume 150 or may fill less than the entirety of inner volume 150 with the remaining volume filled by at least one separate and distinct fluid in the gaseous phase 108. In an embodiment that comprises a multi-phase primary dielectric thermally conductive fluid 106, said fluid may fill the entirety of inner volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106 and if said multi-phase primary dielectric thermally conductive fluid 106, 108 fills less than the entirety of inner volume 150, the remaining volume may be filled by at least one separate and distinct fluid in the gaseous phase 108.

Embodiments of the disclosed sealed enclosure may be configured with single phase or multi-phase thermally conductive fluids. A single phase thermally conductive fluid will transfer heat using the principles of convection and conduction. A multi-phase thermally conductive fluid will transfer heat using the principles of convection, conduction, and phase change. As the multi-phase thermally conductive fluid in the liquid phase absorbs heat, a portion of said fluid is converted to the gaseous phase. Conversely, as the multi-phase thermally conductive fluid in the gaseous phase gives up heat by various heat exchange processes, a portion of said multi-phase thermally conductive fluid in the gaseous phase condenses back into multi-phase thermally conductive fluid in the liquid phase. If the amount of fluid in the gaseous phase 108 exceeds the volume of space internal to the sealed enclosure that is unoccupied by the multi-phase thermally conductive fluid in the liquid phase 106, said fluid in the gaseous phase 108 will exert a positive pressure inside the inner volume 150 of the sealed enclosure. Conversely, if the amount of fluid in the gaseous phase 108 is less than the volume of space internal to the sealed enclosure that is unoccupied by the multi-phase thermally conductive fluid in the liquid phase 106, said fluid in the gaseous phase 108 will exert a negative pressure inside the inner volume 150 of the sealed enclosure. In addition, some amount of multi-phase thermally conductive fluid in the gaseous phase 108 and optional other distinct and suitable compressible gaseous fluid may exist in a space of the sealed enclosure for various purposes comprising cushioning positive and negative pressures in the sealed enclosure, maintaining a headspace in a specified range of pressure as temperature varies, displacing thermally conductive fluid to allow weight adjustments to the overall sealed enclosure, and/or allowing accumulation of gaseous fluid used to drive internal kinetic processes or gaseous based mixing functionality. A single phase thermally conductive fluid may either completely or partially fill a space of the sealed enclosure and any space in the sealed enclosure that is not filled by said single phase thermally conductive fluid may be filled with a distinct and suitable compressible gaseous fluid for various purposes comprising cushioning positive and negative pressures in the sealed enclosure, maintaining a headspace in a specified range of pressure as temperature varies, displacing thermally conductive fluid to allow weight adjustments to the overall sealed enclosure, and/or allowing accumulation of gaseous fluid used to drive internal kinetic processes or gaseous based mixing functionality.

Electronic devices 104 may be disposed within the inner volume 150 of the sealed enclosure in a variety of configurations to facilitate thermal transfer and best practice process efficiency. The enclosed electronic devices 104 dissipate internally generated heat into the inner volume 150, the primary dielectric thermally conductive fluid 106, and the enclosure walls 901 of the sealed enclosure. One or more optional heat exchange mechanisms 935 may be disposed within the inner volume 150 such that a secondary single phase or multi-phase thermally conductive fluid 120 is segregated from the primary dielectric thermally conductive fluid 106, 108 and may be circulated through heat exchange mechanism 935 to an external local or remote heat exchanger assembly 130 via connecting lines 132, 134. One or more optional heat exchange mechanisms 945 may be disposed within the inner volume 150 such that a secondary single phase or multi-phase thermally conductive fluid 148 is segregated from the primary dielectric thermally conductive fluid 106, 108 and may be circulated through heat exchange mechanism 945 to an external local or remote heat exchanger assembly 140 via connecting lines 142, 144.

Heat exchange mechanisms 935, 945 may be disposed within the primary dielectric thermally conductive fluid liquid phase 106 and/or the gaseous phase 108 as heat exchange mechanisms comprising concentric tube, shell and tube, plate, fin, plate-fin, tube-fin, condenser tubing, loops, and split-flow loops. Heat exchange mechanisms 935, 945 may be thermally and/or mechanically attached or isolated from enclosure walls 901. Heat exchange mechanisms 935, 945 may be thermally and/or mechanically connected to portions of the enclosed electronic devices 104.

The secondary single phase or multi-phase thermally conductive fluid 120, 148 may be in a predominately liquid phase, gaseous phase, or in a combination liquid phase and gaseous phase. The secondary thermally conductive fluid 120 is circulated away from the sealed enclosure via a fluid-tight piping connection 132, is presented to one or more heat exchanger assemblies 130 for the purpose of removing heat from the fluid, and returned to the sealed enclosure via a fluid-tight piping connection 134. The secondary thermally conductive fluid 120: a) is circulated within a heat exchanger mechanism 935 disposed in inner volume 150 where internal heat is absorbed from within inner volume 150; b) is removed from a heat exchange mechanism 935 and circulated through a heat exchange assembly 130 where a portion of the heat is removed from the thermally conductive fluid 120; and c) is returned to a heat exchange mechanism 935. The secondary thermally conductive fluid 120 is circulated in such a fashion as to provide appropriate heat removal from the sealed enclosure and heat exchange may be accomplished by a variety of means to one or more external heat sink systems 130 that may be of various types including ventilation, compression, evaporation, and geothermal systems. The heat exchange system 130 may reject heat directly into the immediate environment via passive or forced circulation, or the fluid may be circulated away from the sealed enclosure, cooled in a remote location, and then re-circulated back to the sealed enclosure at a lower temperature.

The secondary thermally conductive fluid 148: a) is circulated within a heat exchanger mechanism 945 disposed in inner volume 150 where internal heat is absorbed from within inner volume 150; b) is removed from a heat exchange mechanism 945 and circulated through a heat exchange assembly 140 where a portion of the heat is removed from the thermally conductive fluid 148; and c) is returned to a heat exchange mechanism 945. The secondary thermally conductive fluid 148 is circulated in such a fashion as to provide appropriate heat removal from the sealed enclosure and heat exchange may be accomplished by a variety of means to one or more external heat sink systems 140 that may be of various types including ventilation, compression, evaporation, and geothermal systems. The heat exchange system 140 may reject heat directly into the immediate environment via passive or forced circulation, or the fluid may be circulated away from the sealed enclosure, cooled in a remote location, and then re-circulated back to the sealed enclosure at a lower temperature. The enclosure wall 901 may thermally conductive to function as a heat exchanger or thermally insulating.

The enclosure walls 901 may be thermally connected by mechanical connection or other means. Portions of the enclosure walls 901 may be optionally bonded to additional materials that facilitate enhanced thermal conduction or thermal insulation of the enclosure walls 901. The outer surface of enclosure walls 901 may reject heat into objects and the environment that surround the sealed enclosure. Cooling fins may be affixed to the wall surfaces 901 to aid in heat transport and dissipation. Wall surfaces 901 may have surface features of various dimensionality to aid in heat transport and dissipation. The sealed enclosure has fluid-tight entrances 110 from the outer surface to the inner volume 150 for power, networking, and other control and monitoring signals and functions which are appropriately connected to one or more electronic or other functional devices disposed in the inner volume 150 of the sealed enclosure.

The optional heat exchange circuit comprised of heat exchange assembly 130, fluid-tight piping connection 132, 134, heat exchange mechanism 935, and secondary thermally conductive fluid 120 is separate and distinct from the optional heat exchange circuit comprised of heat exchange assembly 140, fluid-tight piping connection 142, 144, heat exchange mechanism 945, and secondary thermally conductive fluid 148. Each heat exchange circuit is configured to effect heat removal from the inner volume 150 by using predetermined optimal loop operating temperatures and conditions. Each heat exchange circuit is configured with a heat exchange mechanism 935, 945 that is configured to provide redundant, tiered, primary, and/or secondary heat removal from the inner volume 150.

The sealed enclosure may optionally comprise heat exchange, control, pressure balancing, fluid maintenance, and/or fluid circulation functionality as described in FIGS. 10, 11, 12, 13, 14. Embodiment variations and details described herein apply equally to sealed enclosures with or without an interior 108 fluid head space. The sealed enclosure may optionally comprise one or more channels disposed in the inner volume 150 as described in FIGS. 15, 16. The sealed enclosure may optionally comprise one or more spacers disposed in the inner volume 150 of the sealed enclosure as described in FIG. 17A, 17B. The sealed enclosure may optionally comprise one or more mechanisms in the inner volume 150 to render the electronic devices and any content stored on those devices to be inoperable, unusable, or unreadable as described in FIG. 18.

The sealed enclosure may be located either adjacent to or remote from any heat exchange assemblies 130, 140 and/or pressure balancing systems and appropriate fluid transport channels between said locations are configured based optimal fluid flow and thermodynamic designs for the selected fluids. Further, any heat exchange assemblies 130, 140 and/or pressure balancing systems may perform their indicated functions for one or more sealed enclosures.

Sealed enclosures can be installed in any orientation, placed as standalone units or stacked or grouped together to form a structural unit of any dimensionality in a high-density configuration. An enclosure group may be disposed within a sealed or unsealed enclosure and may contain pressure balancing systems that are interior to such enclosure and exterior to sealed enclosures such that said pressure balancing systems perform their indicated functions for one or more sealed enclosures. Sealed enclosures within an enclosure group may be configured such that any secondary thermally conductive fluid 120, 148 is conducted through more than one sealed enclosure before the secondary thermally conductive fluid 120, 148 is circulated through a heat exchanger assembly 130, 140 where a portion of the heat is removed from the thermally conductive fluid 120, 148. Sealed enclosures within an enclosure group may be configured such that a pressure balancing system for a sealed enclosure within the enclosure group may be disposed interior to another sealed enclosure within the enclosure group.

Figure 10:
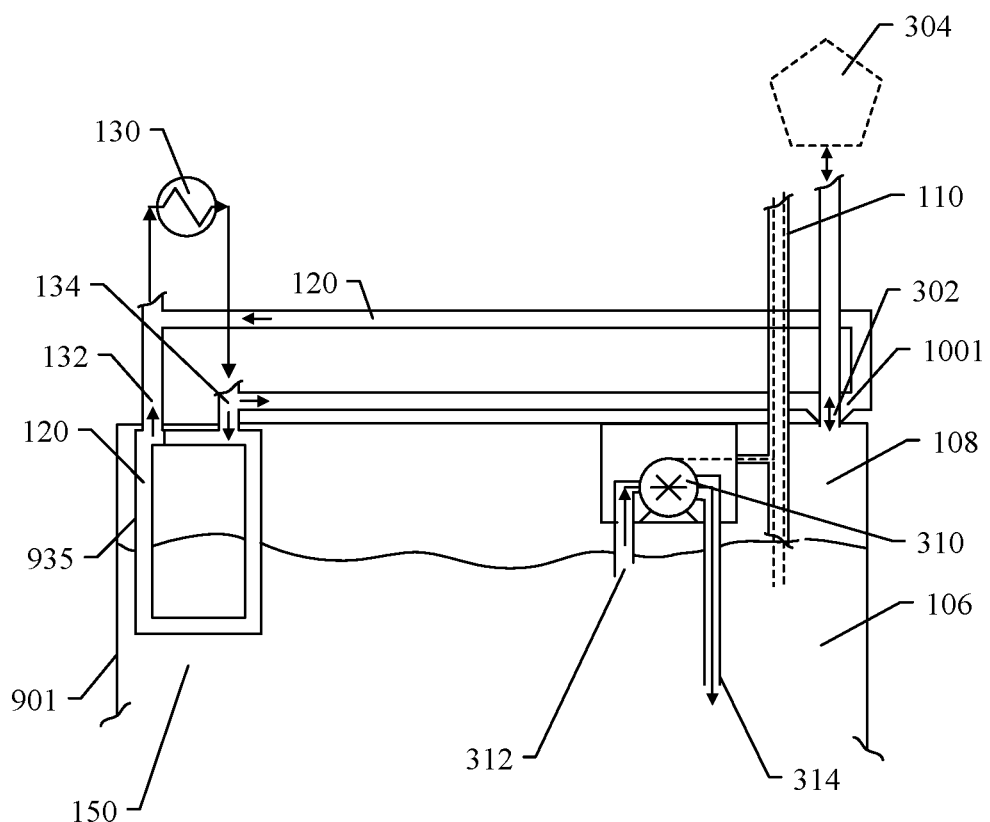
FIG. 10 shows a conceptual view of a single port pressure balancing mechanism used to relieve positive and negative pressures in a sealed enclosure and optional primary dielectric thermally conductive fluid pump circulation mechanisms according to an embodiment of the disclosed subject matter.

FIG. 10 shows a conceptual view of a single port pressure balancing mechanism used to relieve positive and negative pressures in a sealed enclosure and optional primary dielectric thermally conductive fluid pump circulation mechanisms. The sealed enclosure shown in the figure is typical of the disclosures described in FIG. 9 and is illustrated by showing only a portion of such sealed enclosure as a figure with an enclosure wall 901, wherein the inner volume 150 contains a primary dielectric thermally conductive fluid 106, 108 that either completely or partially fills the interior of the sealed enclosure as shown. The optional heat exchange circuit comprised of heat exchange assembly 140, fluid-tight piping connection 142, 144, heat exchange mechanism 945, and secondary thermally conductive fluid 148 as disclosed in FIG. 9 are not shown in this conceptual view but may be included herein as an additional and/or alternative means of heat removal.

The fluid exchange sealed entrance assembly 302 allows primary dielectric thermally conductive fluid 106, 108 fluid to be exchanged between the sealed enclosure and a pressure balancing system 304, maintaining a sealed enclosure environment and functioning for the purpose of pressure equalization of the inner volume 150 of the sealed enclosure and providing optional fluid management. The fluid exchange sealed entrance assembly 302 and pressure balancing system 304 may be configured to function with any primary dielectric thermally conductive fluid, but is used advantageously in embodiments that contain a) a single phase primary dielectric thermally conductive fluid 106 in the liquid phase, said fluid filling less than the entirety of inner volume 150 with the remaining volume filled by at least one separate and distinct fluid in the gaseous phase 108, b) a single phase thermally conductive fluid 106 in the gaseous phase, said fluid filling the entirety of inner volume 150, or c) a multi-phase primary dielectric thermally conductive fluid 106, said fluid at least partially filling the inner volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106 and if said multi-phase primary dielectric thermally conductive fluid 106, 108 fills less than the entirety of inner volume 150, the remaining volume may be filled by at least one separate and distinct fluid in the gaseous phase 108.

The pressure balancing system 304 is a system that functions to maintain a suitably constant fluid presence and pressure to the fluid exchange sealed entrance assembly 302 for one or more sealed enclosures. The pressure balancing system 304 may be located either adjacent to or remote from sealed enclosures. The pressure balancing system 304 is capable of supplying pressure to or removing pressure from the sealed enclosure using a single fluid exchange sealed entrance assembly 302 via connecting lines.

An optional heat exchanger 1001 may wrap around the fluid exchange sealed entrance assembly 302 positioned either inside or outside of the sealed enclosure in which the fluid exchange sealed entrance assembly 302 includes a heat exchanger comprising a concentric tube, shell and tube, plate, fin, plate-fin, or tube-fin heat exchanger and is configured to effect supplemental heat removal from the primary dielectric thermally conductive fluid 106, 108 that is transported through the fluid exchange sealed entrance assembly 302. Such configuration of the fluid exchange sealed entrance assembly 302 is cooled by the secondary thermally conductive fluid 120 that is returned from the secondary fluid heat exchanger 130 via connecting line 134 and flows through the heat exchanger 1001 and around a portion of the fluid exchange sealed entrance assembly 302. The cooled fluid exchange sealed entrance assembly 302 serves to remove heat from the primary dielectric thermally conductive fluid 106, 108 that is transported through the fluid exchange sealed entrance assembly 302 which may further serve to condense multi-phase primary dielectric thermally conductive fluid from the gaseous phase 108 into the liquid phase 106 of said fluid, with the result of returning the multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure.

Optional mechanisms may be additionally configured in the inner volume 150 of the sealed enclosure in order to effect the circulation of the primary dielectric thermally conductive fluid 106 for the purpose of a) circulating the primary dielectric thermally conductive fluid 106 in order to more effectively transfer thermal energy from the enclosed electronic devices 104 to the primary dielectric thermally conductive fluid 106 and the enclosure wall 901, and b) to circulate the primary dielectric thermally conductive fluid 106 through at least one filter to trap impurities and particulates, embodiments of such mechanisms comprise a) a mechanism comprised of a fluid pump 310, a pump intake 312, and a pump discharge 314, or b) a mechanism comprised of an impeller, fan, turbine, or propeller that rotates under motive force.

Figure 11:
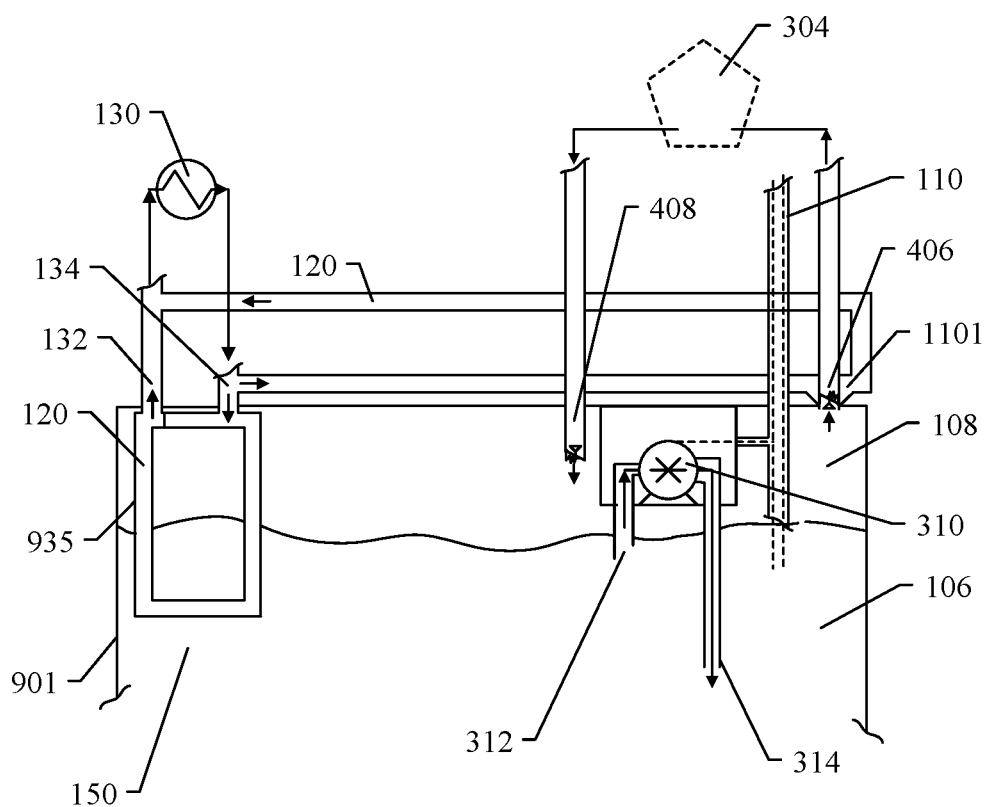
FIG. 11 shows a conceptual view of a dual port pressure balancing mechanism used to relieve positive and negative pressures in a sealed enclosure and optional primary dielectric thermally conductive fluid pump circulation mechanisms according to an embodiment of the disclosed subject matter.

FIG. 11 shows a conceptual view of a dual port pressure balancing mechanism used to relieve positive and negative pressures in a sealed enclosure and optional primary dielectric thermally conductive fluid pump circulation mechanisms. The sealed enclosure shown in the figure is typical of the disclosures described in FIG. 9 and is illustrated by showing only a portion of such sealed enclosure as a figure with an enclosure wall 901, wherein the inner volume 150 contains a primary dielectric thermally conductive fluid 106, 108 that either completely or partially fills the interior of the sealed enclosure as shown. The optional heat exchange circuit comprised of heat exchange assembly 140, fluid-tight piping connection 142, 144, heat exchange mechanism 945, and secondary thermally conductive fluid 148 as disclosed in FIG. 9 are not shown in this conceptual view but may be included herein as an additional and/or alternative means of heat removal.

The fluid exchange sealed entrance assembly 408 and the fluid exchange sealed exhaust assembly 406 work in concert to allow primary dielectric thermally conductive fluid 106, 108 fluid to be exchanged between the sealed enclosure and a pressure balancing system 304, maintaining a sealed enclosure environment and functioning for the purpose of pressure equalization of the inner volume 150 of the sealed enclosure and providing optional fluid management. The fluid exchange sealed entrance assembly 408, the fluid exchange sealed exhaust assembly 406, and the pressure balancing system 304 may be configured to function with any primary dielectric thermally conductive fluid, but is used advantageously in the embodiments that contain a) a single phase primary dielectric thermally conductive fluid 106 in the liquid phase, said fluid filling less than the entirety of inner volume 150 with the remaining volume filled by at least one separate and distinct fluid in the gaseous phase 108, b) a single phase thermally conductive fluid 106 in the gaseous phase, said fluid filling the entirety of inner volume 150, or c) a multi-phase primary dielectric thermally conductive fluid 106, said fluid at least partially filling the inner volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106 and if said multi-phase primary dielectric thermally conductive fluid 106, 108 fills less than the entirety of inner volume 150, the remaining volume may be filled by at least one separate and distinct fluid in the gaseous phase 108.

The pressure balancing system 304 is closed loop system that functions to maintain an appropriate fluid presence and pressure at the fluid exchange sealed entrance assembly 408 and the fluid exchange sealed exhaust assembly 406 for one or more sealed enclosures via connecting lines. The pressure balancing system 304 is capable of supplying fluid pressure to the inner volume 150 of the sealed enclosure using the fluid exchange sealed entrance assembly 408 via connecting lines. The fluid exchange sealed entrance assembly 408 may be configured with a pressure relief valve assembly that allows fluid pressure to be released from the pressure balancing system 304 into the inner volume 150 of the sealed enclosure when the fluid pressure in the inner volume 150 of the sealed enclosure falls below a specified value thereby raising the fluid pressure in the inner volume 150 of the sealed enclosure. The fluid exchange sealed entrance assembly 408 may be optionally configured with a pressure regulator allowing the pressure balancing system 304 to distribute a high fluid pressure to said pressure regulator which reduces the fluid pressure to appropriate fluid pressure level for proper pressure relief valve operation. The fluid exchange sealed entrance assembly 408 may be located either inside or outside the sealed enclosure.

The pressure balancing system 304 is capable of removing fluid pressure from the inner volume 150 of the sealed enclosure using the fluid exchange sealed exhaust assembly 406 via connecting lines. The fluid exchange sealed exhaust assembly 406 may be configured with a pressure relief valve assembly that allows fluid pressure to be released from inner volume 150 of the sealed enclosure into the fluid pressure collection functionality of the pressure balancing system 304 when the fluid pressure in the inner volume 150 of the sealed enclosure rises above a specified value thereby lowering the fluid pressure in the inner volume 150 of the sealed enclosure. The fluid exchange sealed exhaust assembly 406 may be located either inside or outside the sealed enclosure.

An optional heat exchanger 1101 may wrap around the fluid exchange sealed exhaust assembly 406 positioned either inside or outside of the sealed enclosure in which the fluid exchange sealed exhaust assembly 406 includes a heat exchanger comprising a concentric tube, shell and tube, plate, fin, plate-fin, or tube-fin heat exchanger and is configured to effect supplemental heat removal from the primary dielectric thermally conductive fluid 106, 108 that is transported through the fluid exchange sealed exhaust assembly 406. Such configuration of the fluid exchange sealed exhaust assembly 406 is cooled by the secondary thermally conductive fluid 120 that is returned from the secondary fluid heat exchanger 130 via connecting line 134 and flows through the heat exchanger 1101 and around a portion of the fluid exchange sealed exhaust assembly 406. The cooled fluid exchange sealed exhaust assembly 406 serves to remove heat from the primary dielectric thermally conductive fluid 106, 108 that is transported through the fluid exchange sealed exhaust assembly 406 which may further serve to condense multi-phase primary dielectric thermally conductive fluid from the gaseous phase 108 into the liquid phase 106 of said fluid, with the result of returning the multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure.

Optional mechanisms may be additionally configured in the inner volume 150 of the sealed enclosure in order to effect the circulation of the primary dielectric thermally conductive fluid 106 for the purpose of a) circulating the primary dielectric thermally conductive fluid 106 in order to more effectively transfer thermal energy from the enclosed electronic devices 104 to the primary dielectric thermally conductive fluid 106 and the enclosure wall 901, and b) to circulate the primary dielectric thermally conductive fluid 106 through at least one filter to trap impurities and particulates, embodiments of such mechanisms comprise a) a mechanism comprised of a fluid pump 310, a pump intake 312, and a pump discharge 314, or b) a mechanism comprised of an impeller, fan, turbine, or propeller that rotates under motive force.

Figure 12:
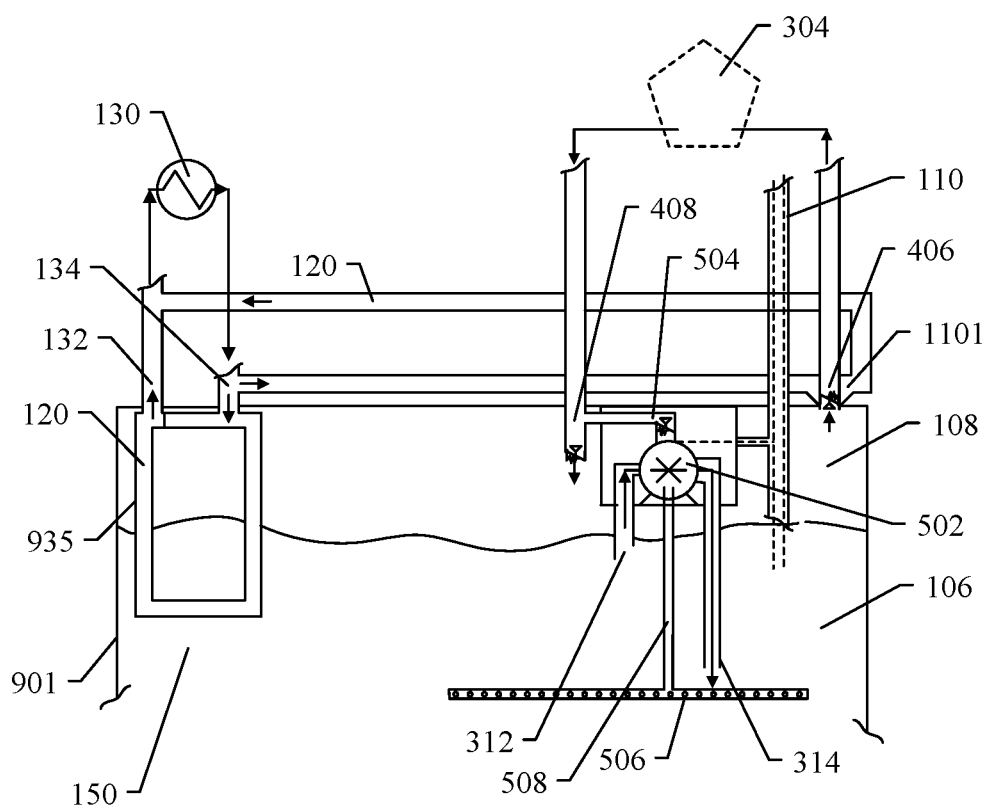
FIG. 12 shows a conceptual view of a dual port pressure balancing mechanism used to relieve positive and negative pressures in a sealed enclosure and optional pressurized gaseous fluid driven primary dielectric thermally conductive fluid pump and bubbler circulation mechanisms according to an embodiment of the disclosed subject matter.

FIG. 12 shows a conceptual view of a dual port pressure balancing mechanism used to relieve positive and negative pressures in a sealed enclosure and optional pressurized gaseous fluid driven primary dielectric thermally conductive fluid pump and bubbler circulation mechanisms. The sealed enclosure shown in the figure is typical of the disclosures described in FIG. 9 and is illustrated by showing only a portion of such sealed enclosure as a figure with an enclosure wall 901, wherein the inner volume 150 contains a primary dielectric thermally conductive fluid 106, 108 that either completely or partially fills the interior of the sealed enclosure as shown. The optional heat exchange circuit comprised of heat exchange assembly 140, fluid-tight piping connection 142, 144, heat exchange mechanism 945, and secondary thermally conductive fluid 148 as disclosed in FIG. 9 are not shown in this conceptual view but may be included herein as an additional and/or alternative means of heat removal.

The fluid exchange sealed entrance assembly 408 and the fluid exchange sealed exhaust assembly 406 work in concert to allow primary dielectric thermally conductive fluid 106, 108 fluid to be exchanged between the sealed enclosure and a pressure balancing system 304, maintaining a sealed enclosure environment and functioning for the purpose of pressure equalization of the inner volume 150 of the sealed enclosure, providing optional fluid management, and providing optional motive force to kinetic processes located in the inner volume 150 of the sealed enclosure. The fluid exchange sealed entrance assembly 408, the fluid exchange sealed exhaust assembly 406, and the pressure balancing system 304 may be configured to function with any primary dielectric thermally conductive fluid, but is used advantageously in the embodiments that contain a) a single phase primary dielectric thermally conductive fluid 106 in the liquid phase, said fluid filling less than the entirety of inner volume 150 with the remaining volume filled by at least one separate and distinct fluid in the gaseous phase 108, b) a single phase thermally conductive fluid 106 in the gaseous phase, said fluid filling the entirety of inner volume 150, or c) a multi-phase primary dielectric thermally conductive fluid 106, said fluid at least partially filling the inner volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106 and if said multi-phase primary dielectric thermally conductive fluid 106, 108 fills less than the entirety of inner volume 150, the remaining volume may be filled by at least one separate and distinct fluid in the gaseous phase 108.

The pressure balancing system 304 is closed loop system that functions to maintain an appropriate fluid presence and pressure at the fluid exchange sealed entrance assembly 408 and the fluid exchange sealed exhaust assembly 406 for one or more sealed enclosures via connecting lines. The pressure balancing system 304 may be located either adjacent to or remote from sealed enclosures. The pressure balancing system 304 is capable of supplying fluid pressure to the inner volume 150 of the sealed enclosure using the fluid exchange sealed entrance assembly 408 via connecting lines. The fluid exchange sealed entrance assembly 408 may be configured with a pressure relief valve assembly that allows fluid pressure to be released from the pressure balancing system 304 into the inner volume 150 of the sealed enclosure when the fluid pressure in the inner volume 150 of the sealed enclosure falls below a specified value thereby raising the fluid pressure in the inner volume 150 of the sealed enclosure. The fluid exchange sealed entrance assembly 408 may be optionally configured with a pressure regulator allowing the pressure balancing system 304 to distribute a high fluid pressure to said pressure regulator which reduces the fluid pressure to appropriate fluid pressure level for proper pressure relief valve operation. The fluid exchange sealed entrance assembly 408 may be located either inside or outside the sealed enclosure.

The pressure balancing system 304 is capable of removing fluid pressure from the inner volume 150 of the sealed enclosure using the fluid exchange sealed exhaust assembly 406 via connecting lines. The fluid exchange sealed exhaust assembly 406 may be configured with a pressure relief valve assembly that allows fluid pressure to be released from inner volume 150 of the sealed enclosure into the fluid pressure collection functionality of the pressure balancing system 304 when the fluid pressure in the inner volume 150 of the sealed enclosure rises above a specified value thereby lowering the fluid pressure in the inner volume 150 of the sealed enclosure. The fluid exchange sealed exhaust assembly 406 may be located either inside or outside the sealed enclosure.

An optional heat exchanger 1101 may wrap around the fluid exchange sealed exhaust assembly 406 positioned either inside or outside of the sealed enclosure in which the fluid exchange sealed exhaust assembly 406 includes a heat exchanger comprising a concentric tube, shell and tube, plate, fin, plate-fin, or tube-fin heat exchanger and is configured to effect supplemental heat removal from the primary dielectric thermally conductive fluid 106, 108 that is transported through the fluid exchange sealed exhaust assembly 406. Such configuration of the fluid exchange sealed exhaust assembly 406 is cooled by the secondary thermally conductive fluid 120 that is returned from the secondary fluid heat exchanger 130 via connecting line 134 and flows through the heat exchanger 1101 and around a portion of the fluid exchange sealed exhaust assembly 406. The cooled fluid exchange sealed exhaust assembly 406 serves to remove heat from the primary dielectric thermally conductive fluid 106, 108 that is transported through the fluid exchange sealed exhaust assembly 406 which may further serve to condense multi-phase primary dielectric thermally conductive fluid from the gaseous phase 108 into the liquid phase 106 of said fluid, with the result of returning the multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure.

An optional mechanism may be additionally configured in the inner volume 150 of the sealed enclosure in order to effect the circulation of the primary dielectric thermally conductive fluid 106 by using fluid pressure to supply the motive force for optional kinetic processes that include a) fluid circulation by means of a fluid pressure driven pump 502, b) fluid circulation by means of a bubbler 506, c) fluid circulation by means of both a fluid pressure driven pump 502 and a bubbler 506, or d) other fluid circulation mechanisms. These optional motive force mechanisms are driven by pressured fluid supplied by the pressure balancing system 304 to the motive force sealed entrance assembly 504 via connecting lines. The motive force sealed entrance assembly 504 may be optionally configured with a pressure regulator allowing the motive force fluid pressure source to supply a high pressure fluid to said pressure regulator which reduces the fluid pressure to appropriate fluid pressure level for the proper operation of the fluid pressure driven kinetic processes. The motive force sealed entrance assembly 504 may be configured with a pressure control valve assembly that allows fluid pressure from the pressure balancing system 304 to be turned on or off, thereby supplying fluid pressure from the pressure balancing system 304 to kinetic processes such as the fluid pressure driven pump 502 and/or the bubbler 506 for the purpose of a) circulating the primary dielectric thermally conductive fluid 106 in order to more effectively transfer thermal energy from the enclosed electronic devices 104 to the primary dielectric thermally conductive fluid 106 and the enclosure wall 901, and b) to circulate the primary dielectric thermally conductive fluid 106 through at least one filter to trap impurities and particulates. Fluid pressure supplied by the pressure balancing system 304 into the inner volume 150 of the sealed enclosure via the exhaust of the fluid pressure driven pump 502 and/or the bubbler 506 is returned to the pressure balancing system 304 through the fluid exchange sealed exhaust assembly 406. Embodiments that circulate the primary dielectric thermally conductive fluid 106 via a pumping action are comprised of a fluid pressure driven pump 502 connected to the motive force sealed entrance assembly 504, a pump intake 312, and a pump discharge 314. Embodiments that circulate the primary dielectric thermally conductive fluid 106 via a bubbling action are comprised of a bubbler 506 connected to the motive force sealed entrance assembly 504, and a bubbler connecting line 508, said bubbler 506 located in the lower part of the inner volume 150 of the sealed enclosure and comprising a mechanical means of releasing a pressured fluid in a predominately gaseous phase via a number of bubbler pores of various sizes. If the bubbler 506 and the fluid pressure driven pump 502 are both configured in an embodiment, the fluid pressure utilized to drive the bubbler 506 is supplied by the discharge fluid pressure of the fluid pressure driven pump 502 via connection lines 508. The motive force sealed entrance assembly 504 may be located either inside or outside the sealed enclosure.

Figure 13:
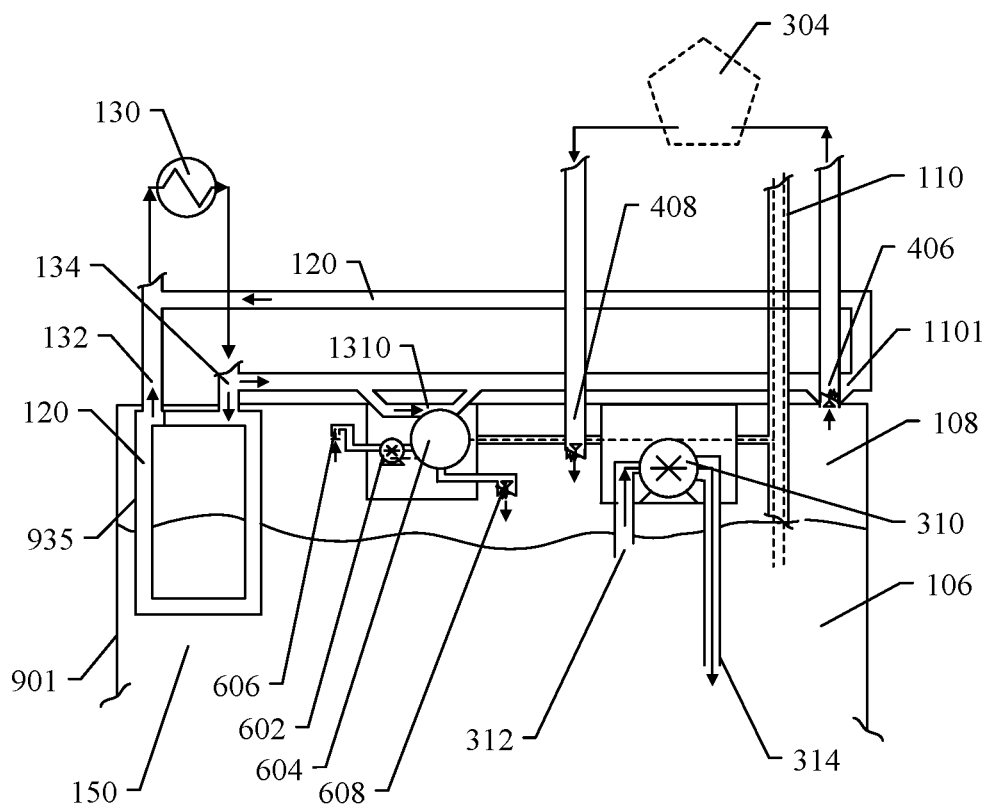
FIG. 13 shows a conceptual view of a pressure balancing mechanism with optional dual port pressure balancing mechanism used to relieve positive and negative pressures in a sealed enclosure and optional primary dielectric thermally conductive fluid pump circulation mechanisms according to an embodiment of the disclosed subject matter.

FIG. 13 shows a conceptual view of a pressure balancing mechanism with optional dual port pressure balancing mechanism used to relieve positive and negative pressures in a sealed enclosure and optional primary dielectric thermally conductive fluid pump circulation mechanisms. The sealed enclosure shown in the figure is typical of the disclosures described in FIG. 9 and is illustrated by showing only a portion of such sealed enclosure as a figure with an enclosure wall 901, wherein the inner volume 150 contains a primary dielectric thermally conductive fluid 106, 108 that either completely or partially fills the interior of the sealed enclosure as shown. The optional heat exchange circuit comprised of heat exchange assembly 140, fluid-tight piping connection 142, 144, heat exchange mechanism 945, and secondary thermally conductive fluid 148 as disclosed in FIG. 9 are not shown in this conceptual view but may be included herein as an additional and/or alternative means of heat removal.

Pressure equalization of the inner volume 150 of the sealed enclosure as well as optional fluid management is provided by a) one or more first mechanisms disclosed as a pressure balancing mechanism that may include, but are not limited to a gaseous fluid compressor 602, pressurized gaseous fluid storage 604, gaseous fluid entrance assembly 606, gaseous and condensed fluid exhaust assembly 608, and associated connecting lines, valves, sensors, controls, wiring, power, enclosures, and regulators, and b) an optional second mechanism comprised of a fluid exchange sealed entrance assembly 408, fluid exchange sealed exhaust assembly 406, pressure balancing system 304, and associated connecting lines, valves, sensors, controls, wiring, power, enclosures, and regulators such that if said first mechanisms and said second mechanism are present in an embodiment, one of the said mechanisms may be designated as the primary functional mechanism while the remaining said mechanisms are designated as secondary functional mechanisms, or all of the said mechanisms may be designated as the primary functional mechanisms. The gaseous fluid compressor 602, pressurized gaseous fluid storage 604, gaseous fluid entrance assembly 606, gaseous and condensed fluid exhaust assembly 608, and/or fluid exchange sealed entrance assembly 408, fluid exchange sealed exhaust assembly 406, and pressure balancing system 304 may be configured to function with any primary dielectric thermally conductive fluid, but is used advantageously in the embodiments that contain a) single phase primary dielectric thermally conductive fluid 106 in the liquid phase, said fluid filling less than the entirety of inner volume 150 with the remaining volume filled by at least one separate and distinct fluid in the gaseous phase 108, b) single phase thermally conductive fluid 106 in the gaseous phase, said fluid filling the entirety of inner volume 150, or c) multi-phase primary dielectric thermally conductive fluid 106, said fluid at least partially filling the inner volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106 and if said multi-phase primary dielectric thermally conductive fluid 106, 108 fills less than the entirety of inner volume 150, the remaining volume may be filled by at least one separate and distinct fluid in the gaseous phase 108.

The gaseous fluid compressor 602, pressurized gaseous fluid storage 604, gaseous fluid entrance assembly 606, and/or gaseous and condensed fluid exhaust assembly 608 work in concert to allow gaseous fluid that is present in the inner volume 150 of the sealed enclosure to be compressed and stored for release back into the inner volume 150 of the sealed enclosure as necessary to maintain a specified range of fluid pressure within the inner volume 150 of the sealed enclosure. The gaseous fluid entrance assembly 606 may comprise a a) check valve that allows only fluid in the gaseous phase to flow into the intake of the gaseous fluid compressor 602, or b) a pressure relief valve that allows pressure to be a specified amount greater in inner volume 150 than the pressure in the intake of the gaseous fluid compressor 602. When the fluid pressure in the inner volume 150 of the sealed enclosure rises above a specified value, the gaseous fluid compressor 602 is activated and gaseous fluid 108 flows through the gaseous fluid entrance assembly 606 into the intake of the gaseous fluid compressor 602 where such gaseous fluid is compressed by the gaseous fluid compressor 602 and stored in pressurized gaseous fluid storage 604 thereby lowering the fluid pressure in the inner volume 150 of the sealed enclosure.

The pressurized gaseous fluid storage 604 may be comprised of thermally conductive materials configured to effect supplemental heat removal from the compressed gaseous fluid 108 by configurations comprising construction methodology or optional heat exchanger 1310. In embodiments with multi-phase thermally conductive fluid, as heat is removed from the multi-phase thermally conductive fluid 108 disposed inside the pressurized gaseous fluid storage 604, at least a portion of the multi-phase thermally conductive fluid 108 in the gaseous phase condenses to liquid phase 106 and flows as a liquid to the lower part of pressurized gaseous fluid storage 604 thereby functioning as a compressor by reducing the pressure inside the pressurized gaseous fluid storage 604 as an effect of said phase change of the multi-phase thermally conductive fluid from the gaseous phase 108 to the liquid phase 106.

The gaseous and condensed fluid exhaust assembly 608 is comprised of at least one of a pressure regulator or a pressure relief valve as to allow fluid 106, 108 in gaseous and/or liquid phase that is disposed in the pressurized gaseous fluid storage 604 to be discharged into the inner volume 150 when conditions exist such as a) a specific command to act is issued by control systems, b) pressure in inner volume 150 falls below a specified value, c) a sensor internal to the pressurized gaseous fluid storage 604 detects a liquid condensation level above specified value, d) a required operation prior to the operation of the gaseous fluid compressor 602, e) after powering up or before powering down the system of electronic devices 104, or f) other conditions as required by safety or operational status with said discharge action continuing until such time as a) a sensor internal to the pressurized gaseous fluid storage 604 detects a liquid condensation level below specified value, b) pressure in the inner volume 150 rise above a specified value, or c) other conditions as required by safety or operational status.

An optional heat exchanger 1310 comprising a concentric tube, shell and tube, plate, fin, plate-fin, or tube-fin heat exchanger removes heat from pressurized gaseous fluid storage 604. The pressurized gaseous fluid storage 604 may be comprised of thermally conductive materials configured to effect supplemental heat removal from the fluid 108 that is disposed internally to the pressurized gaseous fluid storage 604. The heat exchanger 1310 may be positioned partially or completely inside or outside of the sealed enclosure. The pressurized gaseous fluid storage 604 is cooled by the secondary thermally conductive fluid 120 that is returned from the secondary fluid heat exchanger 130 via connecting line 134 and flows through the heat exchanger 1310. In another embodiment the pressurized gaseous fluid storage 604 is cooled by the secondary thermally conductive fluid 148 that is returned from the secondary fluid heat exchanger 140 via connecting line 144 and flows through the heat exchanger 1310. In embodiments with multi-phase thermally conductive fluid, the cooled pressurized gaseous fluid storage 604 serves to remove heat from the multi-phase thermally conductive fluid 108 that is confined in the pressurized gaseous fluid storage 604 which may further serve to condense multi-phase thermally conductive fluid from the gaseous phase 108 into the liquid phase 106 of said fluid, thereby functioning as a compressor by reducing the pressure inside the pressurized gaseous fluid storage 604 as an effect of said phase change of the multi-phase thermally conductive fluid from the gaseous phase 108 to the liquid phase 106. The optional heat exchanger 1310 or other heat exchanger comprising a concentric tube, shell and tube, plate, fin, plate-fin, or tube-fin heat exchanger may be extended and further configured to directly or indirectly remove heat from sources such as electronic devices, batteries, motors, valves, fluid lines, or pumps.

The fluid exchange sealed entrance assembly 408 and the fluid exchange sealed exhaust assembly 406 work in concert to allow primary dielectric thermally conductive fluid 106, 108 fluid to be exchanged between the sealed enclosure and a pressure balancing system 304, maintaining a sealed enclosure environment. The pressure balancing system 304 is closed loop system that functions to maintain an appropriate fluid presence and pressure at the fluid exchange sealed entrance assembly 408 and the fluid exchange sealed exhaust assembly 406 for one or more sealed enclosures via connecting lines. The pressure balancing system 304 may be located either adjacent to or remote from sealed enclosures. The pressure balancing system 304 is capable of supplying fluid pressure to the inner volume 150 of the sealed enclosure using the fluid exchange sealed entrance assembly 408 via connecting lines. The fluid exchange sealed entrance assembly 408 may be configured with a pressure relief valve assembly that allows fluid pressure to be released from the pressure balancing system 304 into the inner volume 150 of the sealed enclosure when the fluid pressure in the inner volume 150 of the sealed enclosure falls below a specified value thereby raising the fluid pressure in the inner volume 150 of the sealed enclosure. The fluid exchange sealed entrance assembly 408 may be optionally configured with a pressure regulator allowing the pressure balancing system 304 to distribute a high fluid pressure to said pressure regulator which reduces the fluid pressure to appropriate fluid pressure level for proper pressure relief valve operation. The fluid exchange sealed entrance assembly 408 may be located either inside or outside the sealed enclosure. The pressure balancing system 304 is capable of removing fluid pressure from the inner volume 150 of the sealed enclosure using the fluid exchange sealed exhaust assembly 406 via connecting lines. The fluid exchange sealed exhaust assembly 406 may be configured with a pressure relief valve assembly that allows fluid pressure to be released from inner volume 150 of the sealed enclosure into the fluid pressure collection functionality of the pressure balancing system 304 when the fluid pressure in the inner volume 150 of the sealed enclosure rises above a specified value thereby lowering the fluid pressure in the inner volume 150 of the sealed enclosure. The fluid exchange sealed exhaust assembly 406 may be located either inside or outside the sealed enclosure.

An optional heat exchanger 1101 may wrap around the fluid exchange sealed exhaust assembly 406 positioned either inside or outside of the sealed enclosure in which the fluid exchange sealed exhaust assembly 406 includes a heat exchanger comprising a concentric tube, shell and tube, plate, fin, plate-fin, or tube-fin heat exchanger and is configured to effect supplemental heat removal from the primary dielectric thermally conductive fluid 106, 108 that is transported through the fluid exchange sealed exhaust assembly 406. Such configuration of the fluid exchange sealed exhaust assembly 406 is cooled by the secondary thermally conductive fluid 120 that is returned from the secondary fluid heat exchanger 130 via connecting line 134 and flows through the heat exchanger 1101 and around a portion of the fluid exchange sealed exhaust assembly 406. The cooled fluid exchange sealed exhaust assembly 406 serves to remove heat from the primary dielectric thermally conductive fluid 106, 108 that is transported through the fluid exchange sealed exhaust assembly 406 which may further serve to condense multi-phase primary dielectric thermally conductive fluid from the gaseous phase 108 into the liquid phase 106 of said fluid, with the result of returning the multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure.

Optional mechanisms may be additionally configured in the inner volume 150 of the sealed enclosure in order to effect the circulation of the primary dielectric thermally conductive fluid 106 for the purpose of a) circulating the primary dielectric thermally conductive fluid 106 in order to more effectively transfer thermal energy from the enclosed electronic devices 104 to the primary dielectric thermally conductive fluid 106 and the enclosure wall 901, and b) to circulate the primary dielectric thermally conductive fluid 106 through at least one filter to trap impurities and particulates, embodiments of such mechanisms comprise a) a mechanism comprised of a fluid pump 310, a pump intake 312, and a pump discharge 314, or b) a mechanism comprised of an impeller, fan, turbine, or propeller that rotates under motive force.

Figure 14:
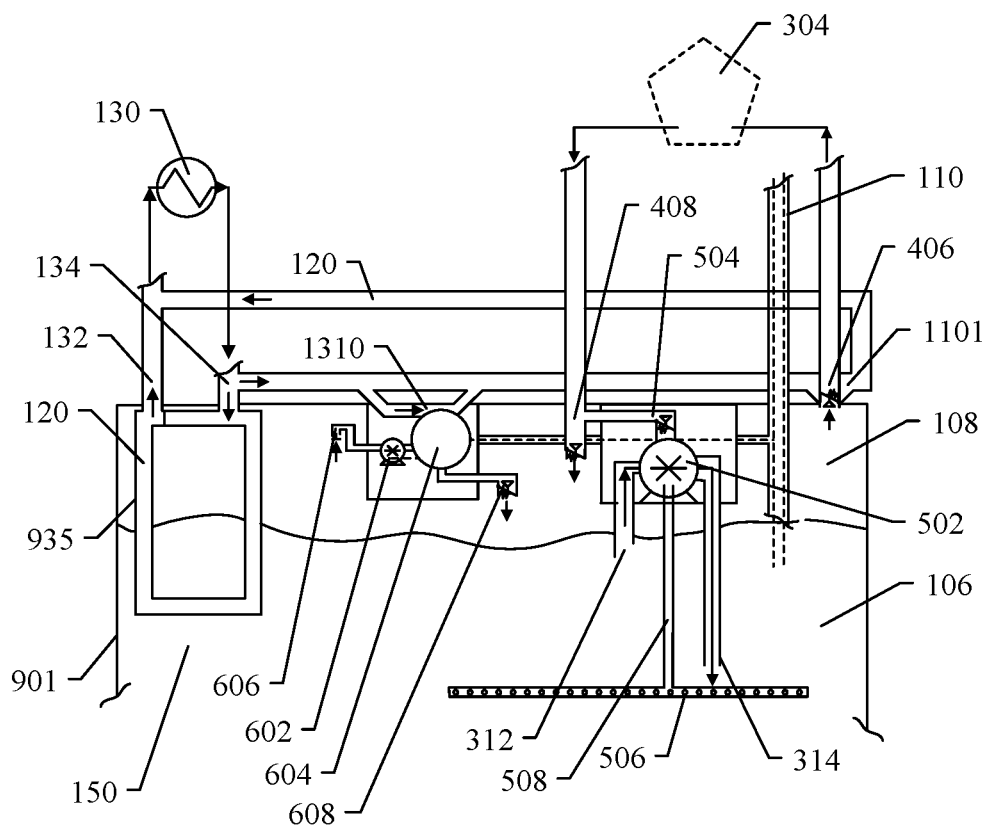
FIG. 14 shows a conceptual view of a pressure balancing mechanism with dual port pressure balancing mechanism used to relieve positive and negative pressures in a sealed enclosure and optional pressurized gaseous fluid driven primary dielectric thermally conductive fluid pump and bubbler circulation mechanisms according to an embodiment of the disclosed subject matter.

FIG. 14 shows a conceptual view of a pressure balancing mechanism with dual port pressure balancing mechanism used to relieve positive and negative pressures in a sealed enclosure and optional pressurized gaseous fluid driven primary dielectric thermally conductive fluid pump and bubbler circulation mechanisms. The sealed enclosure shown in the figure is typical of the disclosures described in FIG. 9 and is illustrated by showing only a portion of such sealed enclosure as a figure with an enclosure wall 901, wherein the inner volume 150 contains a primary dielectric thermally conductive fluid 106, 108 that either completely or partially fills the interior of the sealed enclosure as shown. The optional heat exchange circuit comprised of heat exchange assembly 140, fluid-tight piping connection 142, 144, heat exchange mechanism 945, and secondary thermally conductive fluid 148 as disclosed in FIG. 9 are not shown in this conceptual view but may be included herein as an additional and/or alternative means of heat removal.

Pressure equalization of the inner volume 150 of the sealed enclosure as well as optional fluid management is provided by a) one or more first mechanisms disclosed as a pressure balancing mechanism that may include, but are not limited to a gaseous fluid compressor 602, pressurized gaseous fluid storage 604, gaseous fluid entrance assembly 606, gaseous and condensed fluid exhaust assembly 608, and associated connecting lines, valves, sensors, controls, wiring, power, enclosures, and regulators, and b) an optional second mechanism comprised of fluid exchange sealed entrance assembly 408, fluid exchange sealed exhaust assembly 406, pressure balancing system 304, and associated connecting lines, valves, sensors, controls, wiring, power, enclosures, and regulators such that if said first mechanisms and said second mechanism are present in an embodiment, one of the said mechanisms may be designated as the primary functional mechanism while the remaining said mechanisms are designated as secondary functional mechanisms, or all of the said mechanisms may be designated as the primary functional mechanisms. The gaseous fluid compressor 602, pressurized gaseous fluid storage 604, gaseous fluid entrance assembly 606, gaseous and condensed fluid exhaust assembly 608, and/or fluid exchange sealed entrance assembly 408, fluid exchange sealed exhaust assembly 406, and pressure balancing system 304 may be configured to function with any primary dielectric thermally conductive fluid, but is used advantageously in the embodiments that contain a) single phase primary dielectric thermally conductive fluid 106 in the liquid phase, said fluid filling less than the entirety of inner volume 150 with the remaining volume filled by at least one separate and distinct fluid in the gaseous phase 108, b) single phase thermally conductive fluid 106 in the gaseous phase, said fluid filling the entirety of inner volume 150, or c) multi-phase primary dielectric thermally conductive fluid 106, said fluid at least partially filling the inner volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106 and if said multi-phase primary dielectric thermally conductive fluid 106, 108 fills less than the entirety of inner volume 150, the remaining volume may be filled by at least one separate and distinct fluid in the gaseous phase 108.

The gaseous fluid compressor 602, pressurized gaseous fluid storage 604, gaseous fluid entrance assembly 606, and/or gaseous and condensed fluid exhaust assembly 608 work in concert to allow gaseous fluid that is present in the inner volume 150 of the sealed enclosure to be compressed and stored for release back into the inner volume 150 of the sealed enclosure as necessary to maintain a specified range of fluid pressure within the inner volume 150 of the sealed enclosure. The gaseous fluid entrance assembly 606 may comprise a a) check valve that allows only fluid in the gaseous phase to flow into the intake of the gaseous fluid compressor 602, orb) a pressure relief valve that allows pressure to be a specified amount greater in inner volume 150 than the pressure in the intake of the gaseous fluid compressor 602. When the fluid pressure in the inner volume 150 of the sealed enclosure rises above a specified value, the gaseous fluid compressor 602 is activated and gaseous fluid 108 flows through the gaseous fluid entrance assembly 606 into the intake of the gaseous fluid compressor 602 where such gaseous fluid is compressed by the gaseous fluid compressor 602 and stored in pressurized gaseous fluid storage 604 thereby lowering the fluid pressure in the inner volume 150 of the sealed enclosure.

The pressurized gaseous fluid storage 604 may be comprised of thermally conductive materials configured to effect supplemental heat removal from the compressed gaseous fluid 108 by configurations comprising construction methodology or optional heat exchanger 1310. In embodiments with multi-phase thermally conductive fluid, as heat is removed from the multi-phase thermally conductive fluid 108 disposed inside the pressurized gaseous fluid storage 604, at least a portion of the multi-phase thermally conductive fluid 108 in the gaseous phase condenses to liquid phase 106 and flows as a liquid to the lower part of pressurized gaseous fluid storage 604 thereby functioning as a compressor by reducing the pressure inside the pressurized gaseous fluid storage 604 as an effect of said phase change of the multi-phase thermally conductive fluid from the gaseous phase 108 to the liquid phase 106.

The gaseous and condensed fluid exhaust assembly 608 is comprised of at least one of a pressure regulator or a pressure relief valve as to allow fluid 106, 108 in gaseous and/or liquid phase that is disposed in the pressurized gaseous fluid storage 604 to be discharged into the inner volume 150 when conditions exist such as a) a specific command to act is issued by control systems, b) pressure in inner volume 150 falls below a specified value, c) a sensor internal to the pressurized gaseous fluid storage 604 detects a liquid condensation level above specified value, d) a required operation prior to the operation of the gaseous fluid compressor 602, e) after powering up or before powering down the system of electronic devices 104, or f) other conditions as required by safety or operational status with said discharge action continuing until such time as a) a sensor internal to the pressurized gaseous fluid storage 604 detects a liquid condensation level below specified value, b) pressure in the inner volume 150 rise above a specified value, or c) other conditions as required by safety or operational status.

An optional heat exchanger 1310 comprising a concentric tube, shell and tube, plate, fin, plate-fin, or tube-fin heat exchanger removes heat from pressurized gaseous fluid storage 604. The pressurized gaseous fluid storage 604 may be comprised of thermally conductive materials configured to effect supplemental heat removal from the fluid 108 that is disposed internally to the pressurized gaseous fluid storage 604. The heat exchanger 1310 may be positioned partially or completely inside or outside of the sealed enclosure. The pressurized gaseous fluid storage 604 is cooled by the secondary thermally conductive fluid 120 that is returned from the secondary fluid heat exchanger 130 via connecting line 134 and flows through the heat exchanger 1310. In another embodiment the pressurized gaseous fluid storage 604 is cooled by the secondary thermally conductive fluid 148 that is returned from the secondary fluid heat exchanger 140 via connecting line 144 and flows through the heat exchanger 1310. In embodiments with multi-phase thermally conductive fluid, the cooled pressurized gaseous fluid storage 604 serves to remove heat from the multi-phase thermally conductive fluid 108 that is confined in the pressurized gaseous fluid storage 604 which may further serve to condense multi-phase thermally conductive fluid from the gaseous phase 108 into the liquid phase 106 of said fluid, thereby functioning as a compressor by reducing the pressure inside the pressurized gaseous fluid storage 604 as an effect of said phase change of the multi-phase thermally conductive fluid from the gaseous phase 108 to the liquid phase 106. The optional heat exchanger 1310 or other heat exchanger comprising a concentric tube, shell and tube, plate, fin, plate-fin, or tube-fin heat exchanger may be extended and further configured to directly or indirectly remove heat from sources such as electronic devices, batteries, motors, valves, fluid lines, or pumps.

The fluid exchange sealed entrance assembly 408 and the fluid exchange sealed exhaust assembly 406 work in concert to allow primary dielectric thermally conductive fluid 106, 108 fluid to be exchanged between the sealed enclosure and a pressure balancing system 304, maintaining a sealed enclosure environment. The pressure balancing system 304 is closed loop system that functions to maintain an appropriate fluid presence and pressure at the fluid exchange sealed entrance assembly 408 and the fluid exchange sealed exhaust assembly 406 for one or more sealed enclosures via connecting lines. The pressure balancing system 304 may be located either adjacent to or remote from sealed enclosures. The pressure balancing system 304 is capable of supplying fluid pressure to the inner volume 150 of the sealed enclosure using the fluid exchange sealed entrance assembly 408 via connecting lines. The fluid exchange sealed entrance assembly 408 may be configured with a pressure relief valve assembly that allows fluid pressure to be released from the pressure balancing system 304 into the inner volume 150 of the sealed enclosure when the fluid pressure in the inner volume 150 of the sealed enclosure falls below a specified value thereby raising the fluid pressure in the inner volume 150 of the sealed enclosure. The fluid exchange sealed entrance assembly 408 may be optionally configured with a pressure regulator allowing the pressure balancing system 304 to distribute a high fluid pressure to said pressure regulator which reduces the fluid pressure to appropriate fluid pressure level for proper pressure relief valve operation. The fluid exchange sealed entrance assembly 408 may be located either inside or outside the sealed enclosure. The pressure balancing system 304 is capable of removing fluid pressure from the inner volume 150 of the sealed enclosure using the fluid exchange sealed exhaust assembly 406 via connecting lines. The fluid exchange sealed exhaust assembly 406 may be configured with a pressure relief valve assembly that allows fluid pressure to be released from inner volume 150 of the sealed enclosure into the fluid pressure collection functionality of the pressure balancing system 304 when the fluid pressure in the inner volume 150 of the sealed enclosure rises above a specified value thereby lowering the fluid pressure in the inner volume 150 of the sealed enclosure. The fluid exchange sealed exhaust assembly 406 may be located either inside or outside the sealed enclosure.

An optional heat exchanger 1101 may wrap around the fluid exchange sealed exhaust assembly 406 positioned either inside or outside of the sealed enclosure in which the fluid exchange sealed exhaust assembly 406 includes a heat exchanger comprising a concentric tube, shell and tube, plate, fin, plate-fin, or tube-fin heat exchanger and is configured to effect supplemental heat removal from the primary dielectric thermally conductive fluid 106, 108 that is transported through the fluid exchange sealed exhaust assembly 406. Such configuration of the fluid exchange sealed exhaust assembly 406 is cooled by the secondary thermally conductive fluid 120 that is returned from the secondary fluid heat exchanger 130 via connecting line 134 and flows through the heat exchanger 1101 and around a portion of the fluid exchange sealed exhaust assembly 406. The cooled fluid exchange sealed exhaust assembly 406 serves to remove heat from the primary dielectric thermally conductive fluid 106, 108 that is transported through the fluid exchange sealed exhaust assembly 406 which may further serve to condense multi-phase primary dielectric thermally conductive fluid from the gaseous phase 108 into the liquid phase 106 of said fluid, with the result of returning the multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure.

An optional mechanism may be additionally configured in the inner volume 150 of the sealed enclosure in order to effect the circulation of the primary dielectric thermally conductive fluid 106 by using fluid pressure to supply the motive force for optional kinetic processes that comprise a) fluid circulation by means of a fluid pressure driven pump 502, b) fluid circulation by means of a bubbler 506, c) fluid circulation by means of both a fluid pressure driven pump 502 and a bubbler 506, or d) other fluid circulation mechanisms. These optional motive force mechanisms are driven by pressured fluid supplied by a) pressurized gaseous fluid storage 604, and/or b) the pressure balancing system 304 to the motive force sealed entrance assembly 504 via connecting lines. The motive force sealed entrance assembly 504 may be optionally configured with a pressure regulator allowing the motive force fluid pressure source to supply a high pressure fluid to said pressure regulator which reduces the fluid pressure to appropriate fluid pressure level for the proper operation of the fluid pressure driven kinetic processes. The motive force sealed entrance assembly 504 may be configured with a pressure control valve assembly that allows fluid pressure from the motive force fluid pressure source to be turned on or off, thereby supplying fluid pressure from the motive force fluid pressure source to kinetic processes such as the fluid pressure driven pump 502 and/or the bubbler 506 for the purpose of a) circulating the primary dielectric thermally conductive fluid 106 in order to more effectively transfer thermal energy from the enclosed electronic devices 104 to the primary dielectric thermally conductive fluid 106 and the enclosure wall 901, and b) to circulate the primary dielectric thermally conductive fluid 106 through at least one filter to trap impurities and particulates. Fluid pressure supplied by the motive force fluid pressure source into the inner volume 150 of the sealed enclosure via the exhaust of the fluid pressure driven pump 502 and/or the bubbler 506 is managed by the designated pressure balancing system. Embodiments that circulate the primary dielectric thermally conductive fluid 106 via a pumping action are comprised of a fluid pressure driven pump 502 connected to the motive force sealed entrance assembly 504, a pump intake 312, and a pump discharge 314. Embodiments that circulate the primary dielectric thermally conductive fluid 106 via a bubbling action are comprised of a bubbler 506 connected to the motive force sealed entrance assembly 504, and a bubbler connecting line 508, said bubbler 506 located in the lower part of the inner volume 150 of the sealed enclosure and comprising a mechanical means of releasing a pressured fluid in a predominately gaseous phase via a number of bubbler pores of various sizes. If the bubbler 506 and the fluid pressure driven pump 502 are both configured in an embodiment, the fluid pressure utilized to drive the bubbler 506 is supplied by the discharge fluid pressure of the fluid pressure driven pump 502 via connection lines 508. The motive force sealed entrance assembly 504 may be located either inside or outside the sealed enclosure.

Figure 15:
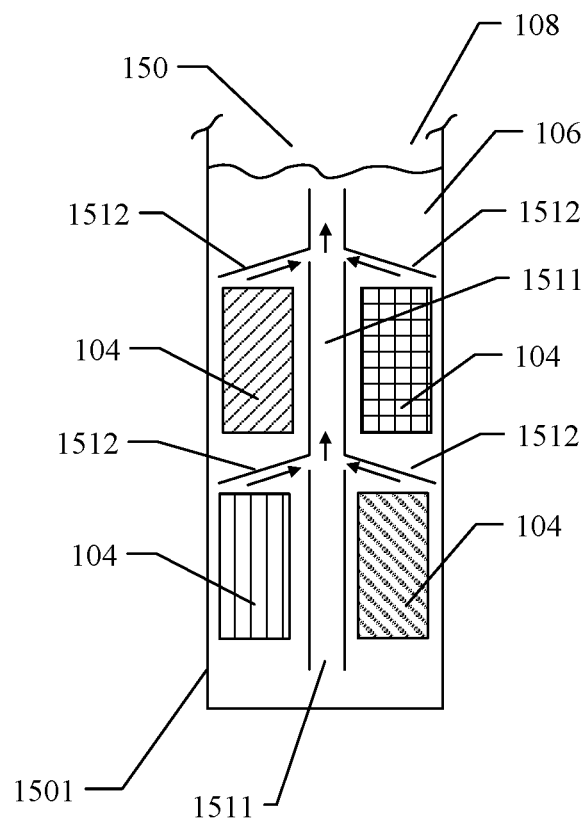
FIG. 15 shows a conceptual view of channels to direct the flow of primary dielectric thermally conductive fluid within an enclosure according to an embodiment of the disclosed subject matter.

FIG. 15 shows a conceptual view of channels to direct the flow of primary dielectric thermally conductive fluid within an enclosure. The enclosure shown in the figure may be a sealed enclosure typical of the disclosures described in FIGS. 1, 2, 9 or may be an unsealed enclosure of any dimensionality. An embodiment of a sealed enclosure shown in the figure is typical of the disclosures described in FIGS. 1, 2, 9 and is illustrated by showing only a portion of such sealed enclosures as a figure with an enclosure wall 1501, wherein the inner volume 150 contains a primary dielectric thermally conductive fluid 106, 108 that either completely or partially fills the interior of the sealed enclosure as shown. The enclosure wall 1501 is the inner enclosure wall 101 in FIGS. 1, 2 and the enclosure wall 901 in FIG. 9. An embodiment of an unsealed enclosure shown in the figure is illustrated by showing only a portion of such unsealed enclosure as a figure with an enclosure wall 1501, wherein the inner volume 150 contains a primary dielectric thermally conductive fluid 106, 108 that either completely or partially fills the interior of the unsealed enclosure as shown.

The inner volume 150 contains a single phase or multi-phase primary dielectric thermally conductive fluid 106, 108 in which electronic devices 104 to be cooled are immersed or surrounded. The single phase or multi-phase primary dielectric thermally conductive fluid 106, 108 may be in a predominately liquid phase, gaseous phase, or in a combination liquid phase and gaseous phase.

The enclosure may optionally comprise one or more channels 1511, 1512 disposed in the inner volume 150 for the purpose of providing for increased and directed convective circulation of the of single phase or multi-phase primary dielectric thermally conductive fluid 106, 108 within the inner volume 150 of the enclosure. Channels 1511, 1512 disposed in the inner volume 150 of the enclosure encourage convective and/or phase separation of the warmer single phase or multi-phase primary dielectric thermally conductive fluid 106, 108 that tends to flow upward in the inner volume 150 of the enclosure from the cooler single phase or multi-phase primary dielectric thermally conductive fluid 106, 108 that tends to flow downward in the inner volume 150 of the enclosure.

Embodiments with a single phase primary dielectric thermally conductive fluid 106 will absorb heat from electronic devices 104 with the result that the portion of said single phase primary dielectric thermally conductive 106 with a higher heat content will move convectively toward the top of the inner volume 150. Embodiments with a multi-phase primary dielectric thermally conductive fluid 106 will absorb heat from electronic devices 104 with the result that a portion of said multi-phase primary dielectric thermally conductive fluid 106 is converted to the gaseous phase 108. The portion of the multi-phase primary dielectric thermally conductive fluid 106 that remains in the liquid phase 106 and contains a higher heat content will move convectively toward the top of the inner volume 150. The portion of the multi-phase primary dielectric thermally conductive fluid 106 that is converted to the gaseous phase 108 will have a lower density than the surrounding fluid and will thus rise toward the top of the inner volume 150.

A least one channel 1512 directs rising primary dielectric thermally conductive fluid in the liquid phase 106 and/or primary dielectric thermally conductive fluid in the gaseous phase 108 toward a vertical riser channel 1511. A least one vertical riser channel 1511 directs rising primary dielectric thermally conductive fluid in the liquid phase 106 and/or primary dielectric thermally conductive fluid in the gaseous phase 108 toward the upper portion of the inner volume 150. Channels 1511, 1512 may be configured as heat exchange mechanisms in order to remove a portion of the heat contained in said rising primary dielectric thermally conductive fluid 106, 108. Channels 1511, 1512 may have various configurations that are adapted to specific electronic devices 104 within the enclosure. Channels 1511, 1512 may serve to direct the primary dielectric thermally conductive fluid 106, 108 surrounding individual electronic devices 104 or an aggregate of electronic devices 104. Channels 1511, 1512 are comprised of structures that may be closely connected in order to specifically control the fluid flow or loosely associated in order to generally control the flow of the primary dielectric thermally conductive fluid 106, 108. Channels 1511, 1512 may be adapted to function within a enclosure that is installed in various orientations.

Figure 16:
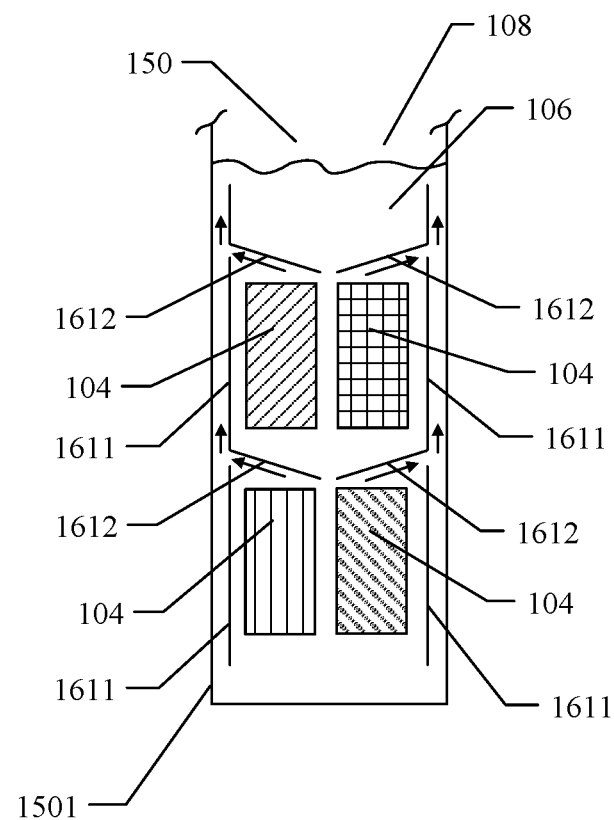
FIG. 16 shows a conceptual view of channels to direct the flow of primary dielectric thermally conductive fluid within an enclosure according to an embodiment of the disclosed subject matter.

FIG. 16 shows a conceptual view of channels to direct the flow of primary dielectric thermally conductive fluid within an enclosure. The enclosure shown in the figure may be a sealed enclosure typical of the disclosures described in FIGS. 1, 2, 9 or may be an unsealed enclosure of any dimensionality. An embodiment of a sealed enclosure shown in the figure is typical of the disclosures described in FIGS. 1, 2, 9 and is illustrated by showing only a portion of such sealed enclosures as a figure with an enclosure wall 1501, wherein the inner volume 150 contains a primary dielectric thermally conductive fluid 106, 108 that either completely or partially fills the interior of the sealed enclosure as shown. The enclosure wall 1501 is the inner enclosure wall 101 in FIGS. 1, 2 and the enclosure wall 901 in FIG. 9. An embodiment of an unsealed enclosure shown in the figure is illustrated by showing only a portion of such unsealed enclosure as a figure with an enclosure wall 1501, wherein the inner volume 150 contains a primary dielectric thermally conductive fluid 106, 108 that either completely or partially fills the interior of the unsealed enclosure as shown.

The inner volume 150 contains a single phase or multi-phase primary dielectric thermally conductive fluid 106, 108 in which electronic devices 104 to be cooled are immersed or surrounded. The single phase or multi-phase primary dielectric thermally conductive fluid 106, 108 may be in a predominately liquid phase, gaseous phase, or in a combination liquid phase and gaseous phase.

The enclosure may optionally comprise one or more channels 1611, 1612 disposed in the inner volume 150 for the purpose of providing for increased and directed convective circulation of the of single phase or multi-phase primary dielectric thermally conductive fluid 106, 108 within the inner volume 150 of the enclosure. Channels 1611, 1612 disposed in the inner volume 150 of the enclosure encourage convective and/or phase separation of the warmer single phase or multi-phase primary dielectric thermally conductive fluid 106, 108 that tends to flow upward in the inner volume 150 of the enclosure from the cooler single phase or multi-phase primary dielectric thermally conductive fluid 106, 108 that tends to flow downward in the inner volume 150 of the enclosure.

Embodiments with a single phase primary dielectric thermally conductive fluid 106 will absorb heat from electronic devices 104 with the result that the portion of said single phase primary dielectric thermally conductive 106 with a higher heat content will move convectively toward the top of the inner volume 150. Embodiments with a multi-phase primary dielectric thermally conductive fluid 106 will absorb heat from electronic devices 104 with the result that a portion of said multi-phase primary dielectric thermally conductive fluid 106 is converted to the gaseous phase 108. The portion of the multi-phase primary dielectric thermally conductive fluid 106 that remains in the liquid phase 106 and contains a higher heat content will move convectively toward the top of the inner volume 150. The portion of the multi-phase primary dielectric thermally conductive fluid 106 that is converted to the gaseous phase 108 will have a lower density than the surrounding fluid and will thus rise toward the top of the inner volume 150.

A least one channel 1612 directs rising primary dielectric thermally conductive fluid in the liquid phase 106 and/or primary dielectric thermally conductive fluid in the gaseous phase 108 toward a vertical riser channel 1611. A least one vertical riser channel 1611 directs rising primary dielectric thermally conductive fluid in the liquid phase 106 and/or primary dielectric thermally conductive fluid in the gaseous phase 108 toward the upper portion of the inner volume 150. Channels 1611, 1612 may be configured as heat exchange mechanisms in order to remove a portion of the heat contained in said rising primary dielectric thermally conductive fluid 106, 108. Channels 1611, 1612 may have various configurations that are adapted to specific electronic devices 104 within the enclosure. Channels 1611, 1612 may serve to direct the primary dielectric thermally conductive fluid 106, 108 surrounding individual electronic devices 104 or an aggregate of electronic devices 104. Channels 1611, 1612 are comprised of structures that may be closely connected in order to specifically control the fluid flow or loosely associated in order to generally control the flow of the primary dielectric thermally conductive fluid 106, 108. Channels 1611, 1612 may be adapted to function within a enclosure that is installed in various orientations.

Figure 17A:
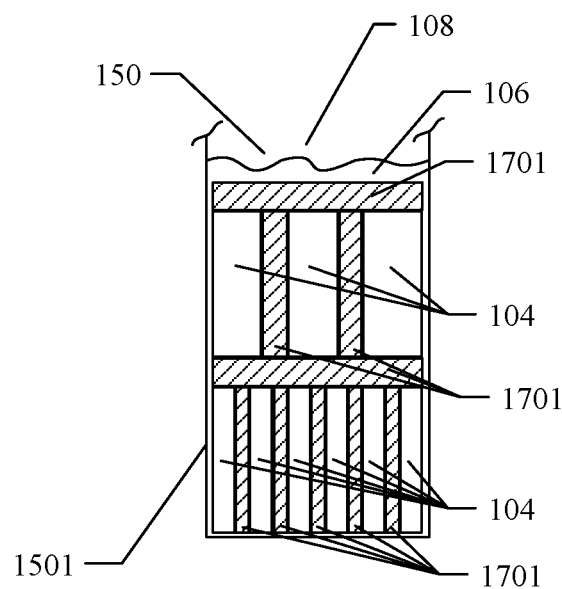
FIG. 17A shows a conceptual view of structures for the volumetric displacement of primary dielectric thermally conductive fluid within an enclosure according to an embodiment of the disclosed subject matter.

FIG. 17A shows a conceptual view of structures for the volumetric displacement of primary dielectric thermally conductive fluid within an enclosure. The enclosure shown in FIG. 17A may be a sealed enclosure typical of the disclosures described in FIGS. 1, 2, 9 or may be an unsealed enclosure of any dimensionality. An embodiment of a sealed enclosure shown in FIG. 17A is typical of the disclosures described in FIGS. 1, 2, 9 and is illustrated by showing only a portion of such sealed enclosures as a figure with an enclosure wall 1501, wherein the inner volume 150 contains a primary dielectric thermally conductive fluid 106, 108 that either completely or partially fills the interior of the sealed enclosure as shown. The enclosure wall 1501 is the inner enclosure wall 101 in FIGS. 1, 2 and the enclosure wall 901 in FIG. 9. An embodiment of an unsealed enclosure shown in FIG. 17A is illustrated by showing only a portion of such unsealed enclosure as a figure with an enclosure wall 1501, wherein the inner volume 150 contains a primary dielectric thermally conductive fluid 106, 108 that either completely or partially fills the interior of the unsealed enclosure as shown.

The inner volume 150 contains a single phase or multi-phase primary dielectric thermally conductive fluid 106, 108 in which electronic devices 104 to be cooled are immersed or surrounded. The single phase or multi-phase primary dielectric thermally conductive fluid 106, 108 may be in a predominately liquid phase, gaseous phase, or in a combination liquid phase and gaseous phase.

Electronic device 104 is typically characterized by circuit board construction that projects an uneven profile perpendicular to a plane of the circuit board thereby leaving a volume of space ("Electronic Device Space") unoccupied by the components of electronic device 104 within a volume defined by the maximum height, width, and length dimensions of electronic device 104. The Electronic Device Space does not include the volumetric space occupied by the components of electronic device 104. Electronic devices 104 may have at least one associated Electronic Device Space. The Electronic Device Space may define both a volume and a specific dimensionality for electronic device 104.

The enclosure may optionally comprise one or more spacers 1701 comprised of solid or sealed hollow structures that are disposed in the inner volume 150 within the primary dielectric thermally conductive fluid 106, 108. Spacers 1701 may be configured to function in any location and any orientation within the inner volume 150, but are used advantageously in embodiments in which the spacer 1701 is disposed in a) Electronic Device Space, b) volumes outside of Electronic Device Space, and/or c) volumes within the inner volume 150 that would otherwise be occupied by the primary dielectric thermally conductive fluid 106, 108.

Spacers 1701 that are disposed within Electronic Device Space of a particular electronic device 104 may have a dimensionality that forms a reflected image of at least a portion of the surface of said electronic device 104 such that a) an appropriate gap exists between said reflected image and said surface of said electronic device 104, b) portions of said reflected image are in direct thermal contact with said surface of said electronic device 104, c) portions of said reflected image are in indirect thermal contact with said surface of said electronic device 104 having thermal interface materials disposed between said portions of said reflected image and said surface of said electronic device 104, and/or d) portions of said reflected image are in direct mechanical contact with said surface of said electronic device 104. A spacer 1701 may be disposed within the Electronic Device Space of one or more electronic devices 104. One or more spacers 1701 may be disposed with the Electronic Device Space of a particular electronic device 104.

Spacers 1701 may be thermally connected to electronic devices 104 and configured as heat exchange mechanisms to transport heat from said electronic device 104 to the primary dielectric thermally conductive fluid 106, 108 or to transport heat directly to heat exchange or transport mechanisms illustrated in FIGS. 1 to 16 inclusive, 19, 20, 21. Spacers 1701 may be installed in any orientation. Spacers 1701 may be mechanically connected to one or more electronic devices 104 or other objects disposed within the inner volume 150. A spacer 1701 may function as a mounting structure for one or more electronic devices 104. One or more spacers 1701 may function as a mounting structure for an electronic device 104. One or more spacers 1701 may be connected directly or indirectly to form a structural unit of any dimensionality. One or more spacers 1701 may be configured to function as channels 1511, 1512 as disclosed in FIG. 15 and/or channels 1611, 1612 as disclosed in FIG. 16. In FIG. 17A, spacers 1701 are shown to be oriented in a primarily vertical position.

Spacers 1701 may be configured such that at least a portion of a spacer 1701 comprises a elastic diaphragm, elastic wall materials, or hollow elastic structure that allow at least a portion of the spacer 1701 to deform under pressure. Spacers 1701 may be constructed of materials suitable to their purpose and may be comprised of a plurality of distinct materials and parts.

Figure 17B:
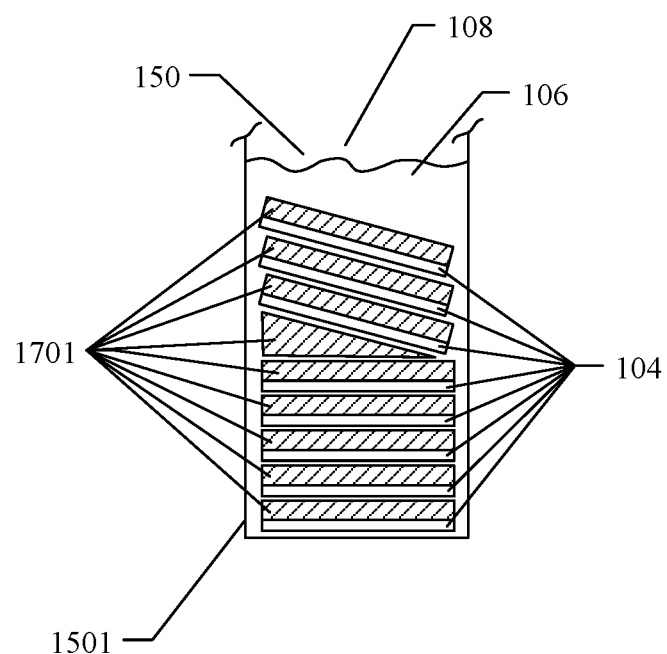
FIG. 17B shows a conceptual view of structures for the volumetric displacement of primary dielectric thermally conductive fluid within an enclosure according to an embodiment of the disclosed subject matter.

FIG. 17B shows an additional embodiment of structures for the volumetric displacement of primary dielectric thermally conductive fluid within an enclosure as disclosed in FIG. 17A that comprises spacers 1701 shown to be oriented in primarily a horizontal position.

Figure 18:
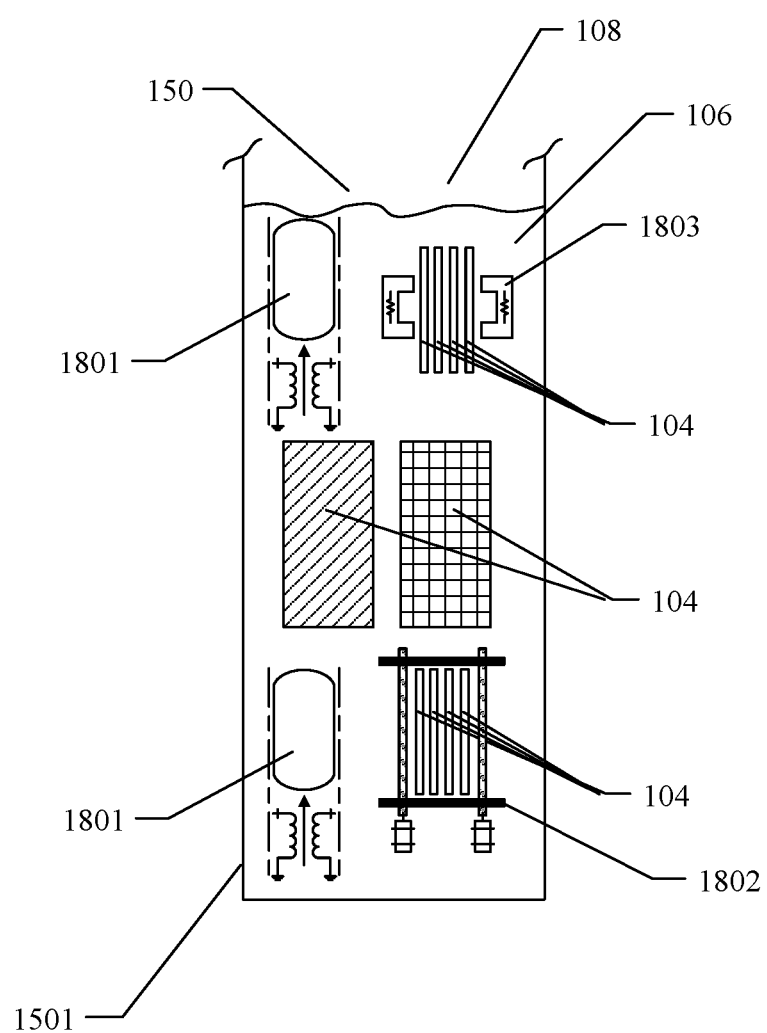
FIG. 18 shows a conceptual view of mechanisms that provide a means of rendering a portion of the electronic devices with a sealed enclosure inoperable according to an embodiment of the disclosed subject matter.

FIG. 18 shows a conceptual view of mechanisms that provide a means of rendering a portion of the electronic devices within a sealed enclosure inoperable and optionally rendering any content stored on those devices to be unusable or unreadable. The sealed enclosure shown in the figure is typical of the disclosures described in FIGS. 1, 2, 9, 19 and is illustrated by showing only a portion of such sealed enclosures as a figure with an enclosure wall 1501, wherein the inner volume 150 contains a primary dielectric thermally conductive fluid 106, 108 that either completely or partially fills the interior of the sealed enclosure as shown. The enclosure wall 1501 is the inner enclosure wall 101 in FIGS. 1, 2, and the enclosure wall 901 in FIG. 9, and the enclosure wall 1901 in FIG. 19. The inner volume 150 contains a single phase or multi-phase primary dielectric thermally conductive fluid 106, 108 in which electronic devices 104 to be cooled are immersed or surrounded. The single phase or multi-phase primary dielectric thermally conductive fluid 106, 108 may be in a predominately liquid phase, gaseous phase, or in a combination liquid phase and gaseous phase.

The sealed enclosure may optionally comprise one or more mechanisms 1801, 1802, 1803 in the inner volume 150 for the purpose of providing an electrical, magnetic, chemical, and/or mechanical means of rendering the electronic devices 104 inoperable and optionally further rendering any content stored on said electronic devices 104 to be unusable or unreadable ("Poison Pill Device"). Poison Pill Devices 1801, 1802, 1803 may be configured to function in any location within the inner volume 150.

Poison Pill Device 1801 is an assembly comprising a frangible container that contains a material destructive to electronic devices 104 and a motive force actuated striker that will operate on command to strike the frangible container with kinetic force sufficient to break the frangible container and release the contents of the frangible container into the inner volume 150 of the sealed enclosure. The striker of Poison Pill Device 1801 may use electrical, pneumatic, mechanical, or inertial means to supply the motive force necessary to operate the striker. The frangible container of Poison Pill Device 1801 holds caustic, corrosive, or conductive materials that when added to the primary dielectric thermally conductive fluid 106, 108 serve to at least partially render the electrical devices 104 inoperable, unusable, or unreadable. In at least one embodiment, a plurality of Poison Pill Devices 1801 are disposed in various locations within the inner volume 150 so as to have the greatest effect on electronic devices 104.

A Poison Pill Device 1802 is an assembly comprising a mechanical means of deforming electronic devices 104 that are disposed between at least one movable structural member by subjecting said electronic devices 104 to compression or tension that results in the physical destruction of a portion of said electronic devices 104. The motive force for the moveable structural member of Poison Pill Device 1802 is comprised of a) a screw and motor assembly configured as moving plate, scissor jack, or jack screw, b) a striker assembly with at least one motive force actuated striker, or c) a lever or cylinder acting in mechanical advantage with electrical, inertial, or fluid pressure motive force.

A Poison Pill Device 1803 is an assembly comprising a magnetic means of destroying electronic devices 104 that are disposed in proximity with at least one electromagnet of sufficient strength to render said electronic devices 104 inoperable and optionally render any content stored on said electronic devices 104 to be unusable or unreadable. In at least one embodiment, a plurality of Poison Pill Devices 1803 are disposed in various locations within the inner volume 150 so as to have the greatest effect on electronic devices 104.

Poison Pill Devices 1801, 1802, 1803 may be commanded to act by at least one control that includes remote control of a Poison Pill Device 1801, 1802, 1803, proximal electrical or mechanical control of a Poison Pill Device 1801, 1802,

1803 by means of a control disposed on the exterior of the sealed enclosure, or autonomous control of a Poison Pill Device 1801, 1802, 1803 with a determination of command to act based on specific events, environmental conditions, or circumstances detected by electronic devices 104 and/or the Poison Pill Devices 1801, 1802, 1803. Poison Pill Devices 1801, 1802, 1803 may be commanded to act in sequence and timing to maximize the destructive effect of the Poison Pill Devices 1801, 1802, 1803. Poison Pill Devices 1801, 1802, 1803 may use other assemblies and mechanisms with the inner volume 150 to increase the desired effect by using actions comprising mixing, pressure changes, electrical control, and electrical impulse. Poison Pill Devices 1801, 1802, 1803 may be simultaneously commanded to act by a plurality of means. Poison Pill Devices 1801, 1802, 1803 may require that a plurality of means of command are in agreement in order to initiate action.

Not shown, but disclosed is external means of effecting the sealed enclosure for the purpose of providing an electrical, magnetic, chemical, and/or mechanical means of rendering the electronic devices 104 inoperable and any content stored on said devices to be unusable or unreadable, said external means comprising a) the introduction of caustic, corrosive, or conductive materials into the primary dielectric thermally conductive fluid 106, 108 by means an external pressure balancing system 304, b) electrical impulse introduced by means of control wiring 110, c) mechanical or thermal deformation by electrical, mechanical, or chemical means, and d) cessation of effective operation of an external heat exchanger assembly 130, 240.

Figure 19:
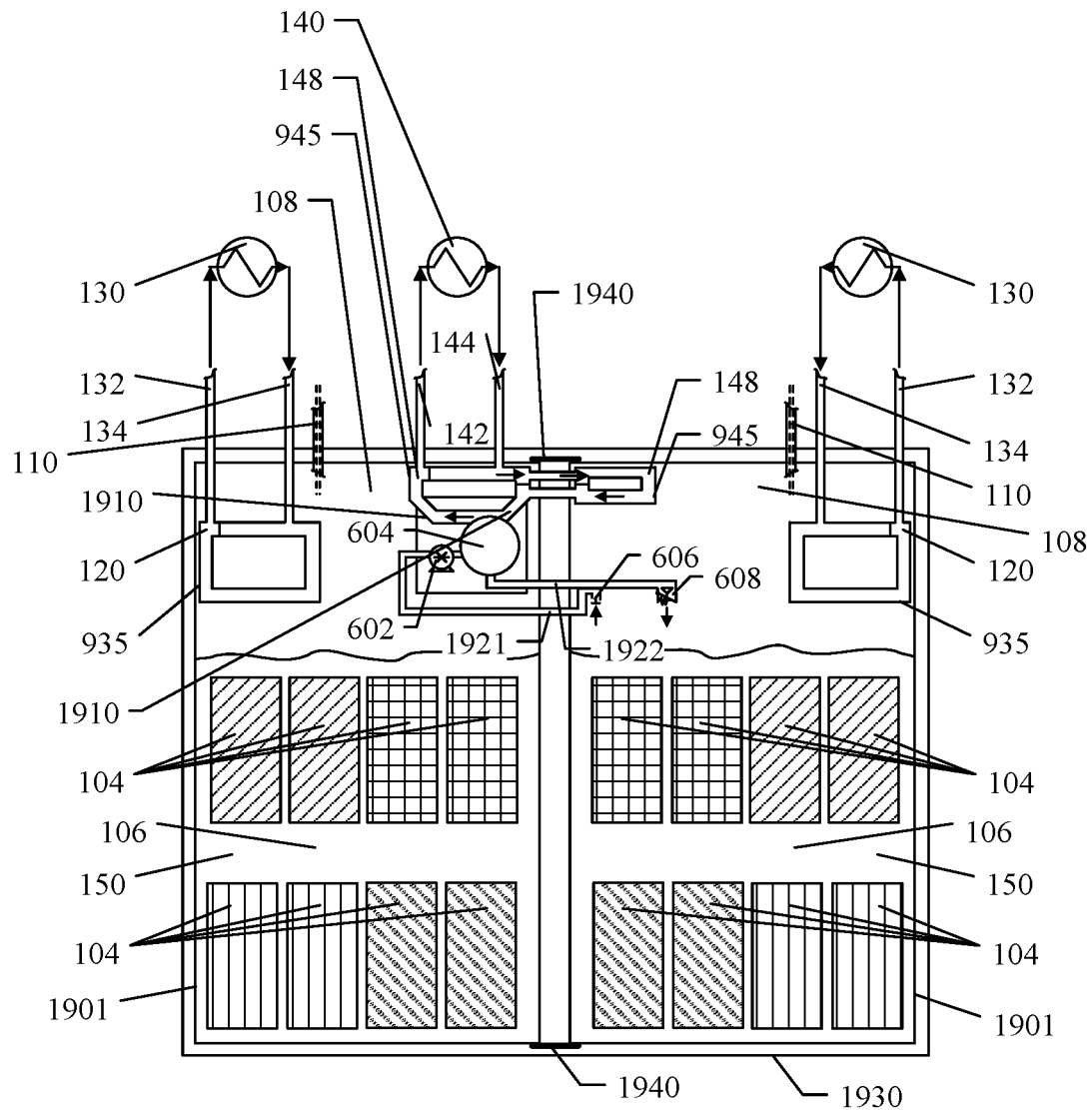
FIG. 19 shows a conceptual view of an enclosure group comprised of more than one sealed enclosure according to an embodiment of the disclosed subject matter.

FIG. 19 shows a conceptual view of an enclosure group comprised of more than one sealed enclosure 1901. The sealed enclosures 1901 shown in the figure are typical of the disclosures described in FIGS. 1, 2, 9 and are illustrated by showing FIG. 9 and includes elements from FIG. 13. In each case, the numbered elements have the same meaning in this FIG. 19 as in the figures in which they originally appear. For purposes of this FIG. 19, two sealed enclosure embodiments are shown as structurally grouped together by structural connections 1940, thus forming an enclosure group. The sealed enclosures 1901 are configured such that the secondary thermally conductive fluid 148 is conducted through more than one sealed enclosure before the secondary thermally conductive fluid 148 is circulated through a heat exchanger assembly 140 where a portion of the heat is removed from the thermally conductive fluid 148. The sealed enclosure 1901 that appears at the left of the FIG. 19 is configured such that a portion of the components used for pressure balancing of the sealed enclosure 1901 at the right of FIG. 19 are disposed interior to the sealed enclosure 1901 that appears at the left of the FIG. 19 and connects with the sealed enclosure 1901 at the right of FIG. 19 using fluid-tight connecting lines 1921, 1922.

An optional heat exchanger 1910 comprising a concentric tube, shell and tube, plate, fin, plate-fin, or tube-fin heat exchanger removes heat from pressurized gaseous fluid storage 604. The pressurized gaseous fluid storage 604 may be comprised of thermally conductive materials configured to effect supplemental heat removal from the fluid 108, 106 that is disposed internally to the pressurized gaseous fluid storage 604. In the embodiment shown, the pressurized gaseous fluid storage 604 is cooled by the secondary thermally conductive fluid 148 that is returned from the secondary fluid heat exchanger 140 via connecting line 144 and flows through the heat exchanger 1910. In embodiments with multi-phase thermally conductive fluid, the cooled pressurized gaseous fluid storage 604 serves to remove heat from the multi-phase thermally conductive fluid 108 that is confined in the pressurized gaseous fluid storage 604 which may further serve to condense multi-phase thermally conductive fluid from the gaseous phase 108 into the liquid phase 106 of said fluid, thereby functioning as a compressor by reducing the pressure inside the pressurized gaseous fluid storage 604 as an effect of said phase change of the multi-phase thermally conductive fluid from the gaseous phase 108 to the liquid phase 106. The optional heat exchanger 1910 or other heat exchanger comprising a concentric tube, shell and tube, plate, fin, plate-fin, or tube-fin heat exchanger may be extended and further configured to directly or indirectly remove heat from sources such as electronic devices, batteries, motors, valves, fluid lines, or pumps.

The sealed enclosures in this enclosure group can be configured in any orientation and grouped together to form a structural unit of any dimensionality. The enclosure group can optionally be further enclosed within an enclosure 1930 and may contain a portion of the components used for pressure balancing and/or secondary thermally conductive fluids that are disposed interior to enclosure 1930 and exterior to sealed enclosures such that said portion of the components used for pressure balancing and said secondary thermally conductive fluids perform their indicated functions for one or more sealed enclosures.

Figure 20:
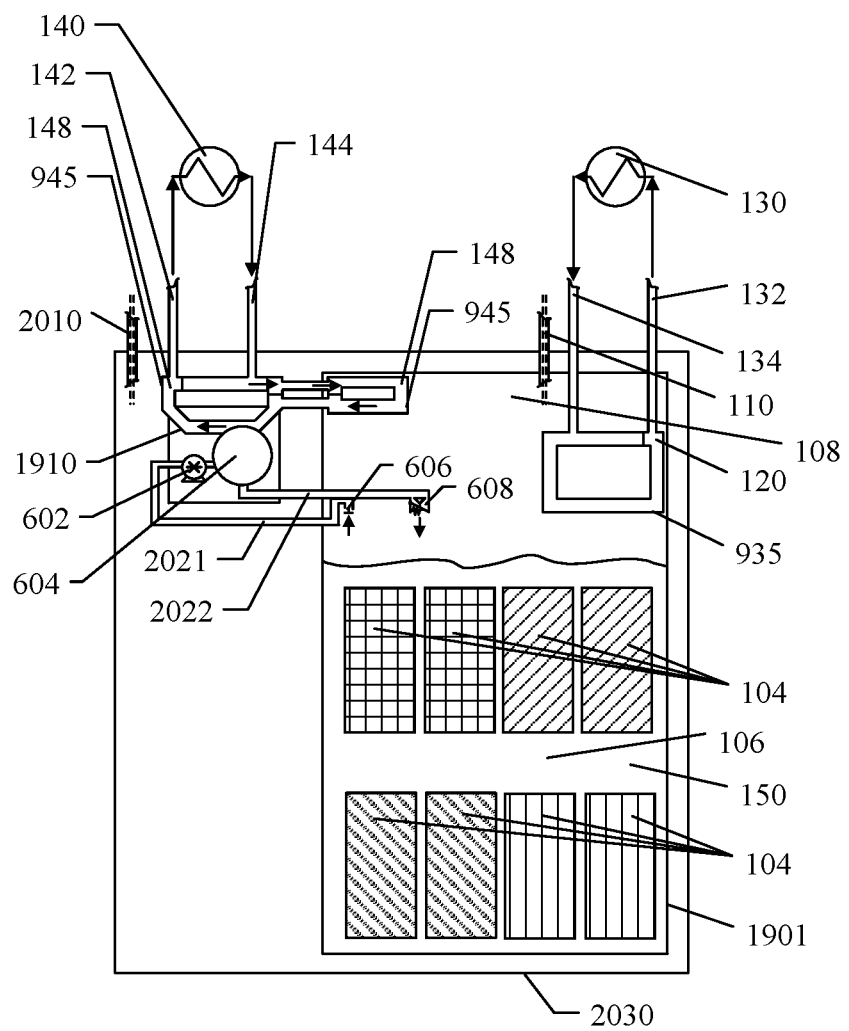
FIG. 20 shows a conceptual view of a sealed enclosure within an enclosure according to an embodiment of the disclosed subject matter.

FIG. 20 shows a conceptual view of a sealed enclosure 1901 enclosed within an enclosure 2030. The sealed enclosure 1901 shown in the figure is typical of the disclosures described in FIGS. 1, 2, 9 and is illustrated by showing FIG. 9 and includes elements from FIG. 13. In each case, the numbered elements have the same meaning in this FIG. 20 as in the figures in which they originally appear. The embodiment that appears in FIG. 20 is configured such that the secondary thermally conductive fluid 148 is conducted through both the sealed enclosure 1901 and a portion of a volume that is interior to the enclosure 2030 and exterior to the sealed enclosure 1901. A portion of the components used for pressure balancing for the sealed enclosure 1901 are disposed interior to the enclosure 2030 and exterior to the sealed enclosure 1901 and connects to the sealed enclosure 1901 using fluid-tight connecting lines 2021, 2022. The enclosure 2030 has fluid-tight entrances 2010 for power, networking, and other control and monitoring signals and functions which are appropriately connected to one or more electronic or other functional devices disposed in the enclosure 2030.

An optional heat exchanger 1910 comprising a concentric tube, shell and tube, plate, fin, plate-fin, or tube-fin heat exchanger removes heat from pressurized gaseous fluid storage 604. The pressurized gaseous fluid storage 604 may be comprised of thermally conductive materials configured to effect supplemental heat removal from the fluid 108, 106 that is disposed internally to the pressurized gaseous fluid storage 604. In the embodiment shown, the pressurized gaseous fluid storage 604 is cooled by the secondary thermally conductive fluid 148 that is returned from the secondary fluid heat exchanger 140 via connecting line 144 and flows through the heat exchanger 1910. In embodiments with multi-phase thermally conductive fluid, the cooled pressurized gaseous fluid storage 604 serves to remove heat from the multi-phase thermally conductive fluid 108 that is confined in the pressurized gaseous fluid storage 604 which may further serve to condense multi-phase thermally conductive fluid from the gaseous phase 108 into the liquid phase 106 of said fluid, thereby functioning as a compressor by reducing the pressure inside the pressurized gaseous fluid storage 604 as an effect of said phase change of the multi-phase thermally conductive fluid from the gaseous phase 108 to the liquid phase 106. The optional heat exchanger 1910 or other heat exchanger comprising a concentric tube, shell and tube, plate, fin, plate-fin, or tube-fin heat exchanger may be extended and further configured to directly or indirectly remove heat from sources such as electronic devices, batteries, motors, valves, fluid lines, or pumps. More than one sealed enclosure may be grouped together within the enclosure 2030 to form an enclosure group that is configured in any orientation and grouped together to form a structural unit of any dimensionality.

Figure 21:
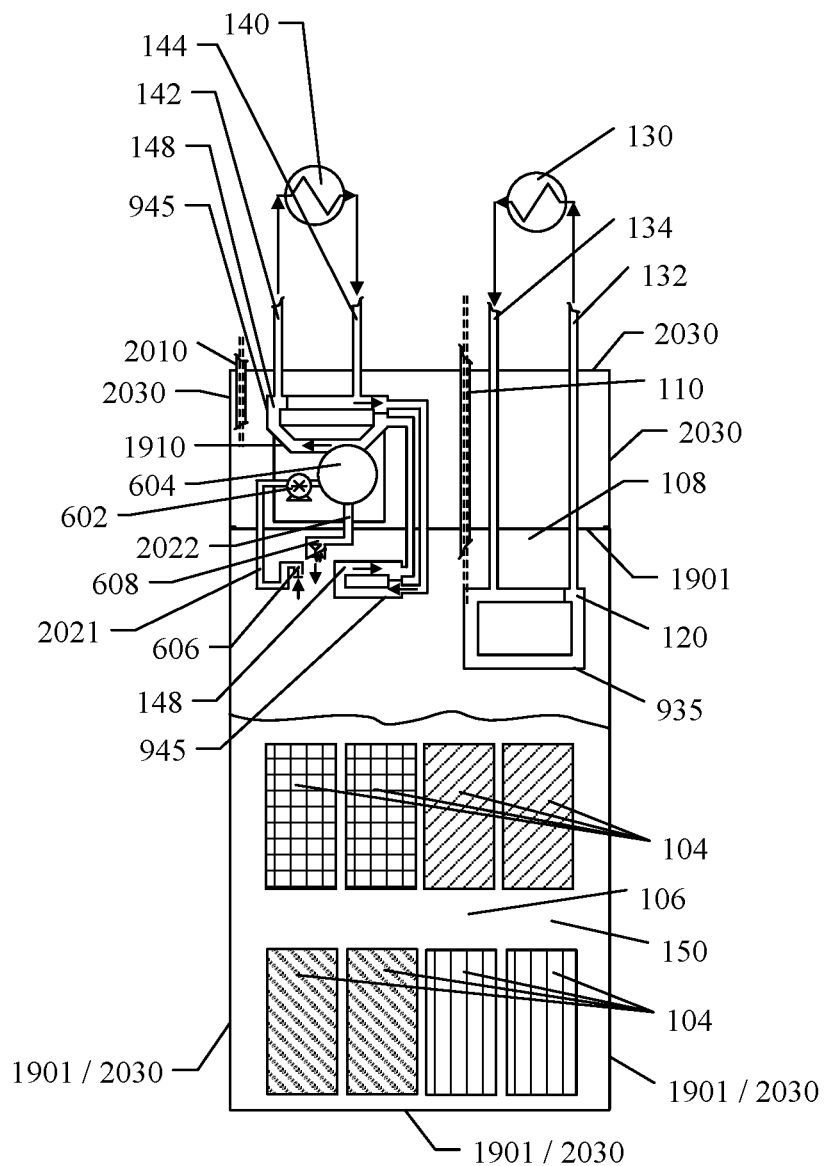
FIG. 21 shows a conceptual view of a sealed enclosure combined with an enclosure according to an embodiment of the disclosed subject matter.

FIG. 21 shows a conceptual view of a sealed enclosure 1901 combined with an enclosure 2030. In the embodiment, the sealed enclosure 1901 shares one or more enclosing surfaces with the enclosure 2030. FIG. 21 illustrates the shared enclosing surfaces by the designation 1901/2030 indicating that an enclosing surface 1901/2030 is a structure that performs the functions of an enclosing surface for both a sealed enclosure 1901 and an enclosure 2030. The sealed enclosure 1901 has at least one enclosing surface that is not shared with enclosure 2030. The enclosure 2030 has at least one enclosing surface that is not shared with the sealed enclosure 1901. The sealed enclosure 1901 shown in the figure is typical of the disclosures described in FIGS. 1, 2, 9 and is illustrated by showing FIG. 9 and includes elements from FIG. 13. In each case, the numbered elements have the same meaning in this FIG. 21 as in the figures in which they originally appear. The embodiment that appears in FIG. 21 is configured such that the secondary thermally conductive fluid 148 is conducted through both the sealed enclosure 1901 and a portion of a volume that is interior to the enclosure 2030 and exterior to the sealed enclosure 1901. A portion of the components used for pressure balancing for the sealed enclosure 1901 are disposed interior to the enclosure 2030 and exterior to the sealed enclosure 1901 and connects to the sealed enclosure 1901 using fluid-tight connecting lines 2021, 2022. The enclosure 2030 has fluid-tight entrances 2010 for power, networking, and other control and monitoring signals and functions which are appropriately connected to one or more electronic or other functional devices disposed in the enclosure 2030.

An optional heat exchanger 1910 comprising a concentric tube, shell and tube, plate, fin, plate-fin, or tube-fin heat exchanger removes heat from pressurized gaseous fluid storage 604. The pressurized gaseous fluid storage 604 may be comprised of thermally conductive materials configured to effect supplemental heat removal from the fluid 108, 106 that is disposed internally to the pressurized gaseous fluid storage 604. In the embodiment shown, the pressurized gaseous fluid storage 604 is cooled by the secondary thermally conductive fluid 148 that is returned from the secondary fluid heat exchanger 140 via connecting line 144 and flows through the heat exchanger 1910. In embodiments with multi-phase thermally conductive fluid, the cooled pressurized gaseous fluid storage 604 serves to remove heat from the multi-phase thermally conductive fluid 108 that is confined in the pressurized gaseous fluid storage 604 which may further serve to condense multi-phase thermally conductive fluid from the gaseous phase 108 into the liquid phase 106 of said fluid, thereby functioning as a compressor by reducing the pressure inside the pressurized gaseous fluid storage 604 as an effect of said phase change of the multi-phase thermally conductive fluid from the gaseous phase 108 to the liquid phase 106. The optional heat exchanger 1910 or other heat exchanger comprising a concentric tube, shell and tube, plate, fin, plate-fin, or tube-fin heat exchanger may be extended and further configured to directly or indirectly remove heat from sources such as electronic devices, batteries, motors, valves, fluid lines, or pumps. More than one sealed enclosure 1901 may be grouped together within the enclosure 2030 to form an enclosure group that is configured in any orientation and grouped together to form a structural unit of any dimensionality.

Figure 22:
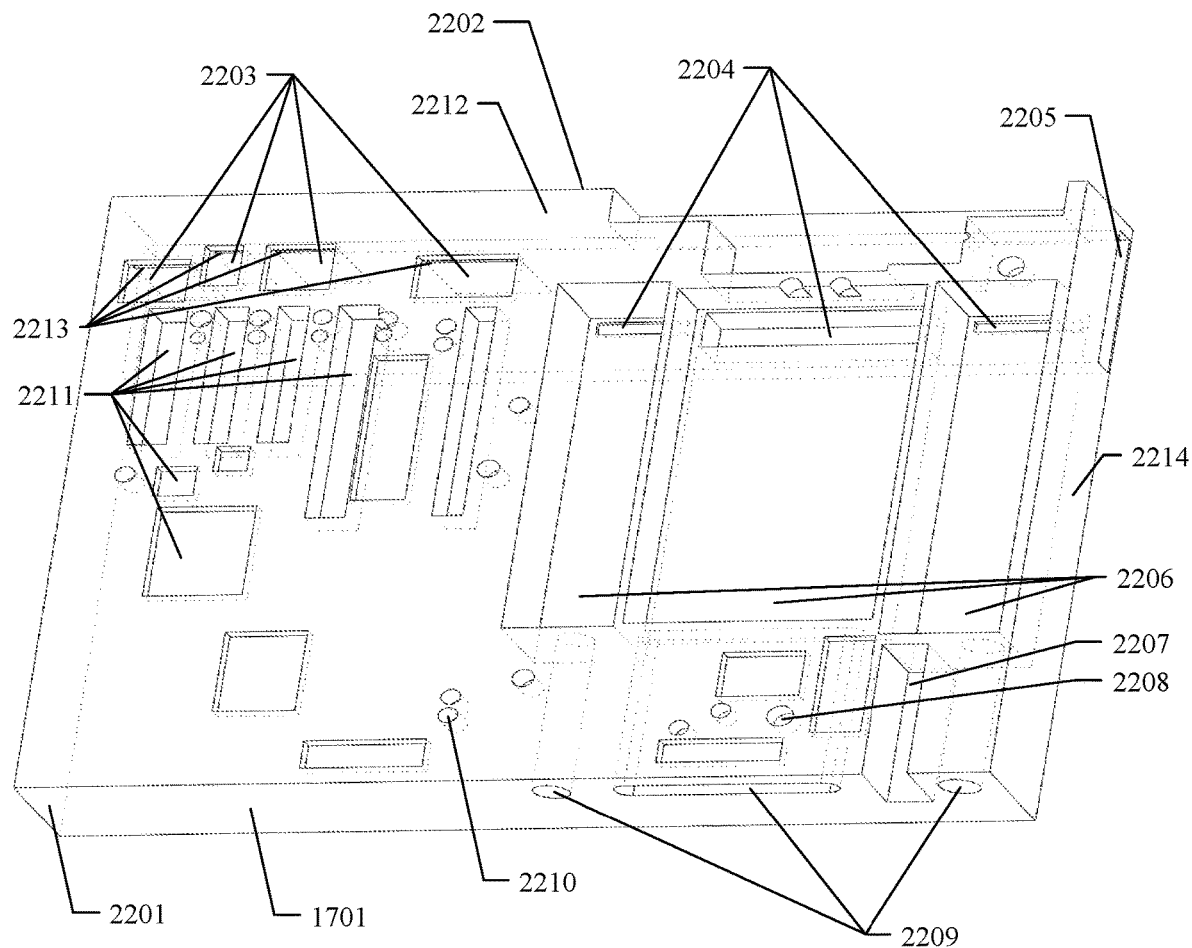
FIG. 22 shows an embodiment of a structure for the volumetric displacement of primary dielectric thermally conductive fluid within an enclosure according to an embodiment of the disclosed subject matter.

FIG. 22 shows an embodiment of a spacer 1701 as disclosed in FIG. 17A, 17B for the volumetric displacement of primary dielectric thermally conductive fluid within an enclosure. The embodiment of spacer 1701 illustrated in FIG. 22 is oriented such that surface 2202 represents the top of spacer 1701 and surface 2301 represents the bottom of spacer 1701. Spacer 1701 may be in any orientation with respect to enclosure wall 1501. The operational orientation of enclosure wall 1501, electronic devices 104, spacers 1701, and any other object or feature within enclosure wall 1501 will vary with respect to gravity based on orientation, location, and movement. The surface 2212 of spacer 1701 is oriented towards one or more electronic devices 104 which are omitted from FIG. 22 for clarity.

Spacer 1701 as embodied in FIG. 22 is comprised of multiple features with descriptions that include, but are not limited to, surfaces, channels, planes, walls, cutouts, holes, tubes, cavities, slots, pins, protrusions, and cutouts as exemplified by 2203, 2204, 2205, 2206, 2207, 2208, 2209, 2210, 2211, 2213. Features exemplified by 2203, 2204, 2205, 2206, 2207, 2208, 2209, 2210, 2211, 2213 allow one or more spacers 1701 to a) be configured to occupy a portion of Electronic Device Space, b) occupy or enclose volumes outside of Electronic Device Space, c) form a mounting structure for one or more electronic devices 104, d) form a mounting structure for one or more other spacers 1701, and/or e) form channels 1511, 1512 as disclosed in FIG. 15 and/or channels 1611, 1612 as disclosed in FIG. 16. Any particular spacer 1701 and any features associated with that spacer 1701 may occupy or enclose volumes both inside and outside of Electronic Device Space. Spacer 1701 may not serve to direct all of the primary dielectric thermally conductive fluid 106, 108 that is heated by any associated electronic device 104. The portion of primary dielectric thermally conductive fluid 106, 108 that is directed by spacer 1701 will vary based design and operational factors that include, but are not limited to, a) the proximity of electronic device 104 to spacer 1701, b) the existence and type of physical connection of electronic device 104 to spacer 1701, c) the amount and rate of heat to be moved by primary dielectric thermally conductive fluid 106, 108, d) the orientation and movement of the enclosure with respect to gravity, e) operational status of adjacent spacers 1701 and electronic devices 104, f) the configuration of spacers 1701 in the same group, g) components, wiring, and connectors required by electronic devices 104, and h) the amount and type of primary dielectric thermally conductive fluid 106, 108 within the enclosure.

In one example of fluid flow in this embodiment, primary dielectric thermally conductive fluid 106, 108 flows across surface 2212 into feature 2203, and away from feature 2203 across surface 2212 and/or through feature 2213. In another example of fluid flow in this embodiment, primary dielectric thermally conductive fluid 106, 108 flows through feature 2209 and/or across surface 2212 into feature 2206, and away from feature 2206 across surface 2212 and/or through feature 2204. In another example of fluid flow in this embodiment, primary dielectric thermally conductive fluid 106, 108 flows across bottom 2201 and/or surface 2212 into feature 2207 and away from feature 2207 across bottom 2201 and/or surface 2212. In another example of fluid flow in this embodiment, primary dielectric thermally conductive fluid 106, 108 flows across surface 2212 into feature 2210, 2211 and away from feature 2210, 2211 across surface 2212. In another example of fluid flow in this embodiment, primary dielectric thermally conductive fluid 106, 108 flows through feature 2209 and/or across surface 2212 into feature 2208, and away from feature 2208 across surface 2212 and/or through feature 2209.

In this embodiment, primary dielectric thermally conductive fluid 106, 108 that flows through feature 2213, 2204 flows into feature 2205, through feature 2205 toward either side 2214 of spacer 1701, and then away from feature 2205 on either side 2214 of spacer 1701.

Figure 23A:
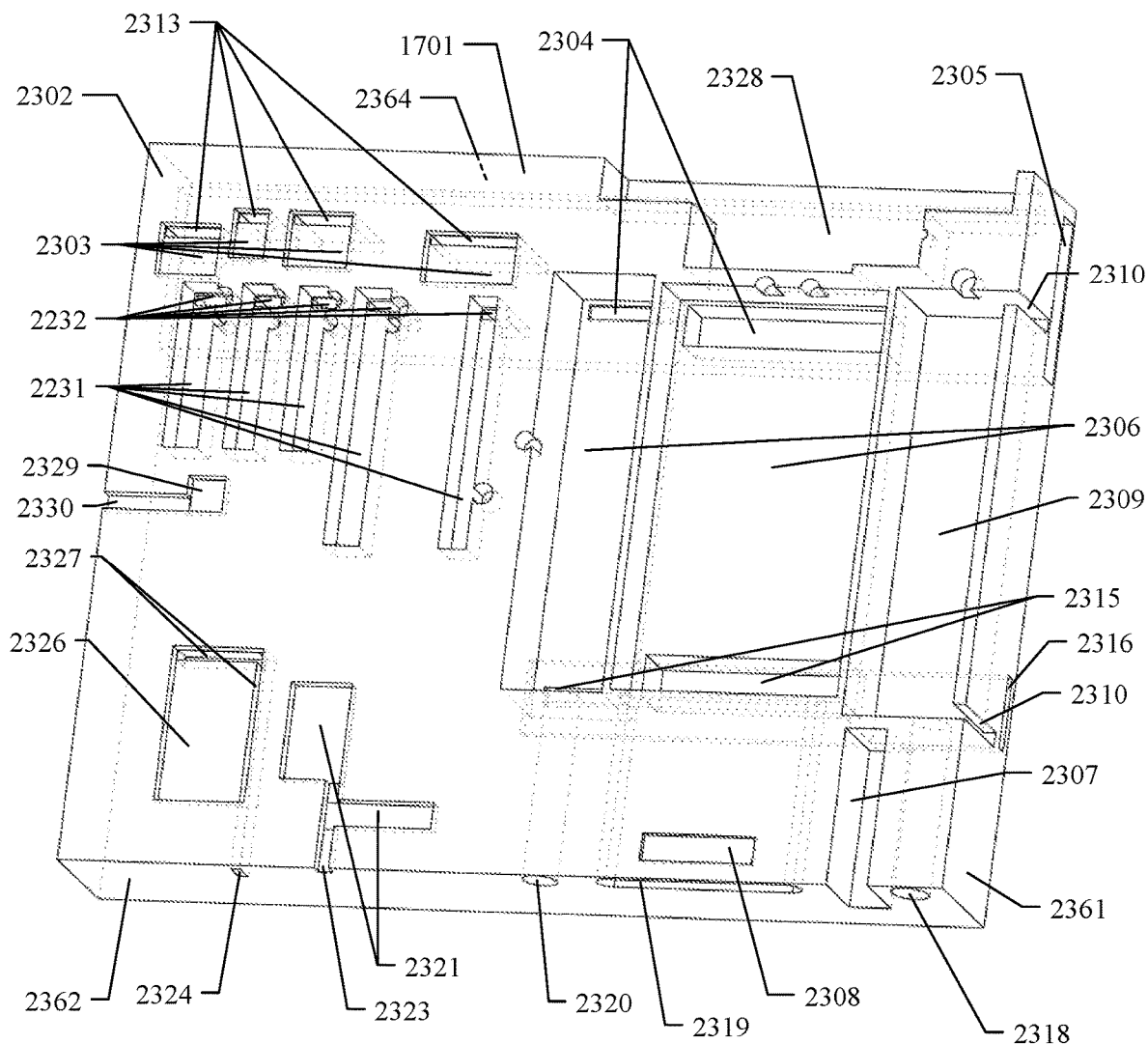
FIG. 23A shows a view of an embodiment of a structure for the volumetric displacement of primary dielectric thermally conductive fluid within an enclosure according to an embodiment of the disclosed subject matter.

FIG. 23A shows an embodiment of a spacer 1701 as disclosed in FIG. 17A, 17B for the volumetric displacement of primary dielectric thermally conductive fluid within an enclosure. The embodiment of spacer 1701 illustrated in FIG. 23A is oriented such that surface 2301 represents the top of spacer 1701 and surface 2302 represents the bottom of spacer 1701. Spacer 1701 may be in any orientation with respect to enclosure wall 1501. The operational orientation of enclosure wall 1501, electronic devices 104, spacers 1701, and any other object or feature within enclosure wall 1501 will vary with respect to gravity based on orientation, location, and movement. The surface 2302 of spacer 1701 is oriented towards one or more electronic devices 104 which are omitted from FIG. 23A for clarity.

Spacer 1701 as embodied in FIG. 23A is comprised of multiple features with descriptions that include, but are not limited to, surfaces, channels, planes, walls, cutouts, holes, tubes, cavities, slots, pins, protrusions, and cutouts as exemplified by 2303, 2304, 2305, 2306, 2307, 2308, 2309, 2310, 2313, 2315, 2316, 2318, 2319, 2320, 2321, 2323, 2324, 2326, 2327, 2328, 2329, 2330, 2331, 2332. Features exemplified by 2303, 2304, 2305, 2306, 2307, 2308, 2309, 2310, 2313, 2315, 2316, 2318, 2319, 2320, 2321, 2323, 2324, 2326, 2327, 2328, 2329, 2330, 2331, 2332 allow one or more spacers 1701 to a) be configured to occupy a portion of Electronic Device Space, b) occupy or enclose volumes outside of Electronic Device Space, c) form a mounting structure for one or more electronic devices 104, d) form a mounting structure for one or more other spacers 1701, and/or e) form channels 1511, 1512 as disclosed in FIG. 15 and/or channels 1611, 1612 as disclosed in FIG. 16. Any particular spacer 1701 and any features associated with that spacer 1701 may occupy or enclose volumes both inside and outside of Electronic Device Space. Spacer 1701 may not serve to direct all of the primary dielectric thermally conductive fluid 106, 108 that is heated by any associated electronic device 104. The portion of primary dielectric thermally conductive fluid 106, 108 that is directed by spacer 1701 will vary based design and operational factors that include, but are not limited to, a) the proximity of electronic device 104 to spacer 1701, b) the existence and type of physical connection of electronic device 104 to spacer 1701, c) the amount and rate of heat to be moved by primary dielectric thermally conductive fluid 106, 108, d) the orientation and movement of the enclosure with respect to gravity, e) operational status of adjacent spacers 1701 and electronic devices 104, f) the configuration of spacers 1701 in the same group, g) components, wiring, and connectors required by electronic devices 104, and h) the amount and type of primary dielectric thermally conductive fluid 106, 108 within the enclosure.

In one example of fluid flow in this embodiment, primary dielectric thermally conductive fluid 106, 108 flows through feature 2308, 2319, 2320 and/or across surface 2302 into feature 2306, and away from feature 2306 a) across surface 2302, b) through feature 2304 into 2305 and toward side 2361, 2363 to exit 2305 or flow into optional channel 2353, and/or c) through feature 2315 into 2316 and toward side 2361 to exit 2316 or flow into optional channel 2352. In another example of fluid flow in this embodiment, primary dielectric thermally conductive fluid 106, 108 flows across surface 2302 into feature 2303, and away from feature 2303 a) across surface 2302, and/or b) through feature 2313 into 2305 and toward side 2361, 2363 to exit 2305 or flow into optional channel 2353. In another example of fluid flow in this embodiment, primary dielectric thermally conductive fluid 106, 108 flows across surface 2302 into feature 2331, and away from feature 2331 a) across surface 2302, and/or b) through feature 2332 into 2305 and toward side 2361, 2363 to exit 2305 or flow into optional channel 2353. In another example of fluid flow in this embodiment, primary dielectric thermally conductive fluid 106, 108 flows into feature 2307 and/or across surface 2302, 2362 into feature 2307, and away from feature 2307 a) across surface 2302 and/or b) by moving towards side 2362 to exit side 2362. In another example of fluid flow in this embodiment, primary dielectric thermally conductive fluid 106, 108 flows into feature 2328, through optional channel 2353 into feature 2328, and/or across surface 2302, 2364 into feature 2328, and away from feature 2328 a) across surface 2302 and/or b) by moving towards side 2364 to exit side 2364 or flowing into optional channel 2353. In another example of fluid flow in this embodiment, primary dielectric thermally conductive fluid 106, 108 flows across surface 2302 into feature 2326, and away from feature 2326 a) across surface 2302, and/or b) through feature 2327 into 2324 and toward side 2362 to exit 2324 or flow into optional channel 2351. In another example of fluid flow in this embodiment, primary dielectric thermally conductive fluid 106, 108 flows through feature 2318, 2310 and/or across surface 2302 into feature 2309, and away from feature 2309 a) across surface 2302, and/or b) through feature 2310 toward side 2361 to exit 2310 or flow into optional channel 2352, 2353. In another example of fluid flow in this embodiment, primary dielectric thermally conductive fluid 106, 108 flows across surface 2302 into feature 2321, and away from feature 2321 a) across surface 2302, and/or b) into 2323 and toward side 2362 to exit 2323 or flow into optional channel 2351. In another example of fluid flow in this embodiment, primary dielectric thermally conductive fluid 106, 108 flows across surface 2302 into feature 2329, and away from feature 2329 a) across surface 2302, and/or b) into 2330 and toward side 2363 to exit 2330. In another example of fluid flow in this embodiment, primary dielectric thermally conductive fluid 106, 108 flows across surface 2302 and the surface of adjacent electronic device 104 where the primary dielectric thermally conductive fluid 106, 108 is heated and rises to contact surface 2302 and is directed to side 2361, 2362, 2363, 2364 by surface 2302.

In this embodiment, some of the flows of primary dielectric thermally conductive fluid 106, 108 describe a flow in which the primary dielectric thermally conductive fluid 106, 108 moves upward without direction by spacer 1701 to first contact 2302, 2307, 2309, 2321, 2328, or 2329 where the primary dielectric thermally conductive fluid 106, 108 is first directed towards side 2361, 2362, 2363, 2364 to either exit spacer 1701 or flow into optional channel 2351, 2352, 2353.

Figure 23B:
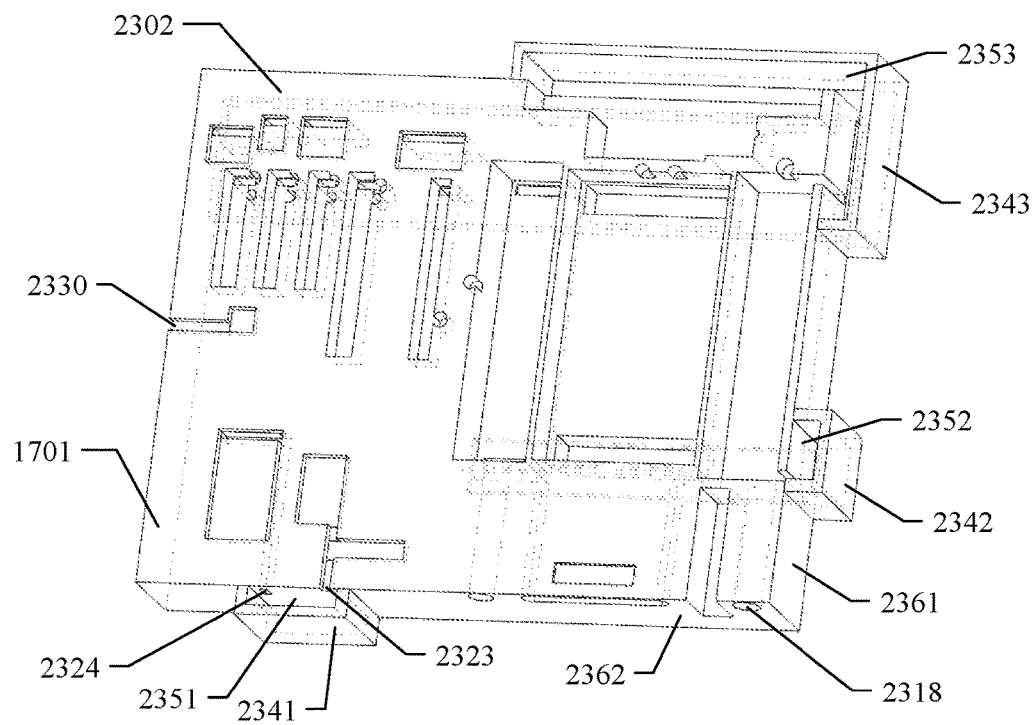
FIG. 23B shows a view of an embodiment of a structure for the volumetric displacement of primary dielectric thermally conductive fluid within an enclosure according to an embodiment of the disclosed subject matter.

FIG. 23B shows an additional embodiment of a spacer 1701 as disclosed in FIG. 23A for the volumetric displacement of primary dielectric thermally conductive fluid within an enclosure that comprises additional features 2341, 2342, 2343 located outside of Electronic Device Space that form channels 2351, 2352, 2353 to direct an upward flow of primary dielectric thermally conductive fluid 106, 108 that exits sides 2361, 2362, 2363 (see FIG. 23C), 2364 (see FIG. 23A). Multiple spacers 1701 may be positioned adjacently to align features 2341, 2342, 2343 to effectively provide a continuous channel 2351, 2352, 2353 to direct an upward flow of primary dielectric thermally conductive fluid 106, 108 toward the top of the enclosure.

Figure 23C:
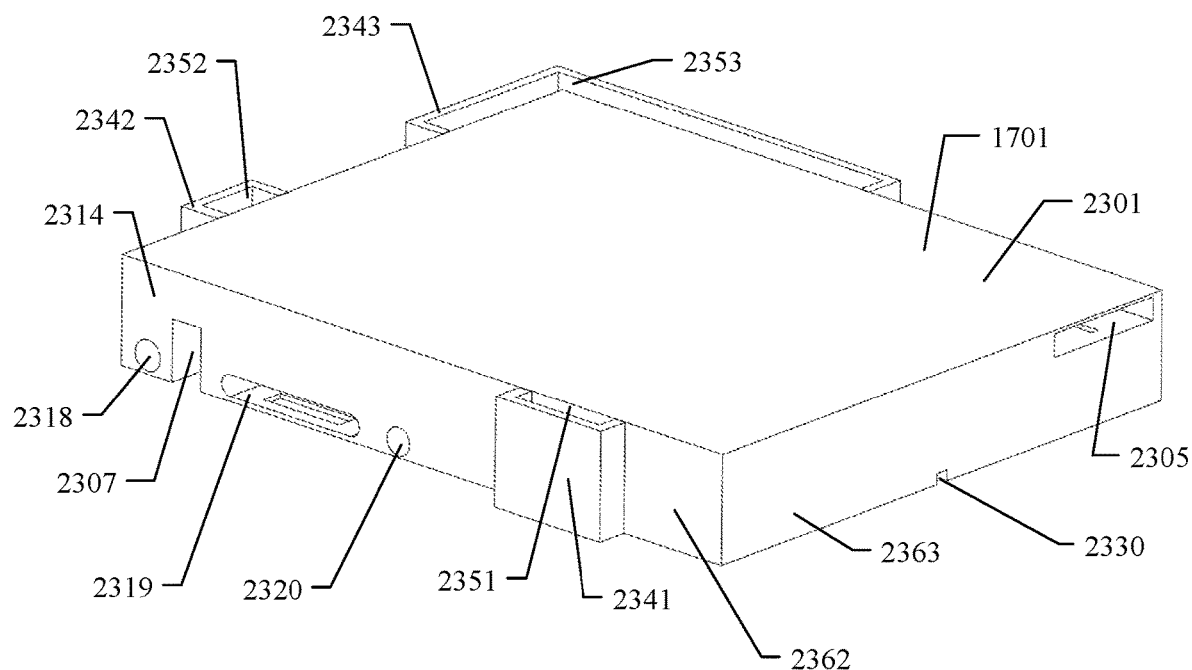
FIG. 23C shows a view of an embodiment of a structure for the volumetric displacement of primary dielectric thermally conductive fluid within an enclosure according to an embodiment of the disclosed subject matter.

FIG. 23C shows an additional embodiment of a spacer 1701 as disclosed in FIG. 23A for the volumetric displacement of primary dielectric thermally conductive fluid within an enclosure that comprises additional features 2341, 2342, 2343 located outside of Electronic Device Space that form channels 2351, 2352, 2353 to direct an upward flow of primary dielectric thermally conductive fluid 106, 108 that exits sides 2361 (see FIG. 23A), 2362, 2363, 2364 (see FIG. 23A). Multiple spacers 1701 may be positioned adjacently to align features 2341, 2342, 2343 to effectively provide a continuous channel 2351, 2352, 2353 to direct an upward flow of primary dielectric thermally conductive fluid 106, 108 toward the top of the enclosure.

Although example diagrams to implement the elements of the disclosed subject matter have been provided, one skilled in the art, using this disclosure, could develop additional embodiments to practice the disclosed subject matter and each is intended to be included herein.

In addition to the above described embodiments, those skilled in the art will appreciate that this disclosure has application in a variety of arts and situations and this disclosure is intended to include the same.

What is claimed is:

1. A system for facilitating transfer of thermal energy from a volume of a containment vessel, said system comprising:
    said containment vessel enclosing said volume;
    a primary dielectric thermally conductive fluid at least partially filling said volume of said containment vessel;
    at least one heat-generating electronic device immersed in the primary dielectric thermally conductive fluid disposed within said volume of said containment vessel, component, said at least one heat-generating electronic device comprising a circuit board and components that project an uneven profile with respect to a plane of the circuit board;
    at least one solid or sealed hollow structure disposed in said volume of said containment vessel for a volumetric displacement of said primary dielectric thermally conductive fluid disposed within said containment vessel, said at least one solid or sealed hollow structure positioned adjacent to said at least one heat-generating electronic device, said at least one solid or sealed hollow structure is arranged to form at least one channel for directing a flow of a portion of said primary dielectric thermally conductive fluid towards at least one side of said at least one solid or sealed hollow structure, and a portion of said at least one solid or sealed hollow structure is configured to have a dimensionality that forms a reflected image of at least a portion of the uneven profile of said at least one heat-generating electronic device,
    wherein said at least one channel of said at least one solid or sealed hollow structure comprises:
        at least one feature configured to receive an upward flow of said portion of said primary dielectric thermally conductive fluid and to direct a flow of said portion of said primary dielectric thermally conductive fluid to exit said at least one feature at said at least one side of said at least one solid or sealed hollow structure, thereby preventing said portion of said primary dielectric thermally conductive fluid from rising directly above said at least one heat-generating electronic device, said at least one feature comprising:
            at least one first end in fluid communication with said upward flow of said portion of said primary dielectric thermally conductive fluid;
            an opposing at least one second end at said at least one side of said at least one solid or sealed hollow structure; and
            an upper surface preventing said portion of primary dielectric thermally conductive fluid from said rising directly above said at least one heat-generating electronic device.

2. The system of claim 1, wherein said primary dielectric thermally conductive fluid is a multi-phased fluid.

3. The system of claim 1, wherein the at least a portion or another portion of said at least one channel is oriented in at least one of a vertical or an inclined upwards direction.

4. The system of claim 1, wherein the at least one feature is configured to direct the received flow in a substantially sideways direction.

5. The system of claim 1, further comprising an electronic device space defined by a maximum height, a maximum width, and a maximum length dimensions of the at least one heat-generating electronic device excluding the space occupied by the at least one heat-generating electronic device, wherein said at least one solid or sealed hollow structure extends outside of the electronic device space.

6. The system of claim 5, further comprising at least one additional channel positioned outside of said electrical device space that is configured to direct the upward flow of said portion of said primary dielectric thermally conductive fluid in a substantially upward direction.

7. The system of claim 1, wherein one or more portions of said at least one solid or sealed hollow structure including the portion of the reflected image are in direct thermal contact with the at least the portion of the uneven portion of the at least one heat-generating electronic device.

8. The system of claim 1, wherein the at least one solid or sealed hollow structure forms a mounting structure for the at least one heat-generating electronic device.

9. The system of claim 1, wherein the at least one solid or sealed hollow structure comprises a plurality of at least one solid or sealed hollow structures, the plurality of the at least one solid or sealed hollow structures are connected to form a structural unit of any dimensionality.

10. The system of claim 1, wherein the at least one solid or sealed hollow structure is configured as a heat exchange mechanism.

11. The system of claim 1, wherein the at least one solid or sealed hollow structure is oriented in one of a substantially vertical orientation and a substantially horizontal orientation.

12. The system of claim 1, wherein said volume is sealed.

13. A method for facilitating transfer of thermal energy from a volume of a containment vessel, said method comprising:
    providing the containment vessel enclosing said volume;
    filling at least partially said volume of said containment vessel with a primary dielectric thermally conductive fluid;

disposing at least one heat-generating electronic device immersed in the primary dielectric thermally conductive fluid within said volume of said containment vessel, said at least one heat-generating electronic device comprising a circuit board and components that project an uneven portion with respect to a plane of the circuit board;

disposing at least one solid or sealed hollow structure in said volume of said containment vessel for a volumetric displacement of said primary dielectric thermally conductive fluid disposed within said containment vessel, said at least one solid or sealed hollow structure positioned adjacent to said at least one heat-generating electronic device, said at least one solid or sealed hollow structure is arranged to form at least one channel for directing a flow of a portion of said primary dielectric thermally conductive fluid towards at least one side of said at least one solid or sealed hollow structure, and a portion of said at least one solid or sealed hollow structure is configured to have a dimensionality that forms a reflected image of at least a portion of the uneven profile of said at least one heat-generating electronic device, wherein said at least one channel of said at least one solid or sealed hollow structure comprises:

at least one feature configured to receive an upward flow of said portion of said primary dielectric thermally conductive fluid and to direct a flow of said portion of said primary dielectric thermally conductive fluid to exit said at least one feature at said at least one side of said at least one solid or sealed hollow structure, thereby preventing said portion of said primary dielectric thermally conductive fluid from rising directly above said at least one heat-generating electronic device, said at least one feature comprising:

at least one first end in fluid communication with said upward flow of said portion of said primary dielectric thermally conductive fluid;

an opposing at least one second end at said at least one side of said at least one solid or sealed hollow structure; and an upper surface preventing said portion of primary dielectric thermally conductive fluid from said rising directly above said at least one heat-generating electronic device.

14. The method of claim 13, wherein said primary dielectric thermally conductive fluid is a multi-phased fluid.

15. The method of claim 13, wherein the at least a portion or another portion of said at least one channel is oriented in at least one of a vertical or an inclined upwards direction.

16. The method of claim 13, wherein the at least one feature configured to direct the received flow in a substantially sideways direction.

17. The method of claim 13, further comprising providing an electronic device space defined by a maximum height, a maximum width, and a maximum length dimensions of the at least one heat-generating electronic device excluding the space occupied by the at least one heat-generating electronic device, wherein said at least one solid or sealed hollow structure extends outside of the electronic device space.

18. The method of claim 17, further comprising at least one additional channel positioned outside of said electrical device space that is configured to direct the upward flow of said portion of said primary dielectric thermally conductive fluid in a substantially upward direction.

19. The method of claim 13, wherein one or more portions of said at least one solid or sealed hollow structure including the portion of the reflected image are in direct thermal contact with the at least the portion of the uneven portion of the at least one heat-generating electronic device.

20. The method of claim 13, wherein the at least one solid or sealed hollow structure forms a mounting structure for the at least one heat-generating electronic device.

21. The method of claim 13, wherein the at least one solid or sealed hollow structure comprises a plurality of at least one solid or sealed hollow structures, the plurality of the at least one solid or sealed hollow structures are connected to form a structural unit of any dimensionality.

22. The method of claim 13, wherein the at least one solid or sealed hollow structure is configured as a heat exchange mechanism.

23. The method of claim 13, wherein the at least one solid or sealed hollow structure is oriented in one of a substantially vertical orientation and a substantially horizontal orientation.

24. The method of claim 13, wherein said volume is sealed.

* * * * *

UNITED STATES PATENT AND TRADEMARK OFFICE
CERTIFICATE OF CORRECTION

PATENT NO. : 11,191,186 B2
APPLICATION NO. : 16/551346
DATED : November 30, 2021
INVENTOR(S) : David Lane Smith Page 1 of 1

It is certified that error appears in the above-identified patent and that said Letters Patent is hereby corrected as shown below:

On the Title Page

The following text:
(63) Continuation-in-part of application No. 16/056,242, filed on Aug. 6, 2018, now Pat. No. 10,398,063, which is a continuation-in-part of application No. 15/640,520, filed on Jul. 1, 2017, now Pat. No. 10,045,467, which is a continuation-in-part of application No. 15/400,946, filed on Jan. 6, 2017, now Pat. No. 9,699,939, and a continuation-in-part of application No. 15/225,787, filed on Aug. 1, 2016, now Pat. No. 9,560,789, and a continuation-in-part of application No. 14/986,786, filed on Jan. 4, 2016, now Pat. No. 9,408,332, which is a continuation-in-part of application No. 14/749,615, filed on Jun. 24, 2015, now Pat. No. 9,258,926.

Is to be replaced with:
(63) Continuation-in-part of application No. 16/056,242, filed on Aug. 6, 2018, now Pat. No. 10,398,063, which is a continuation-in-part of application No. 15/640,520, filed on Jul. 1, 2017, now Pat. No. 10,045,467, which is a continuation-in-part of application No. 15/400,946, filed on Jan. 6, 2017, now Pat. No. 9,699,939, which is a continuation-in-part of application No. 15/225,787, filed on Aug. 1, 2016, now Pat. No. 9,560,789, which is a continuation-in-part of application No. 14/986,786, filed on Jan. 4, 2016, now Pat. No. 9,408,332, which is a continuation-in-part of application No. 14/749,615, filed on Jun. 24, 2015, now Pat. No. 9,258,926.

Signed and Sealed this
Twenty-ninth Day of March, 2022

Drew Hirshfeld
*Performing the Functions and Duties of the
Under Secretary of Commerce for Intellectual Property and
Director of the United States Patent and Trademark Office*